(12) United States Patent
Murakami et al.

(10) Patent No.: US 9,715,940 B2
(45) Date of Patent: Jul. 25, 2017

(54) SHIFT REGISTER

(71) Applicant: Sharp Kabushiki Kaisha, Osaka-shi, Osaka (JP)

(72) Inventors: Yuhichiroh Murakami, Osaka (JP); Yasushi Sasaki, Osaka (JP); Shige Furuta, Osaka (JP); Shuji Nishi, Osaka (JP); Makoto Yokoyama, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 93 days.

(21) Appl. No.: 14/775,890

(22) PCT Filed: Feb. 17, 2014

(86) PCT No.: PCT/JP2014/053620
§ 371 (c)(1),
(2) Date: Sep. 14, 2015

(87) PCT Pub. No.: WO2014/148170
PCT Pub. Date: Sep. 25, 2014

(65) Prior Publication Data
US 2016/0027527 A1 Jan. 28, 2016

(30) Foreign Application Priority Data
Mar. 21, 2013 (JP) .................... 2013-059180

(51) Int. Cl.
*G11C 19/00* (2006.01)
*G11C 19/28* (2006.01)
*G09G 3/36* (2006.01)

(52) U.S. Cl.
CPC .......... *G11C 19/28* (2013.01); *G09G 3/3648* (2013.01); *G09G 3/3677* (2013.01); *G09G 2310/0286* (2013.01); *G09G 2310/06* (2013.01)

(58) Field of Classification Search
None
See application file for complete search history.

(56) References Cited

U.S. PATENT DOCUMENTS

2003/0020520 A1 * 1/2003 Miyake .................... G09G 3/20
327/112
2004/0140839 A1 * 7/2004 Nagao .................... G11C 19/28
327/291

(Continued)

FOREIGN PATENT DOCUMENTS

CN 101785065 A 7/2010
CN 102428521 A 4/2012

(Continued)

OTHER PUBLICATIONS

Official Communication issued in International Patent Application No. PCT/JP2014/053620, mailed on Apr. 28, 2014.

*Primary Examiner* — Tuan T Lam
(74) *Attorney, Agent, or Firm* — Keating & Bennett, LLP

(57) ABSTRACT

A shift register is configured by connecting unit circuits 1 in multiple stages. An output transistor Tr1 switches between whether or not to output a clock signal CKA in accordance with a gate potential. A set transistor Tr2 switches between whether or not to provide an output of an on-potential output unit 2 to a gate terminal of Tr1 in accordance with an output of a set control unit 3. The set control unit 3 controls a gate terminal of Tr2 into a floating state in part of a period during which a high-level potential is provided to the gate terminal of Tr1. The gate potential of Tr2 is raised by being pushed up, whereby a high-level potential without a threshold drop is provided to the gate terminal of Tr1, and rounding of an output signal OUT is decreased when the output signal OUT shifts to a high level. Accordingly, an operation margin with respect to fluctuation of a threshold voltage of the transistor is increased.

8 Claims, 57 Drawing Sheets

(56) References Cited

U.S. PATENT DOCUMENTS

| | | |
|---|---|---|
| 2007/0248205 A1 | 10/2007 | Deane |
| 2008/0226013 A1 | 9/2008 | Deane |
| 2009/0251443 A1 | 10/2009 | Jinta |
| 2010/0054392 A1 | 3/2010 | Chen et al. |
| 2010/0060561 A1 | 3/2010 | Deane |
| 2010/0141641 A1 | 6/2010 | Furuta et al. |
| 2010/0141642 A1 | 6/2010 | Furuta et al. |
| 2010/0244946 A1* | 9/2010 | Murakami ............ G09G 3/3677 327/564 |
| 2011/0075790 A1 | 3/2011 | Hu |
| 2011/0142192 A1 | 6/2011 | Lin et al. |
| 2012/0032615 A1 | 2/2012 | Kikuchi et al. |
| 2013/0147524 A1* | 6/2013 | Hachida ............... G09G 3/3677 327/108 |
| 2013/0156148 A1* | 6/2013 | Sasaki .................. G11C 19/184 377/64 |
| 2013/0169319 A1* | 7/2013 | Sasaki .................. G09G 3/3677 327/108 |
| 2013/0194033 A1* | 8/2013 | Murakami .......... H04L 25/0272 327/543 |
| 2013/0223584 A1* | 8/2013 | Umezaki ................ G11C 19/28 377/64 |
| 2014/0118052 A1* | 5/2014 | Liu ........................ G11C 19/28 327/394 |
| 2014/0168181 A1* | 6/2014 | Furuta .................... G11C 19/28 345/205 |

FOREIGN PATENT DOCUMENTS

| | | |
|---|---|---|
| JP | 2008-508654 A | 3/2008 |
| JP | 2008-537275 A | 9/2008 |
| JP | 2008-537626 A | 9/2008 |
| JP | 2009-252269 A | 10/2009 |
| JP | 2011-070761 A | 4/2011 |
| WO | 2009/034750 A1 | 3/2009 |

\* cited by examiner

SHIFT REGISTER

TECHNICAL FIELD

The present invention relates to a shift register, and particularly relates to a shift register preferably used for a drive circuit of a display device and the like.

BACKGROUND ART

An active matrix-type display device selects two-dimensionally arranged pixel circuits in a unit of row, and writes voltages in accordance with display data into the selected pixel circuits, to display an image. For selecting the pixel circuits in a unit of row, there is used a shift register for sequentially shifting an output signal based on a clock signal, as a scanning line drive circuit. Further, in a display device for performing a dot sequential drive, a similar shift register is provided inside a data line drive circuit.

In a liquid crystal display device and the like, a drive circuit of pixel circuits may be integrally formed with the pixel circuits by using a manufacturing process for forming TFTs (Thin Film Transistors) in the pixel circuits. In this case, it is preferable to form a drive circuit including a shift register with transistors of the same conductive type as the TFTs.

As for the shift register, a variety of circuits have hitherto been proposed. FIG. 61 is a block diagram showing a configuration of a shift register described in Patent Document 1. The shift register shown in FIG. 61 is configured by connecting unit circuits 91 shown in FIG. 62 in multiple stages, and is operated in accordance with a timing chart shown in FIG. 63. In this shift register, a bootstrap method is adopted. Hereinafter, a threshold voltage of the transistor is referred to as Vth, and a high-level potential is referred to as VDD.

As an input signal IN, the unit circuit 91 is provided with an output signal OUT of the unit circuit 91 in the previous stage (or a start pulse ST). When the input signal IN shifts to a high level, a transistor Q2 is turned on, and a potential of a node N1 rises to (VDD−Vth). Next, when a clock signal CK changes from a low level to the high level, the potential of the node N1 rises to (VDD−Vth+α) by being pushed up by a capacitance between a gate and a channel of a transistor Q1 and a capacitor C1 (wherein α is substantially equal to the amplitude of the clock signal CK). Since "VDD−Vth+α>VDD+Vth" normally holds, when the clock signal CK passes through the transistor Q1, the high-level potential of the clock signal CK does not drop in an amount corresponding to a threshold voltage of the transistor Q1. Hence it is possible to output as the output signal OUT the high-level potential VDD without a threshold drop. Further, in the high-level period of the output signal OUT, a voltage between the gate and a source of the transistor Q1 becomes: (VDD−Vth+α)−VDD=α−Vth. By providing a potential sufficiently higher than the high-level potential of the clock signal CK to the gate terminal of the transistor Q1, it is possible to reduce rounding of the output signal OUT.

PRIOR ART DOCUMENT

Patent Document

[Patent Document 1] WO 2009/34750

SUMMARY OF THE INVENTION

Problems to be Solved by the Invention

However, in the above conventional shift register, the following problem occurs when the threshold voltage of the transistor is high. The threshold voltage of the transistor may be originally high due to variations in manufacturing, or may become high due to a temperature change or degradation of the transistor. When the threshold voltage Vth is high, an on-current of the transistor Q2 decreases, and hence the potential of the node N1 may not reach (VDD−Vth) within a high-level period of the input signal IN. For example, when the potential of the node N1 is (VDD−Vth−β) (where β>0) at the time point of change in the input signal IN to the low level, a voltage between the gate and the source of the transistor Q1 becomes: (VDD−Vth−β+α)−VDD=α−Vth−β in a high-level period of the output signal OUT. The closer the gate potential of the transistor Q1 is to the high-level potential of the clock signal CK, the larger the rounding of the output signal OUT is. Further, when the degradation of the transistor progresses and β further increases, "VDD−Vth−β+α<VDD+Vth" may hold. In this case, since the potential of the output signal OUT becomes lower than VDD, the shift register may operate erroneously.

Accordingly, an object of the present invention is to provide a shift register which has a large operation margin with respect to fluctuation of a threshold voltage of a transistor.

Means for Solving the Problems

According to a first aspect of the present invention, there is provided a shift register including a plurality of unit circuits connected in multiple stages, wherein the unit circuit includes: an output transistor having a first conduction terminal connected to a clock terminal for inputting a clock signal, and a second conduction terminal connected to an output terminal for outputting the clock signal; an on-potential output unit that outputs an on-potential to be provided to a control terminal of the output transistor; a set transistor having a first conduction terminal provided with an output of the on-potential output unit, and a second conduction terminal connected to the control terminal of the output transistor; and a set control unit that applies the on-potential and an off-potential in a switching manner to a control terminal of the set transistor, and the set control unit controls the control terminal of the set transistor into a floating state in part of a period during which the on-potential is provided to the control terminal of the output transistor.

According to a second aspect of the present invention, there is provided a shift register including a plurality of unit circuits connected in multiple stages, wherein the unit circuit includes: an output transistor having a first conduction terminal connected to a clock terminal for inputting a clock signal, and a second conduction terminal connected to an output terminal for outputting the clock signal; a breakdown voltage transistor having a first conduction terminal connected to a first node, a second conduction terminal connected to a control terminal of the output transistor, and a control terminal fixedly applied with an on-potential; an on-potential output unit that outputs an on-potential to be provided to the first node; a set transistor having a first conduction terminal provided with an output of the on-potential output unit, and a second conduction terminal connected to the first node; and a set control unit that applies the on-potential and an off-potential in a switching manner to a control terminal of the set transistor, and the set control unit controls the control terminal of the set transistor into a floating state in part of a period during which the on-potential is provided to the first node.

According to a third aspect of the present invention, in the first or second aspect of the present invention, the on-potential output unit outputs an input signal with respect to the unit circuit, and the set control unit includes a transistor having a first conduction terminal provided with a second clock signal, a second conduction terminal connected to the control terminal of the set transistor, and a control terminal fixedly applied with the on-potential.

According to a fourth aspect of the present invention, in the first or second aspect of the present invention, the on-potential output unit outputs an input signal with respect to the unit circuit, and the set control unit includes a transistor having a first conduction terminal provided with the input signal, a second conduction terminal connected to the control terminal of the set transistor, and a control terminal fixedly applied with the on-potential.

According to a fifth aspect of the present invention, in the first or second aspect of the present invention, the on-potential output unit fixedly outputs the on-potential, the set control unit includes a transistor having a first conduction terminal provided with an input signal with respect to the unit circuit, a second conduction terminal connected to the control terminal of the set transistor, and a control terminal fixedly applied with the on-potential.

According to a sixth aspect of the present invention, in the first or second aspect of the present invention, the on-potential output unit outputs a first input signal with respect to the unit circuit, and the set control unit includes a transistor having a first conduction terminal and a control terminal which are provided with a second input signal with respect to the unit circuit, and a second conduction terminal connected to the control terminal of the set transistor.

According to a seventh aspect of the present invention, in the first or second aspect of the present invention, the on-potential output unit outputs a first input signal with respect to the unit circuit, and the set control unit includes a transistor having a first conduction terminal provided with a second clock signal, a second conduction terminal connected to the control terminal of the set transistor, and a control terminal provided with a second input signal with respect to the unit circuit.

According to an eighth aspect of the present invention, in the first or second aspect of the present invention, the on-potential output unit outputs a first input signal with respect to the unit circuit, and the set control unit includes a transistor having a first conduction terminal provided with a second input signal with respect to the unit circuit, a second conduction terminal connected to the control terminal of the set transistor, and a control terminal provided with a second clock signal.

According to a ninth aspect of the present invention, in the first or second aspect of the present invention, the on-potential output unit outputs a first input signal with respect to the unit circuit, and the set control unit includes a transistor having a first conduction terminal provided with a second input signal with respect to the unit circuit, a second conduction terminal connected to the control terminal of the set transistor, and a control terminal fixedly applied with the on-potential.

According to a tenth aspect of the present invention, in the first or second aspect of the present invention, the on-potential output unit outputs an input signal with respect to the unit circuit, and the set control unit includes a transistor having a first conduction terminal and a control terminal which are provided with a second clock signal, and a second conduction terminal connected to the control terminal of the set transistor.

According to an eleventh aspect of the present invention, there is provided a display device including: a plurality of scanning lines arranged in parallel to each other; a plurality of data lines arranged in parallel to each other so as to be orthogonal to the scanning lines; a plurality of pixel circuits each arranged corresponding to an intersection of the scanning line and the data line; and the shift register according to the first or second aspect as a scanning line drive circuit for driving the scanning line.

According to a twelfth aspect of the present invention, there is provided a control method for a shift register which includes a plurality of unit circuits connected in multiple stages, the method including: when the unit circuit includes: an output transistor having a first conduction terminal connected to a clock terminal for inputting a clock signal, and a second conduction terminal connected to an output terminal for outputting the clock signal; and a set transistor having a second conduction terminal connected to a control terminal of the output transistor, a step of outputting, to a first conduction terminal of the set transistor, an on-potential to be provided to the control terminal of the output transistor; and a step of applying the on-potential and an off-potential in a switching manner to a control terminal of the set transistor, wherein the step of controlling the potential of the control terminal of the set transistor controls the control terminal of the set transistor into a floating state in part of a period during which the on-potential is provided to the control terminal of the output transistor.

According to a thirteenth aspect of the present invention, there is provided a control method for a shift register which includes a plurality of unit circuits connected in multiple stages, the method including: when the unit circuit includes: an output transistor having a first conduction terminal connected to a clock terminal for inputting a clock signal, and a second conduction terminal connected to an output terminal for outputting the clock signal; a breakdown voltage transistor having a first conduction terminal connected to a first node, a second conduction terminal connected to a control terminal of the output transistor, and a control terminal fixedly applied with an on-potential; and a set transistor having a second conduction terminal connected to the first node, a step of outputting, to a first conduction terminal of the set transistor, the on-potential to be provided to the first node; and a step of applying the on-potential and an off-potential in a switching manner to a control terminal of the set transistor, wherein the step of controlling the potential of the control terminal of the set transistor controls the control terminal of the set transistor into a floating state in part of a period during which the on-potential is provided to the first node.

Effects of the Invention

According to the first or twelfth aspect of the present invention, after the control terminal of the set transistor enters the floating state, the potential of the control terminal of the set transistor becomes a sufficient on-potential (which is a potential higher than a normal on-potential when the on-potential is a high-level potential, and which is a potential lower than a normal on-potential when the on-potential is a low-level potential), whereby the potential of the control terminal of the output transistor becomes an on-potential without a threshold drop. Therefore, at the time of outputting the clock signal having the on-potential, it is possible to change the potential of the control terminal of the output transistor to the sufficient on-potential, so as to reduce rounding of the output signal OUT. Further, even when the threshold voltage of the transistor is originally high or when it becomes high due to a temperature change or degradation of the transistor, it is possible to suppress an influence of waveform rounding, so as to increase an operation margin with respect to fluctuation of the threshold voltage of the transistor.

According to the second or thirteenth aspect of the present invention, after the control terminal of the set transistor enters the floating state, the potential of the control terminal of the set transistor becomes the sufficient on-potential, whereby the potential of the first node becomes the on-potential without a threshold drop. Therefore, at the time of outputting the clock signal having the on-potential, it is possible to change the potential of the control terminal of the output transistor to the sufficient on-potential, so as to exert a similar effect to that of the above first aspect. Further, at the time of outputting the clock signal having the on-potential, the potential of the first node remains unchanged from the on-potential outputted from the on-potential output unit, by the action of the breakdown voltage transistor. Hence it is possible to prevent application of a voltage higher than the driving voltage of the transistor between the terminals of the transistor connected to the first node.

According to the third aspect of the present invention, when potentials of the input signal and the second clock signal change to the on-potential, the control terminal of the set transistor enters the floating state after the potential of the control terminal of the set transistor reaches a predetermined level. Thereafter, when the potential of the control terminal of the output transistor (or the potential of the first node) keeps changing toward the on-potential, the potential of the control terminal of the set transistor becomes the sufficient on-potential, and the potential of the control terminal of the output transistor (or the potential of the first node) becomes the on-potential without a threshold drop. Hence it is possible to exert a similar effect to that of the above first aspect (or second aspect).

According to the fourth or fifth aspect of the present invention, when the potential of the input signal changes to the on-potential, the control terminal of the set transistor enters the floating state after the potential of the control terminal of the set transistor reaches the predetermined level. Thereafter, when the potential of the control terminal of the output transistor (or the potential of the first node) keeps changing toward the on-potential, the potential of the control terminal of the set transistor becomes the sufficient on-potential, and the potential of the control terminal of the output transistor (or the potential of the first node) becomes the on-potential without a threshold drop. Hence it is possible to exert a similar effect to that of the above first aspect (or second aspect).

According to the sixth or ninth aspect of the present invention, when a potential of the second input signal changes to the on-potential, the control terminal of the set transistor enters the floating state after the potential of the control terminal of the set transistor reaches the predetermined level. Thereafter, when a potential of the first input signal changes to the on-potential and the potential of the control terminal of the output transistor (or the potential of the first node) changes to the on-potential, the potential of the control terminal of the set transistor becomes the sufficient on-potential, and the potential of the control terminal of the output transistor (or the potential of the first node) becomes the on-potential without a threshold drop. Hence it is possible to exert a similar effect to that of the above first aspect (or second aspect). Further, after the potential of the control terminal of the set transistor is changed to the on-potential based on the second input signal, the potential of the control terminal of the output transistor (or the potential of the first node) is changed to the on-potential based on the first input signal, and hence it is possible to increase the operation margin.

According to the seventh or eighth aspect of the present invention, when potentials of the second input signal and the second clock signal change to the on-potential, the control terminal of the set transistor enters the floating state after the potential of the control terminal of the set transistor reaches the predetermined level. Thereafter, when the potential of the first input signal changes to the on-potential and the potential of the control terminal of the output transistor (or the potential of the first node) changes to the on-potential, the potential of the control terminal of the set transistor becomes the sufficient on-potential, and the potential of the control terminal of the output transistor (or the potential of the first node) becomes the on-potential without a threshold drop. Hence it is possible to exert a similar effect to that of the above first aspect (or second aspect). Further, after the potential of the control terminal of the set transistor is changed to the on-potential based on the second input signal and the second clock signal, the potential of the control terminal of the output transistor (or the potential of the first node) is changed to the on-potential based on the first input signal, and hence it is possible to increase the operation margin.

According to the tenth aspect of the present invention, when the potential of the second clock signal changes to the on-potential, the control terminal of the set transistor enters the floating state after the potential of the control terminal of the set transistor reaches the predetermined level. Thereafter, when the potential of the input signal changes to the on-potential and the potential of the control terminal of the output transistor (or the potential of the first node) changes to the on-potential, the potential of the control terminal of the set transistor becomes the sufficient on-potential, and the potential of the control terminal of the output transistor (or the potential of the first node) becomes the on-potential without a threshold drop. Hence it is possible to exert a similar effect to that of the above first aspect (or second aspect). Further, after the potential of the control terminal of the set transistor is changed to the on-potential based on the second clock signal, the potential of the control terminal of the output transistor (or the potential of the first node) is changed to the on-potential based on the input signal, and hence it is possible to increase the operation margin.

According to the eleventh aspect of the present invention, by using the shift register according to the above first or second aspect as the scanning line drive circuit, it is possible to reduce rounding of the output signal of the scanning line drive circuit and increase the operation margin with respect to fluctuation of the threshold voltage of the transistor.

MODES FOR CARRYING OUT THE INVENTION

Hereinafter, a shift register according to each of embodiments of the present invention will be described with reference to the drawings. In the following description, when a conduction terminal of a transistor can be either a source terminal or a drain terminal, one conduction terminal is fixedly called a source terminal and the other conduction terminal is fixedly called a drain terminal. Further, a signal that is inputted or outputted via a certain terminal is called by the same name as that of the terminal (e.g., a signal that is inputted via a clock terminal CKA is called a clock signal CKA). Moreover, a potential which turns on the transistor when provided to the gate terminal is referred to as an on-potential, and a potential which turns off the transistor when provided to the gate terminal is referred to as an off-potential. For example, as for an N-channel transistor, a high-level potential is the on-potential and a low-level potential is the off-potential. Further, a threshold voltage of the transistor is referred to as Vth, the high-level potential is referred to as VDD, and the low-level potential is referred to as VSS.

It is to be noted that each transistor shown below may be configured of two or more transistors connected in series. Further, each transistor shown below may be configured of a TFT. In particular, an IGZO-TFT, in which a channel layer is formed by using InGaZnOx (also called "IGZO") being an oxide semiconductor mainly composed of indium (In), gallium (Ga), zinc (Zn), and oxygen (O), may be used as the TFT.

Figure 1:
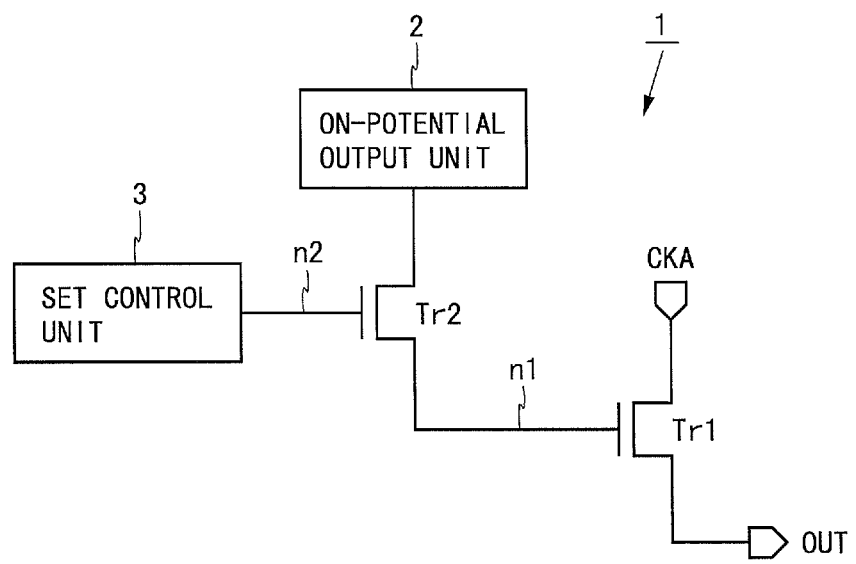
FIG. 1 is a diagram showing a basic configuration of a unit circuit of a shift register according to an embodiment of the present invention.

FIG. 1 is a diagram showing a basic configuration of a unit circuit included in the shift register according to the embodiment of the present invention. A unit circuit 1 shown in FIG. 1 includes transistors Tr1, Tr2, an on-potential output unit 2 and a set control unit 3. A drain terminal of the transistor Tr1 is connected to a clock terminal CKA, and a source terminal of the transistor Tr1 is connected to an output terminal OUT. A drain terminal of the transistor Tr2 is provided with an output of the on-potential output unit 2, a source terminal of the transistor Tr2 is connected to a gate terminal of the transistor Tr1, and a gate terminal of the transistor Tr2 is provided with an output of the set control unit 3. The transistor Tr1 functions as an output transistor and the transistor Tr2 functions as a set transistor. The on-potential output unit 2 outputs an on-potential to be provided to the gate terminal of the transistor Tr1. The set control unit 3 applies the on-potential and an off-potential in a switching manner to the gate terminal of the transistor Tr2. The set control unit 3 controls the gate terminal of the transistor Tr2 into the floating state in part of a period during which the on-potential is provided to the gate terminal of the transistor Tr1.

Hereinafter, a description will be given of a shift register configured by connecting the unit circuits having a basic configuration shown in FIG. 1 in multiple stages. In addition, the transistors Tr1, Tr2 are assumed to be N-channel types in the unit circuit 1. The transistors Tr1, Tr2 may be P-channel types.

First Embodiment

Figure 2:
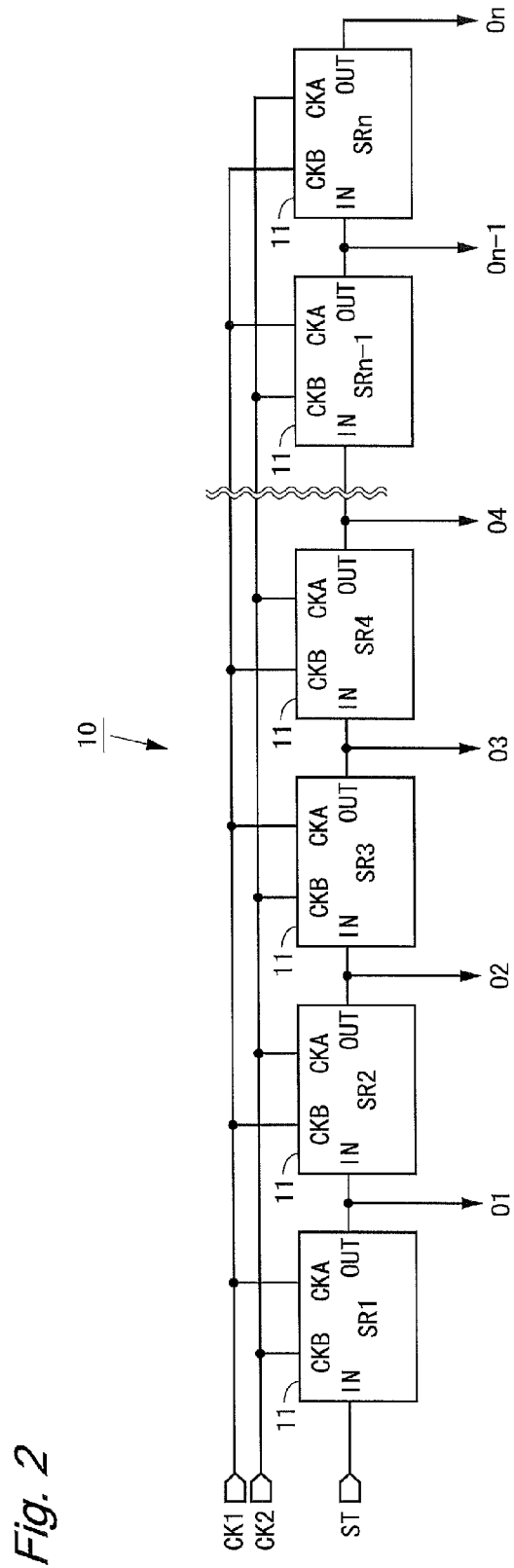
FIG. 2 is a block diagram showing a configuration of a shift register according to a first embodiment.

FIG. 2 is a block diagram showing a configuration of a shift register according to a first embodiment of the present invention. A shift register 10 shown in FIG. 2 is configured by connecting n (n is an integer not smaller than 2) unit circuits 11 in multiple stages. The unit circuit 11 has clock terminals CKA, CKB, an input terminal IN, and an output terminal OUT. From the outside, the shift register 10 is supplied with a start pulse ST and two-phase clock signals CK1, CK2. The start pulse ST is provided to the input terminal IN of the unit circuit 11 in the first stage. The clock signal CK1 is provided to the clock terminal CKA of the unit circuit 11 in the odd-numbered stage, and provided to the clock terminal CKB of the unit circuit 11 in the even-numbered stage. The clock signal CK2 is provided to the clock terminal CKA of the unit circuit 11 in the even-numbered stage, and provided to the clock terminal CKB of the unit circuit 11 in the odd-numbered stage. The output signal OUT of the unit circuit 11 is outputted to the outside as each of output signals O1 to On, and provided to the input terminal IN of the unit circuit 11 in the next stage.

Figure 3:
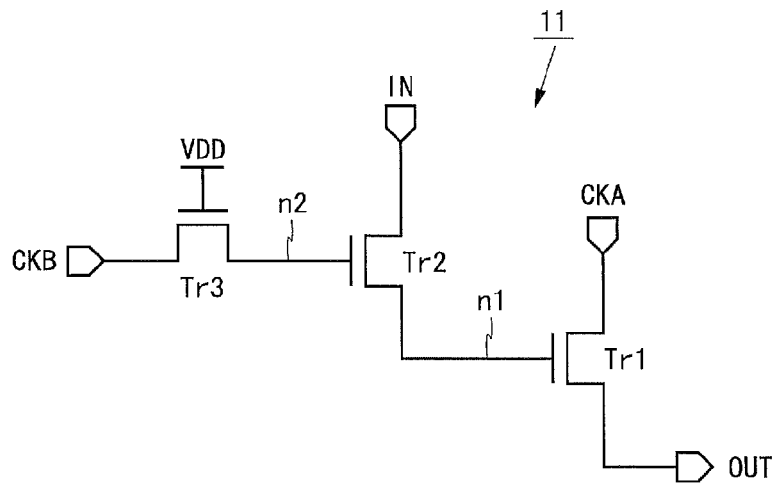
FIG. 3 is a circuit diagram of a unit circuit of the shift register according to the first embodiment.

FIG. 3 is a circuit diagram of the unit circuit 11. The unit circuit 11 shown in FIG. 3 includes three N-channel transistors Tr1 to Tr3. A drain terminal of the transistor Tr1 is connected to the clock terminal CKA, and a source terminal of the transistor Tr1 is connected to the output terminal OUT. A drain terminal of the transistor Tr2 is connected to the input terminal IN, and a source terminal of the transistor Tr2 is connected to a gate terminal of the transistor Tr1. A drain terminal of a transistor Tr3 is connected to the clock terminal CKB, a source terminal of the transistor Tr3 is connected to a gate terminal of the transistor Tr2, and a gate terminal of the transistor Tr3 is applied with the high-level potential VDD. The transistors Tr1 to Tr3 function as an output transistor, a set transistor and a set control unit, respectively, and the input terminal IN functions as an on-potential output unit. Hereinafter, a node to which the gate terminal of the transistor Tr1 is connected will be referred to as n1, and a node to which the gate terminal of the transistor Tr2 is connected will be referred to as n2.

Figure 4:
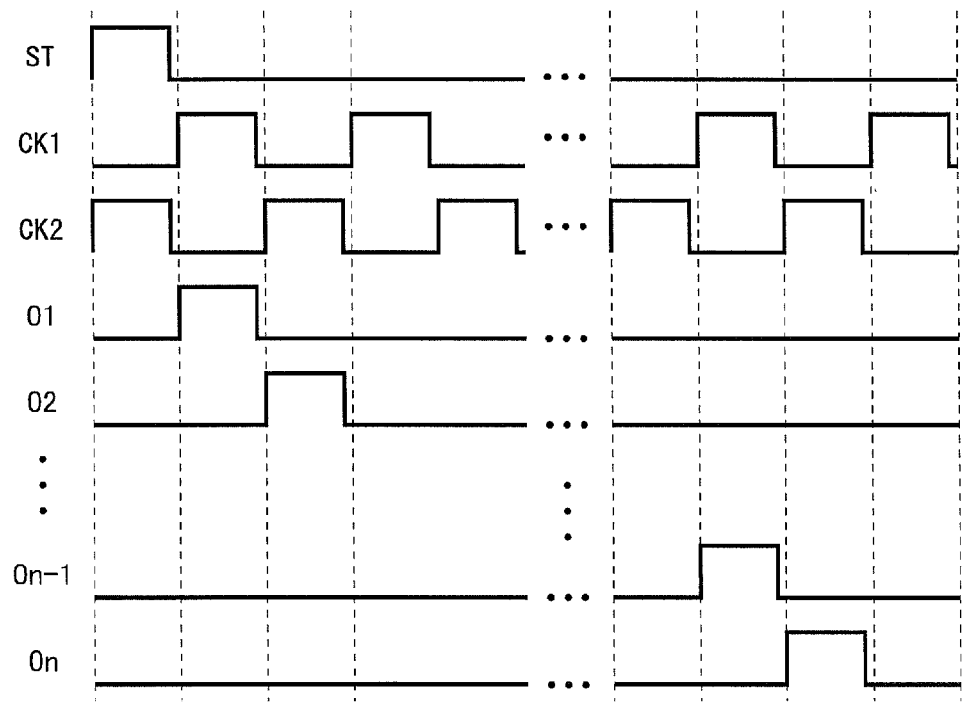
FIG. 4 is a timing chart of the shift register according to the first embodiment.

FIG. 4 is a timing chart of the shift register 10. As shown in FIG. 4, the clock signal CK1 shifts to the high level or the low level in a predetermined cycle. However, the high-level period of the clock signal CK1 is shorter than the low-level period of the clock signal CK1. The clock signal CK2 is a signal obtained by delaying the clock signal CK1 by a half cycle. At the start of shifting, the start pulse ST shifts to the high level in the high-level period of the clock signal CK2.

Figure 5:
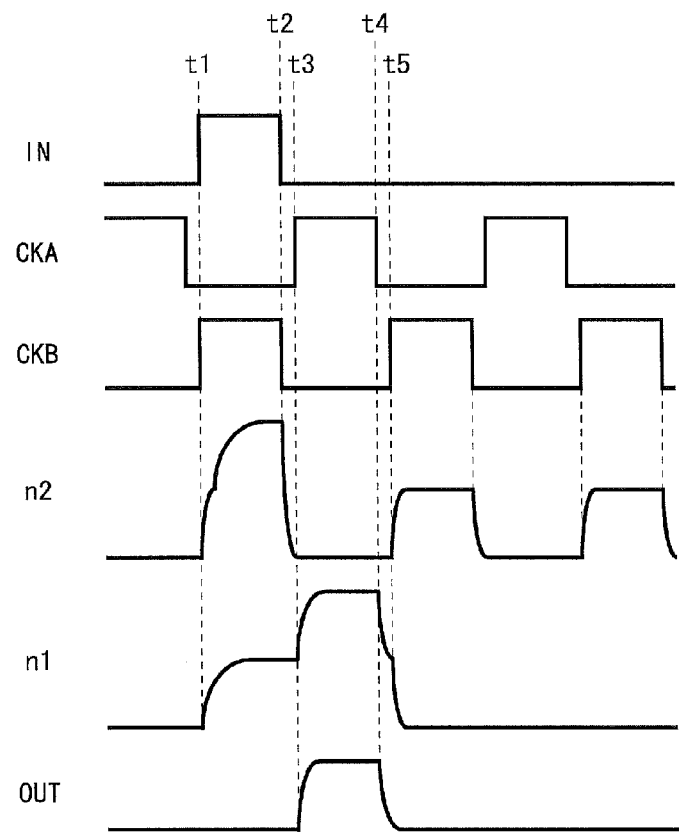
FIG. 5 is a signal waveform diagram of the shift register according to the first embodiment.

FIG. 5 is a signal waveform diagram of the shift register 10. An operation of the unit circuit 11 will be described with reference to FIG. 5. Before the time t1, potentials of the nodes n1, n2 and the output signal OUT are at the low level. At the time t1, the input signal IN and the clock signal CKB change from the low level to the high level. With this change, a current passing through the transistor Tr3 flows from the clock terminal CKB toward the node n2, and a potential of the node n2 rises (charge of the node n2). When the potential of the node n2 exceeds a predetermined level, the transistor Tr2 is turned on. At this time, with the input signal IN being at the high level, a current passing through the transistor Tr2 flows from the input terminal IN toward the node n1, and a potential of the node n1 rises (charge of the node n1). The charge of the node n1 starts later than the charge of the node n2. When the potential of the node n1 exceeds a predetermined level, the transistor Tr1 is turned on.

When the potential of the node n2 rises to (VDD−Vth), the transistor Tr3 is turned off, and the node n2 enters the floating state after that. Even after the transistor Tr3 is turned off, the potential of the node n1 keeps rising. When the potential of the node n1 rises, the potential of the node n2 rises by being pushed up by a capacitance between the gate and the source and between the gate and the channel of the transistor Tr2 (push-up of the node n2). When the potential of the node n2 becomes (VDD+Vth) or higher, the potential of the node n1 becomes the high-level potential VDD.

At the time t2, the clock signal CKB and the input signal IN change to the low level. With this change, the transistor Tr3 is turned on, a current passing through the transistor Tr3 flows from the node n2 toward the clock terminal CKB, and the potential of the node n2 drops to the low level (discharge of the node n2). When the potential of the node n2 becomes a predetermined level or lower, the transistor Tr2 is turned off. Even after the transistor Tr2 is turned off, the potential of the node n1 is held at the high-level potential VDD, and the transistor Tr1 is held in the on-state.

At the time t3, the clock signal CKA changes from the low level to the high level. With this change, from the time t3 on, the high-level potential of the clock signal CKA is outputted as the output signal OUT. Further, when the potential of the output signal OUT rises, the potential of the node n1 is pushed up by a capacitance between the gate and the channel of the transistor Tr1, and rises by α (wherein α is substantially equal to the amplitude of the clock signal CKA) (push-up of the node n1). Here, α is obtained by multiplying the amplitude of the clock signal CKA by "(a capacitance value of the capacitance between the gate and the channel of transistor Tr1)/(a total of capacitance values of all capacitances accompanying the node n1)". Since the potential of the node n1 becomes (VDD+Vth) or higher at this time, when the clock signal CKA passes through the transistor Tr1, the high-level potential of the clock signal CKA does not drop by an amount corresponding to a threshold voltage of the transistor Tr1. Hence it is possible to output as the output signal OUT a high-level potential VDD without a threshold drop. At the time t4, the clock signal CKA changes to the low level. With this change, the output signal OUT changes to the low level. Further, since the push-up of the node n1 is completed, the potential of the node n1 drops to the high-level potential VDD.

At the time t5, the clock signal CKB changes to the high level. With this change, the potential of the node n2 rises to (VDD−Vth), and the transistor Tr2 is turned on. At this time, with the input signal IN being at the low level, a current passing through the transistor Tr2 flows from the node n1 toward the input terminal IN, and the potential of the node n1 drops to the low level (discharge of the node n1). As thus described, the output signal OUT of the unit circuit 11 shifts to the high level in the high-level period of the clock signal CKA after the input signal IN has shifted to the high level. At this time, the potential of the output signal OUT shifts to the high-level potential VDD without a threshold drop.

As shown in FIG. 4, an output signal O1 of the unit circuit 11 in the first stage shifts to the high level in the high-level period of the clock signal CK1 after the start pulse ST has shifted to the high level. An output signal O2 of the unit circuit 11 in the second stage shifts to the high level in the high-level period of the clock signal CK2 after the output signal O1 has shifted to the high level. Similarly, an output signal Oi of the unit circuit 11 shifts to the high level in the high-level period of the clock signal CK1 or CK2 after an output signal Oi−1 of the unit circuit 11 in the previous stage has shifted to the high level. Therefore, the output signals O1 to On of the shift register 10 shift to the high level in ascending order (in the order of O1, O2, . . . , On) while each being delayed by a half cycle of the clock signal CK1.

As thus described, the unit circuit 11 includes: the output transistor Tr1 having a first conduction terminal connected to the clock terminal CKA, and a second conduction terminal connected to the output terminal OUT; an on-potential output unit (input terminal IN) that outputs an on-potential (high-level potential) to be provided to a control terminal of the output transistor Tr1; a set transistor Tr2 having a first conduction terminal provided with an output of the on-potential output unit, and a second conduction terminal connected to the control terminal of the output transistor Tr1; and a set control unit that applies the on-potential and an off-potential (low-level potential) in a switching manner to a control terminal of the set transistor Tr2. The on-potential output unit outputs the input signal IN with respect to the unit circuit 11, and the set control unit includes the transistor Tr3 having a first conduction terminal provided with the second clock signal CKB, a second conduction terminal connected to the control terminal of the set transistor Tr2, and a control terminal fixedly applied with the on-potential.

When the potentials of the input signal IN and the second clock signal CKB change to the on-potential, the control terminal of the set transistor Tr2 enters the floating state after a potential of the control terminal of the set transistor Tr2 reaches a predetermined level (VDD−Vth). Thereafter, the potential of the control terminal of the output transistor Tr1 keeps changing toward the on-potential (keeps increasing), the potential of the control terminal of the set transistor Tr2 becomes a sufficient on-potential (potential higher than the normal high-level potential), and the potential of the control terminal of the output transistor Tr1 becomes the on-potential VDD without a threshold drop. Thus, according to the shift register 10 of the present embodiment, at the time of outputting the clock signal having the on-potential, it is possible to change the gate potential of the output transistor Tr1 to the sufficient on-potential, so as to reduce rounding of the output signal OUT. Further, even when the threshold voltage of the transistor is originally high or when it becomes high due to a temperature change or degradation of the transistor, it is possible to suppress an influence of waveform rounding, so as to increase an operation margin with respect to fluctuation of the threshold voltage of the transistor.

Second Embodiment

A shift register according to a second embodiment of the present invention has the configuration shown in FIG. 2. However, the shift register according to the present embodiment includes a unit circuit 12 shown in FIG. 6 in place of the unit circuit 11. The unit circuit 12 is formed by adding capacitors C1, C2 to the unit circuit 11 (FIG. 3). The capacitor C1 is provided between the gate and the source of the transistor Tr1, and the capacitor C2 is provided between the gate and the drain of the transistor Tr2. It is to be noted that one of the capacitors C1, C2 may be provided.

By providing the capacitor C1, it is possible to increase push-up effect of the node n1 when the output signal OUT changes from the low level to the high level. By providing the capacitor C2, it is possible to increase push-up effect of the node n2 when the input signal IN changes from the low level to the high level. According to the shift register of the present embodiment, by increasing the push-up effect of the nodes n1, n2, it is possible to more reliably output the high-level potential VDD without a threshold drop as the output signal OUT, so as to further increase an operation margin with respect to fluctuation of the threshold voltage of the transistor.

Third Embodiment

Figure 6:
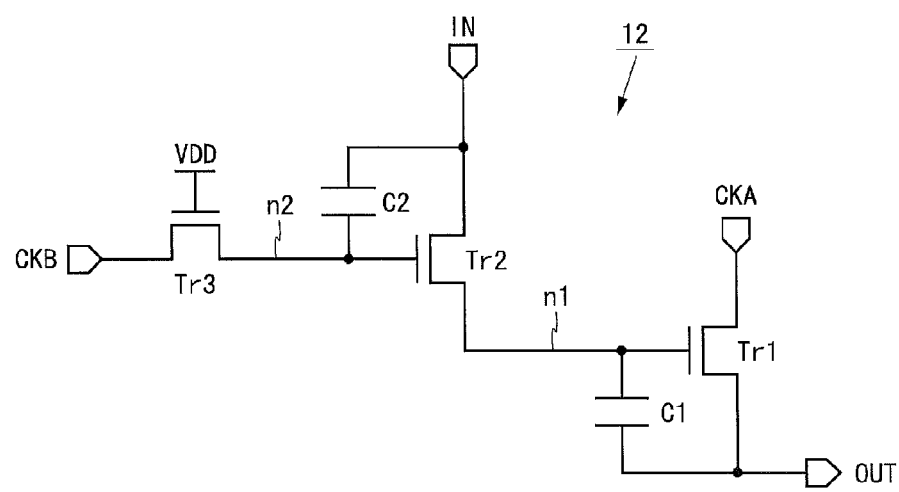
FIG. 6 is a circuit diagram of a unit circuit of a shift register according to a second embodiment.

A shift register according to a third embodiment of the present invention has the configuration shown in FIG. 2. However, the shift register according to the present embodiment includes a unit circuit 13 shown in FIG. 7 in place of the unit circuit 11. The unit circuit 13 is formed by adding N-channel transistors Tr4 to Tr7 and a resistor R1 to the unit circuit 12 (FIG. 6).

A drain terminal of the transistor Tr4 is connected to the gate terminal of the transistor Tr1. A drain terminal of the transistor Tr5 is applied with the high-level potential VDD, and a source terminal of the transistor Tr5 is connected to one end of the resistor R1. The other end of the resistor R1 is connected to a gate terminal of the transistor Tr4 and drain terminals of the transistors Tr6, Tr7. Source terminals of the transistors Tr4, Tr6, Tr7 are applied with the low-level potential VSS. Gate terminals of the transistors Tr5 to Tr7 are connected to the clock terminal CKB, the input terminal IN and the output terminal OUT, respectively. Hereinafter, anode to which the gate terminal of the transistor Tr4 is connected will be referred to as n3.

Figure 8:
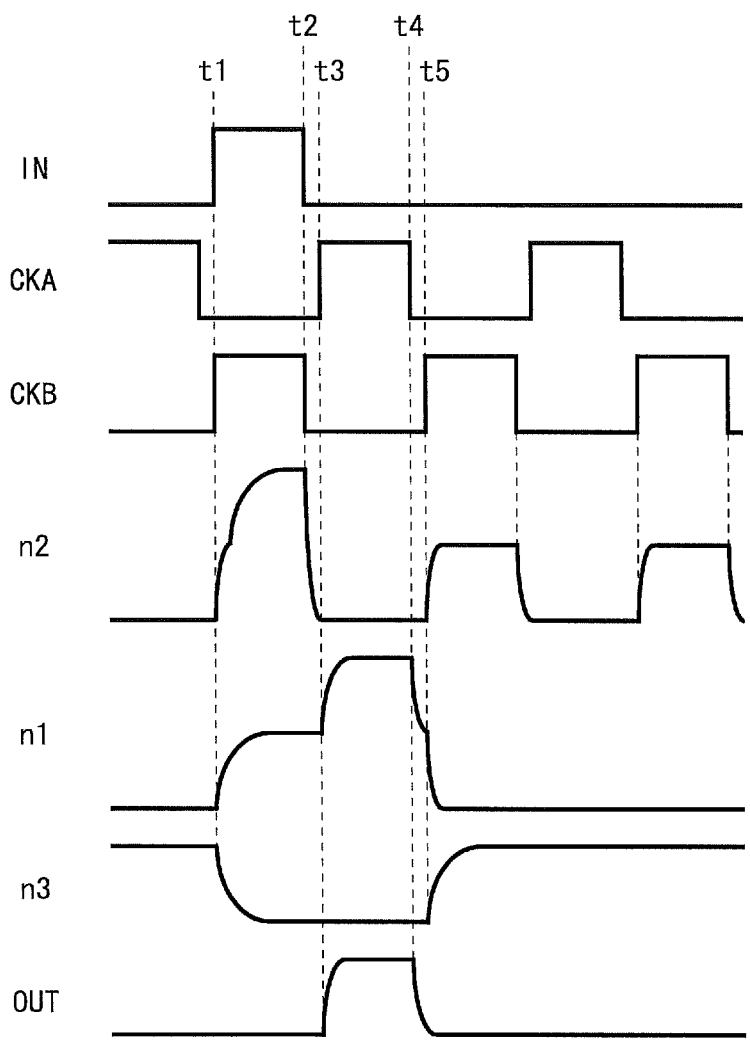
FIG. 8 is a signal waveform diagram of the shift register according to the third embodiment.

FIG. 8 is a signal waveform diagram of the shift register according to the present embodiment. The signal waveform diagram shown in FIG. 8 is obtained by adding a change in a potential of the node n3 to the signal waveform diagram shown in FIG. 5. Before the time t1, the potential of the node n3 is (VDD−Vth). When the clock signal CKB and the input signal IN change to the high level at the time t1, the transistors Tr5, Tr6 are turned on. At this time, the potential of the node n3 drops to a low-level potential close to VSS due to a current limit by the resistor R1, and hence the transistor Tr4 is turned off. When the clock signal CKB and the input signal IN change to the low level at the time t2, the transistors Tr5, Tr6 are turned off. Even after the transistors Tr5, Tr6 are turned off, the potential of the node n3 is held at the low level. When the clock signal CKB changes to the high level at the time t5, the transistor Tr5 is turned on and the potential of the node n3 rises to (VDD−Vth), and hence the transistor Tr4 is turned on. Further, from the time t5 on, the transistor Tr2 is in the on-state. Thus, by the actions of the transistors Tr2, Tr4, the potential of the node n1 changes to the low level at a high speed.

In the unit circuit 13, the clock signal CKB cyclically shifts to the high level, and the transistor Tr5 is cyclically turned on. Therefore, even when the potential of the node n3 drops by off-leak currents of the transistors Tr6, Tr7, the potential of the node n3 cyclically becomes (VDD−Vth). Thus, according to the shift register of the present embodiment, it is possible to hold the potential of the node n3 at the high level in the off-period of the transistor Tr1.

Further, in the unit circuit 13, the potential of the node n2 is cyclically shifted to the low level, and the transistor Tr2 is cyclically turned off. Therefore, unless the transistor Tr4 is provided, when the clock signal CKA shifts to the high level with the transistor Tr2 being in the off-state, a noise can be generated in the potential of the node n1 to cause the transistor Tr1 to erroneously turn on. In the unit circuit 13, the potential of the node n1 is fixed to the low level by using the transistor Tr4 in the off-period of the transistor Tr1. Thus, according to the shift register of the present embodiment, it is possible to prevent an erroneous operation caused by the change in the clock signal CKA.

Further, unless the transistor Tr7 is provided, in the high-level period of the output signal OUT, the potential of the node n3 can rise by an off-leak current of the transistor Tr5, to cause the transistor Tr4 to be turned on and the potential of the node n1 to drop. In the unit circuit 13, the potential of the node n3 is fixed to the low level by using the transistor Tr7 in the high-level period of the output signal OUT. Thus, according to the shift register of the present embodiment, it is possible to prevent an erroneous operation caused by the potential rise of the node n3.

In place of the unit circuit 13, there may be used a unit circuit formed by connecting the transistor Tr5 and the resistor R1 in the reverse order (a circuit formed by applying the high-level potential VDD to one end of the resistor R1, connecting the other end of the resistor R1 to the drain terminal of the transistor Tr5, and connecting the source terminal of the transistor Tr5 to the gate terminal of the transistor Tr4 and the drain terminals of the transistors Tr6, Tr7). By the shift register provided with this unit circuit, a similar effect to that of the shift register provided with the unit circuit 13 is obtained.

Fourth Embodiment

Figure 7:
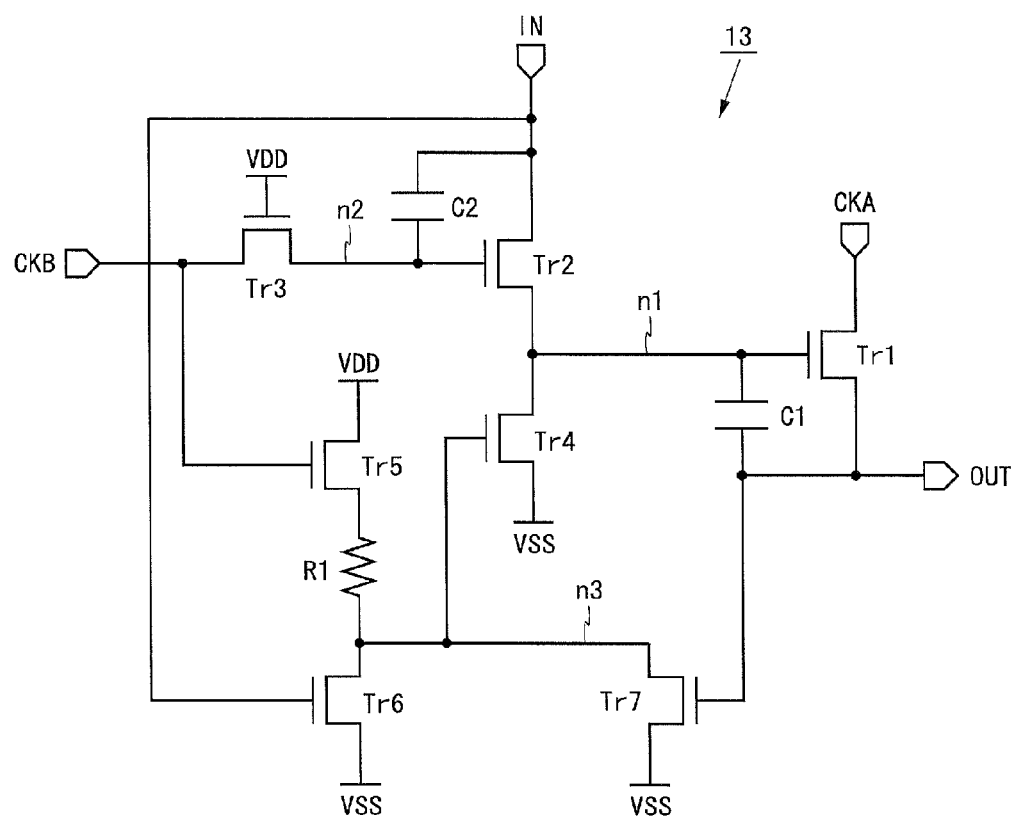
FIG. 7 is a circuit diagram of a unit circuit of a shift register according to a third embodiment.

A shift register according to a fourth embodiment of the present invention has the configuration shown in FIG. 2. However, the shift register according to the present embodiment includes a unit circuit 14 shown in FIG. 9 in place of the unit circuit 11. The unit circuit 14 is formed by adding an N-channel transistor Tr8 to the unit circuit 13 (FIG. 7). A drain terminal of the transistor Tr8 is connected to the output terminal OUT, a source terminal of the transistor Tr8 is applied with the low-level potential VSS, and a gate terminal of the transistor Tr8 is connected to the node n3.

After the output signal OUT is changed from the high level to the low level, the output signal OUT is required to be held at the low level until the input signal IN next shifts to the high level. However, the output signal OUT may not be held at the low level due to an off-leak current of the transistor Tr1, a leak current in the circuit connected to the output terminal OUT, or the like, and the shift register may be erroneously operated. In the unit circuit 14, the output signal OUT is fixed to the low level by using the transistor Tr8 in the off-period of the transistor Tr1. Thus, according to the shift register of the present embodiment, it is possible to prevent an erroneous operation caused by a potential rise of the output signal OUT.

Fifth Embodiment

Figure 10:
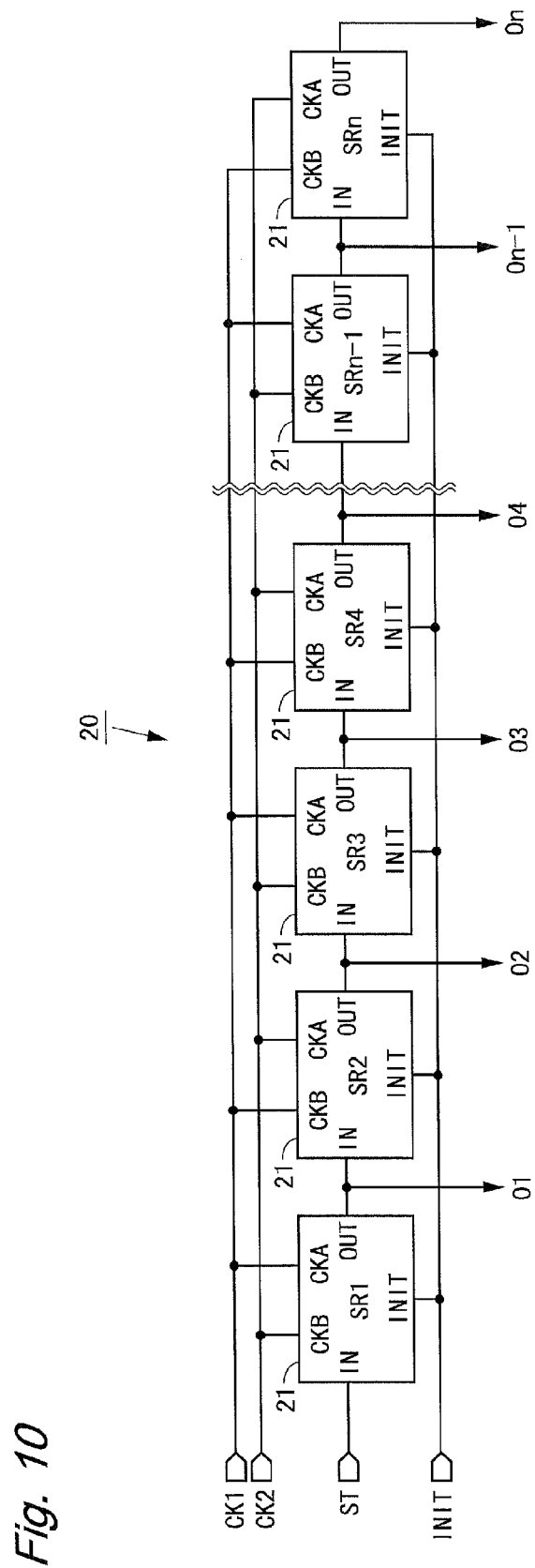
FIG. 10 is a block diagram showing a configuration of a shift register according to a fifth embodiment.

FIG. 10 is a block diagram showing a configuration of a shift register according to a fifth embodiment of the present invention. A shift register 20 shown in FIG. 10 is configured by connecting n unit circuits 21 in multiple stages. The unit circuit 21 has the clock terminals CKA, CKB, the input terminal IN, an initialization terminal INIT, and the output terminal OUT. From the outside, the shift register 20 is supplied with the start pulse ST, the two-phase clock signals CK1, CK2, and an initialization signal INIT. The initialization signal INIT is provided to the initialization terminals INIT of the n unit circuits 21. Signals other than that are provided to each terminal similarly to the shift register according to the first embodiment (FIG. 2).

Figure 9:
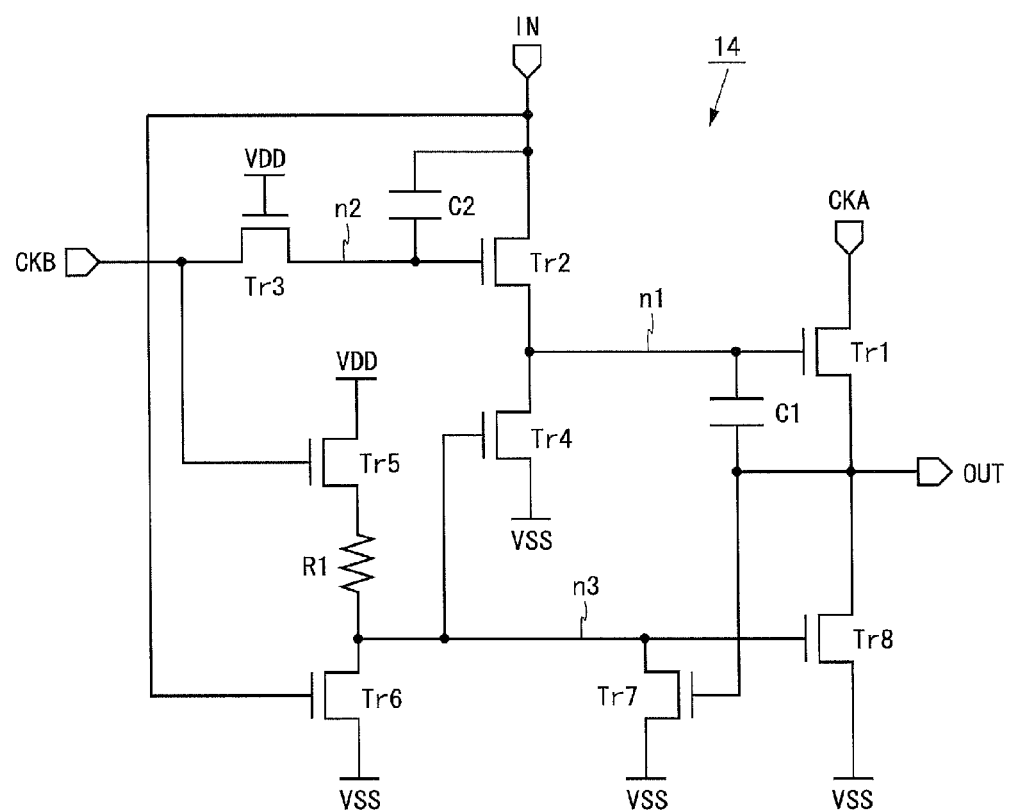
FIG. 9 is a circuit diagram of a unit circuit of a shift register according to a fourth embodiment.
Figure 11:
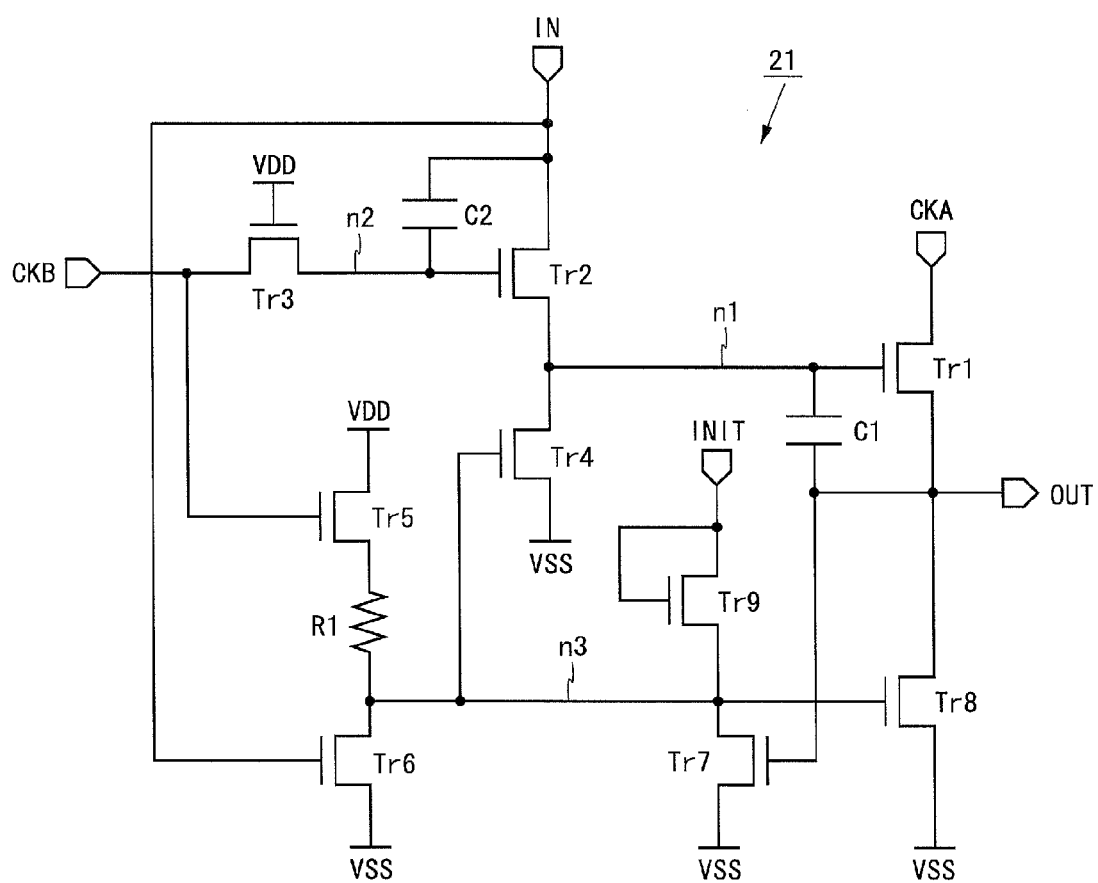
FIG. 11 is a circuit diagram of a unit circuit of the shift register according to the fifth embodiment.

FIG. 11 is a circuit diagram of the unit circuit 21. The unit circuit 21 is formed by adding an N-channel transistor Tr9 to the unit circuit 14 (FIG. 9). A gate terminal and a drain terminal of the transistor Tr9 are connected to the initialization terminal INIT, and a source terminal of the transistor Tr9 is connected to the node n3.

The initialization signal INIT is controlled to the high level immediately after power on, at the time of power off, at the time when the shift register is temporarily set to an initial state, and the like, and is controlled to the low level otherwise. When the initialization signal INIT is at the low level, the transistor Tr9 is turned off, and the unit circuit 21 operates similarly to the unit circuit 14. When the initialization signal INIT is at the high level, the transistor Tr9 is turned on, and the potential of the node n3 rises to (VDD−Vth). Hence the transistor Tr8 is turned on and the output signal OUT shifts to the low level. Further, since the transistor Tr4 is also turned on, the potential of the node n1 shifts to the low level and the transistor Tr1 is turned off. Thus, the output signal OUT reliably shifts to the low level.

According to the shift register 20 of the present embodiment, by using the transistor Tr9, it is possible to initialize the potential of the node n1 and the output signal OUT to the low level and initialize the potential of the node n3 to the high level. It is to be noted that the unit circuit 21 may include a transistor having a gate terminal connected to the initialization terminal INIT and a drain terminal applied with the high-level potential VDD, in place of the transistor Tr9. Also by using this transistor, it is possible to perform similar initialization.

Sixth Embodiment

A shift register according to a sixth embodiment of the present invention has the configuration shown in FIG. 10. However, the shift register according to the present embodiment includes a unit circuit 22 shown in FIG. 12 in place of the unit circuit 21. The unit circuit 22 is formed by adding an N-channel transistor Tr10 to the unit circuit 21 (FIG. 11). A drain terminal of the transistor Tr10 is connected to the source terminal of the transistor Tr2, a source terminal of the transistor Tr10 is connected to the gate terminal of the transistor Tr1, and a gate terminal of the transistor Tr10 is applied with the high-level potential VDD. The transistor Tr10 functions as a breakdown voltage transistor. Hereinafter, a node to which the drain terminal of the transistor Tr10 is connected will be referred to as n4, and a node to which the source terminal of the transistor Tr10 is connected will be referred to as n5.

In the unit circuit 21, the potential of the node n1 becomes (VDD−Vth+α) at the maximum by being pushed up. At this time, a high voltage (VDD−Vth+α−VSS) is applied between the gate and the source and between the source and the drain of the transistor Tr2. The same high voltage is also applied between the gate and the drain and between the source and the drain of the transistor Tr4. When such a high voltage is applied between the terminals of the transistor, degradation or breakdown of the transistor can occur. In order to solve this problem, the unit circuit 22 includes the transistor Tr10.

Figure 13:
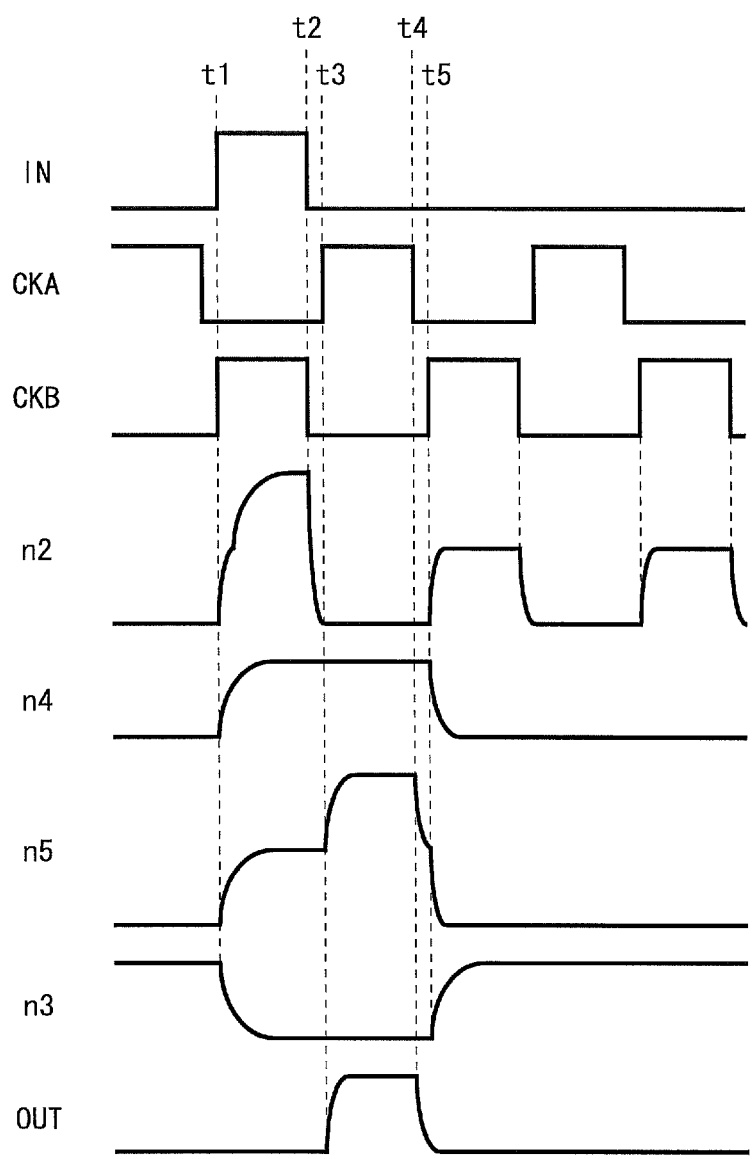
FIG. 13 is a signal waveform diagram of the shift register according to the sixth embodiment.

FIG. 13 is a signal waveform diagram of the shift register according to the present embodiment. The signal waveform diagram shown in FIG. 13 is obtained by deleting the change in the potential of the node n1 from the signal waveform diagram shown in FIG. 8 and adding changes in potentials of the nodes n4, n5. After a lapse of certain time from the time t1, the potential of the node n4 rises to the high-level potential VDD without a threshold drop. At this time, with the transistor Tr10 being in the on-state, when the potential of the node n4 changes from the low level to the high level, the potential of the node n5 also changes in a similar manner (charge of the node n5). When the potential of the node n5 rises to (VDD−Vth), the transistor Tr10 is turned off, and the nodes n4, n5 are electrically disconnected. Hence the potential of the node n5 only rises to (VDD−Vth) at this time point.

When the clock signal CKA changes to the high level at the time t3, the potential of the node n5 rises to (VDD−Vth+α) by being pushed up (push-up of the node n5). At this time, with the transistor Tr10 being in the off-state, the potential of the node n4 remains unchanged even when the potential of the node n5 rises. When the clock signal CKA changes to the low level at the time t4, the output signal OUT changes to the low level, and the potential of the node n5 drops to (VDD−Vth). When the clock signal CKB changes to the high level at the time t5, the transistors Tr2, Tr4 are turned on, and the potentials of the nodes n4, n5 drop to the low level (discharge of the node n5).

In the unit circuit 22, the potential of the node n5 becomes (VDD−Vth+α) at the maximum by being pushed up. At this time, the potential of the node n4 is VDD, and hence a voltage (VDD−VSS), which is lower than a driving voltage of the transistor, is applied between the gate and the source and between the source and the drain of the transistor Tr2. The same voltage is also applied between the gate and the drain and between the source and the drain of the transistor Tr4. Further, a voltage (α−Vth) is applied between the gate and the source and between the source and the drain of the transistor Tr10. Since α becomes as small as the amplitude of the clock signal CKA at the maximum, this voltage is also lower than the driving voltage of the transistor. As thus described, by providing a voltage, which is lower than the driving voltage of the transistor, between the terminals of the transistors Tr2, Tr4 by using the transistor Tr10, it is possible to prevent degradation and breakdown of the transistors Tr2, Tr4.

Further, when measures for breakdown voltage are taken on a unit circuit not including the transistor Tr3, charging the node n5 takes time since output impedance of the transistor Tr2 is high. Thus, when an operation frequency is high, the potential of the node n5 may not reach (VDD−Vth) within predetermined time. In contrast, in the unit circuit 22, since the gate potential of the transistor Tr2 is high and the output impedance of the transistor Tr2 is low, it is possible to charge the node n5 at a high speed. Accordingly, even when an operation frequency is high, the potential of the node n5 reaches (VDD−Vth) within predetermined time. Thus, according to the shift register of the present embodiment, as compared to the case of taking measures for breakdown voltage on a shift register not including the transistor Tr3, it is possible to increase the operation margin while preventing degradation and breakdown of the transistor.

As thus described, the unit circuit 22 includes: the output transistor Tr1 having a first conduction terminal connected to the clock terminal CKA, and a second conduction terminal connected to the output terminal OUT; the breakdown voltage transistor Tr10 having a first conduction terminal connected to a first node (node n4), a second conduction terminal connected to a control terminal of the output transistor Tr1 and a control terminal fixedly applied with an on-potential (high-level potential); an on-potential output unit (input terminal IN) that outputs the on-potential to be provided to the first node; the set transistor Tr2 having a first conduction terminal provided with an output of the on-potential output unit, and a second conduction terminal connected to the first node; and a set control unit (transistor Tr3) that applies the on-potential and an off-potential in a switching manner to a control terminal of the set transistor Tr2. The on-potential output unit outputs the input signal IN with respect to the unit circuit 22, and the set control unit includes the transistor Tr3 having a first conduction terminal provided with the second clock signal CKB, a second conduction terminal connected to the control terminal of the set transistor Tr2, and a control terminal fixedly applied with the on-potential.

When the potentials of the input signal IN and the second clock signal CKB change to the on-potential, the control terminal of the set transistor Tr2 enters the floating state after the potential of the control terminal of the set transistor Tr2 reaches the predetermined level (VDD−Vth). Thereafter, the potential of the first node keeps changing toward the on-potential (keeps increasing), the potential of the control terminal of the set transistor Tr2 becomes a sufficient on-potential (potential higher than the normal high-level potential), and the potential of the first node becomes the on-potential VDD without a threshold drop. Thus, according to the shift register of the present embodiment, it is possible to reduce rounding of the output signal OUT and increase the operation margin with respect to fluctuation of the threshold voltage of the transistor. Further, at the time of outputting the clock signal having the on-potential, the potential of the first node remains unchanged from the on-potential outputted from the on-potential output unit, by the action of the breakdown voltage transistor Tr10. Hence it is possible to prevent application of a high voltage between the terminals of the transistors Tr2, Tr4 connected to the first node.

Seventh Embodiment

Figure 14:
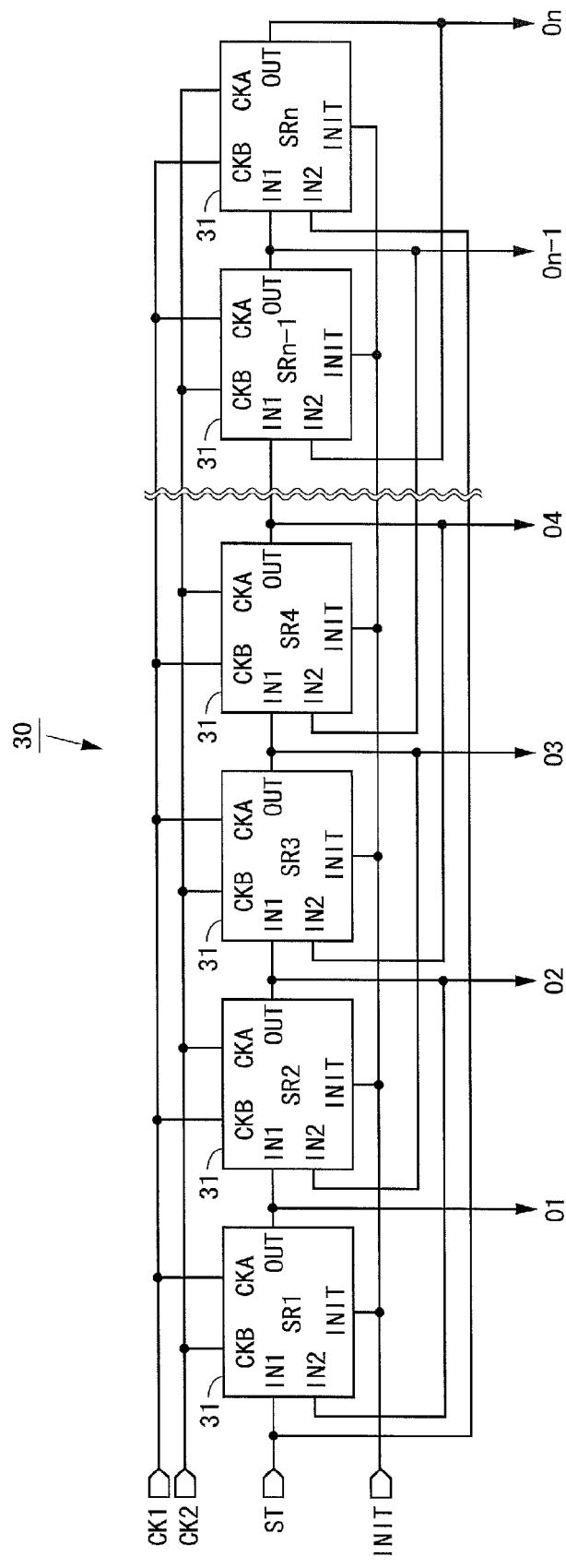
FIG. 14 is a block diagram showing a configuration of a shift register according to a seventh embodiment.

FIG. 14 is a block diagram showing a configuration of a shift register according to a seventh embodiment of the present invention. A shift register 30 shown in FIG. 14 is configured by connecting n unit circuits 31 in multiple stages. The unit circuit 31 has the clock terminals CKA, CKB, input terminals IN1, IN2, the initialization terminal INIT, control terminals UD, UDB (not shown), and the output terminal OUT. From the outside, the shift register 30 is supplied with the start pulse ST, the two-phase clock signals CK1, CK2, the initialization signal INIT, and control signals UD, UDB (not shown). The clock signals CK1, CK2 are provided to each terminal similarly to the shift register 10 (FIG. 2) according to the first embodiment. The initialization signal INIT and the control signals UD, UDB are respectively provided to the initialization terminal INIT and the control terminals UD, UDB of each of the n unit circuits 31. The start pulse ST is provided to the input terminal IN1 of the unit circuit 31 in the first stage and to the input terminal IN2 of the unit circuit 31 in the n-th stage. The output signal OUT of the unit circuit 31 is outputted to the outside as each of the output signals O1 to On, and provided to the input terminal IN1 of the unit circuit 31 in the next stage and the input terminal IN2 of the unit circuit 31 in the previous stage.

Figure 12:
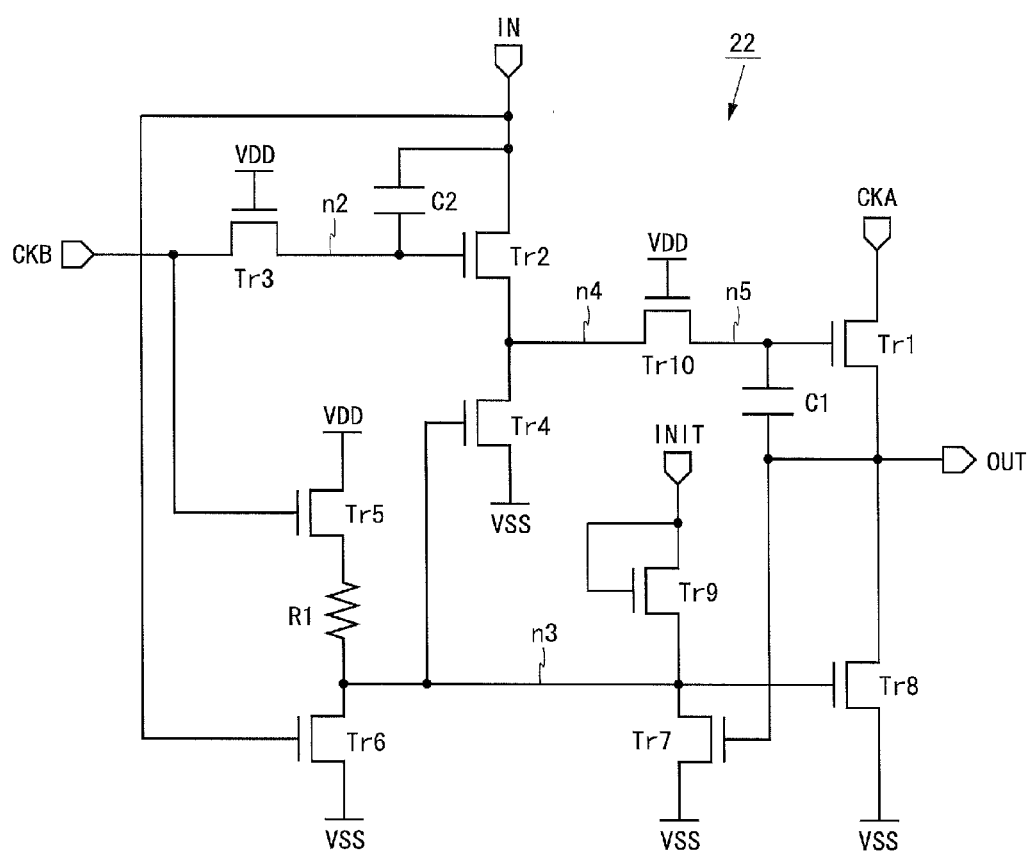
FIG. 12 is a circuit diagram of a unit circuit of a shift register according to a sixth embodiment.
Figure 15:
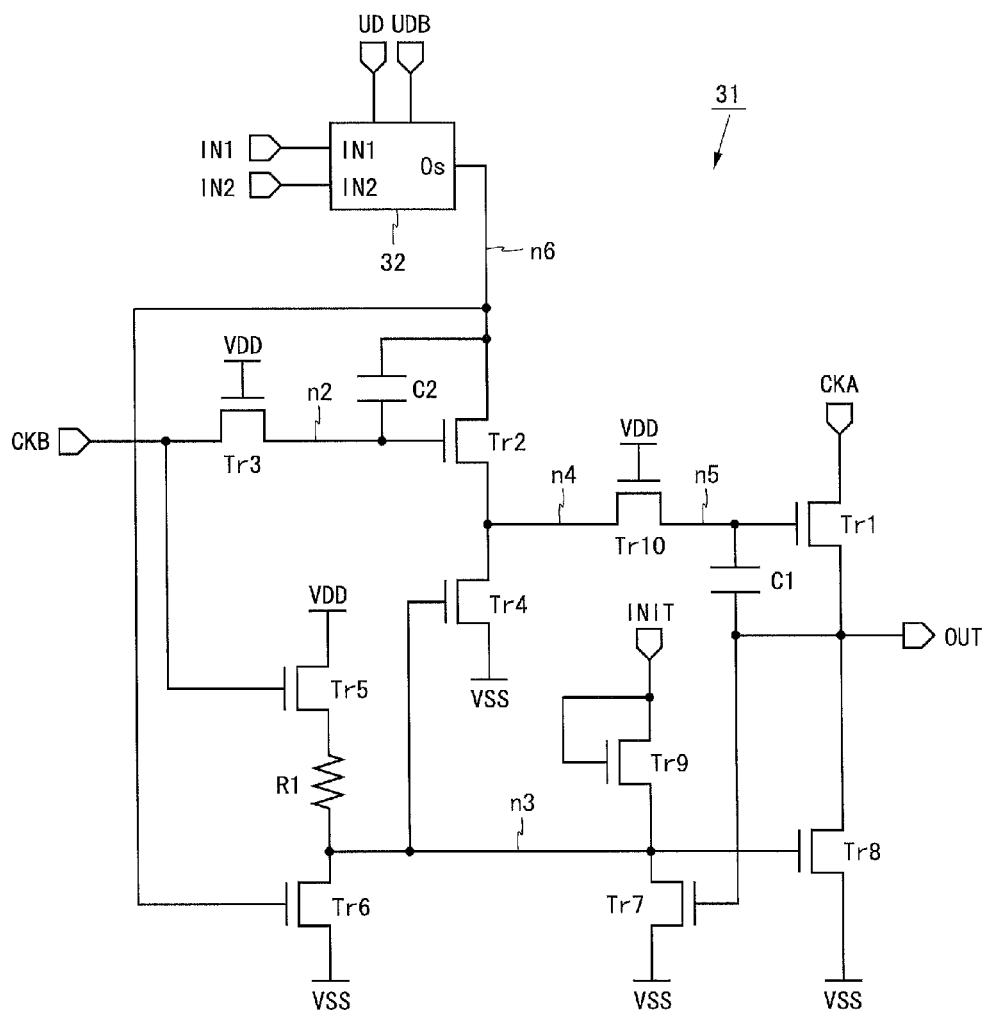
FIG. 15 is a circuit diagram of a unit circuit of the shift register according to the seventh embodiment.

FIG. 15 is a circuit diagram of the unit circuit 31. The unit circuit 31 is formed by adding a scan switching circuit 32 to the unit circuit 22 (FIG. 12). The scan switching circuit 32 functions as an on-potential output unit. The control signal UD is controlled to the high level at the time of forward scanning, and controlled to the low level at the time of backward scanning. The control signal UDB is an inverted signal of the control signal UD. In accordance with the control signals UD, UDB, the scan switching circuit 32 outputs an input signal IN1 at the time of forward scanning, and outputs an input signal IN2 at the time of backward scanning. An output signal Os of the scan switching circuit 32 is provided to the drain terminal of the transistor Tr2 and the gate terminal of the transistor Tr6. Hereinafter, a node to which the output terminal Os of the scan switching circuit 32 is connected will be referred to as n6.

At the time of forward scanning, the unit circuit 31 is operated taking the output signal OUT of the unit circuit 31 in the previous stage as an input signal. At this time, the output signals O1 to On of the shift register 30 shift to the high level in ascending order (cf. FIG. 4). At the time of backward scanning, the unit circuit 31 is operated taking the output signal OUT of the unit circuit 31 in the next stage as an input signal. At this time, the output signals O1 to On of the shift register 30 shift to the high level in descending order (in the order of On, On−1, . . . , O1) (cf. FIG. 16).

Figure 16:
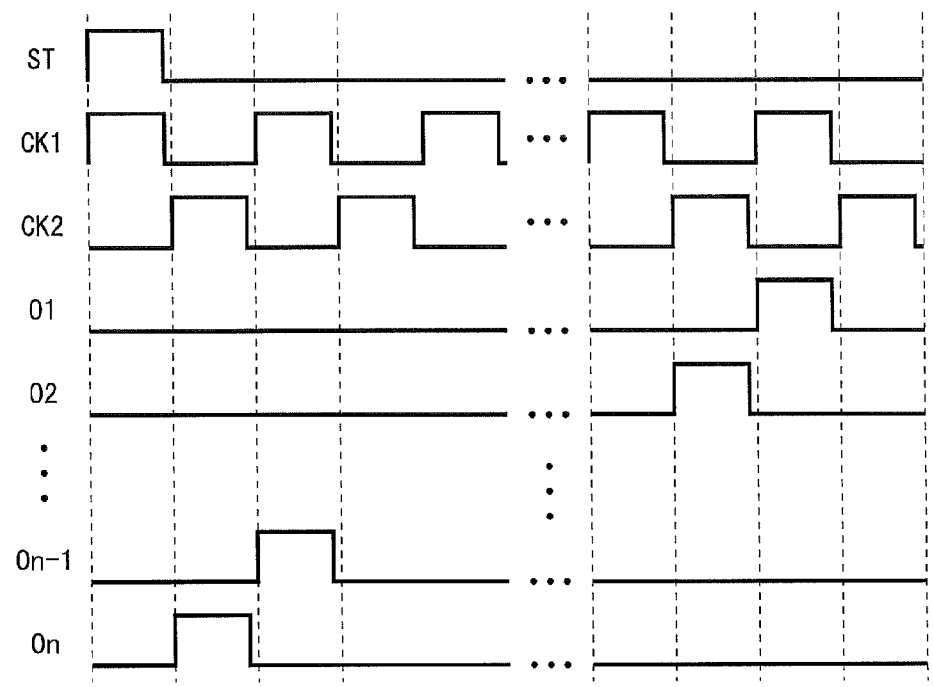
FIG. 16 is a timing chart of the shift register according to the seventh embodiment at the time of backward scanning.
Figure 17:
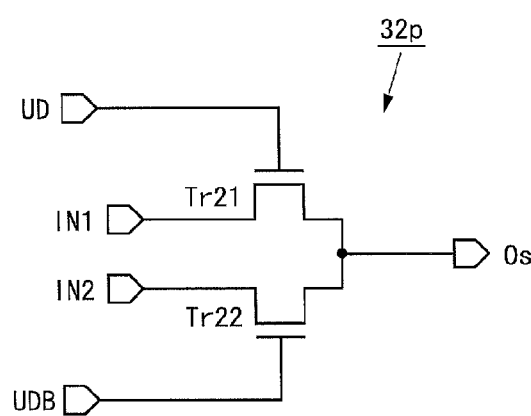
FIG. 17 is a circuit diagram of a first example of a scan switching circuit of the shift register according to the seventh embodiment.
Figure 18:
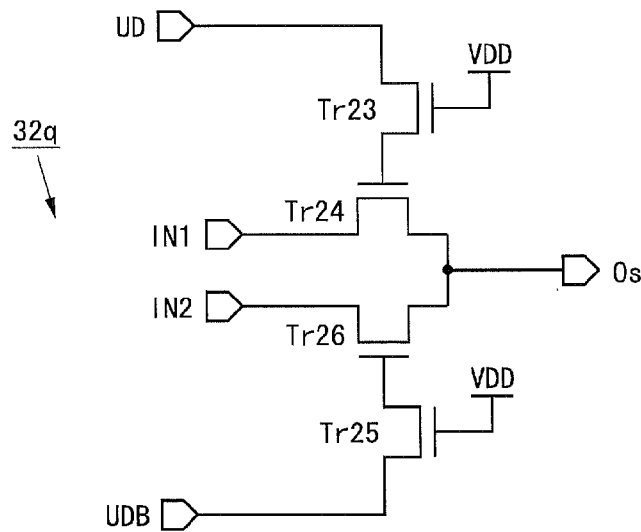
FIG. 18 is a circuit diagram of a second example of the scan switching circuit of the shift register according to the seventh embodiment.
Figure 19:
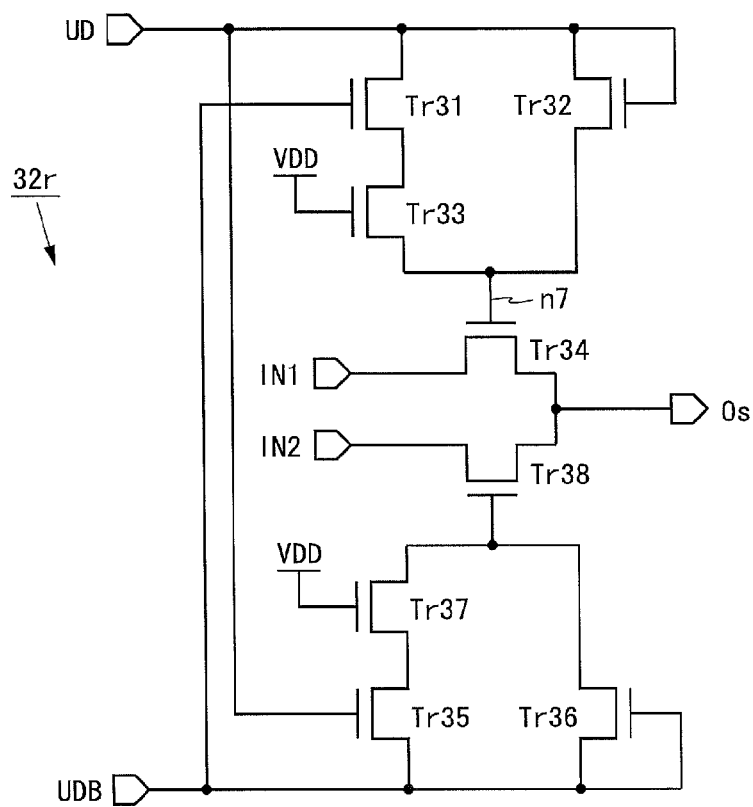
FIG. 19 is a circuit diagram of a third example of the scan switching circuit of the shift register according to the seventh embodiment.

FIGS. 17 to 19 are circuit diagrams showing examples of the scan switching circuit 32. In a scan switching circuit 32$p$ shown in FIG. 17, at the time of forward scanning, the transistor Tr21 is turned on and the transistor Tr22 is turned off. At this time, the scan switching circuit 32$p$ provides, to the node n6, the output signal OUT of the unit circuit 31 in the previous stage which is provided to the input terminal IN1. At the time of backward scanning, the transistor Tr21 is turned off and the transistor Tr22 is turned on. At this time, the scan switching circuit 32$p$ provides, to the node n6, the output signal OUT of the unit circuit 31 in the next stage which is provided to the input terminal IN2. By selecting the input signal by using the scan switching circuit 32$p$, it is possible to switch the scanning direction as shown in FIGS. 4 and 16.

In the scan switching circuit 32$p$, the high-level potential outputted from the output terminal Os is (VDD−Vth), and hence the operation margin is small. In order to make the operation margin large, a scan switching circuit 32$q$ shown in FIG. 18 or a scan switching circuit 32$r$ shown in FIG. 19 may be used in place of the scan switching circuit 32$p$.

In the scan switching circuit 32$r$, a node to which agate terminal of a transistor Tr34 is connected is referred to as n7. In the scan switching circuit 32$r$, at the time of forward scanning, a potential of the node n7 becomes (VDD−Vth) and the node n7 enters the floating state, by the action of a transistor Tr32. When the input signal IN1 changes from the low level to the high level, the potential of the node n7 rises by being pushed up by a capacitance between agate and a channel of the transistor Tr34. Therefore, it is possible to output, from the output terminal Os, the high-level potential VDD without a threshold drop. At this time, a transistor Tr33 prevents application of a high voltage to a transistor Tr31. At the time of backward scanning, the transistors Tr31, Tr33 are turned on, and hence the potential of the node n7 shifts to the low level similarly to the control signal UD, and the transistor Tr34 is turned off. By using the scan switching circuit 32$r$, the scanning direction can be switched while the operation margin is increased.

In the case of using the scan switching circuit 32$q$, at the time of forward scanning, (VDD−Vth) and VSS are respectively provided to gate terminals of transistors Tr24, Tr26. At the time of backward scanning, VSS and (VDD−Vth) are respectively provided to the gate terminals of the transistors Tr24, Tr26. Hence a similar effect to that of the scan switching circuit 32$r$ can also be obtained in the scan switching circuit 32$q$.

Thus, according to the shift register of the present embodiment, concerning the shift register that switches the scanning direction, it is possible to increase an operation margin with respect to fluctuation of the threshold voltage of the transistor. Further, by using the scan switching circuits 32$q$, 32$r$ shown in FIGS. 18, 19, it is possible to provide the high-level potential VDD without a threshold drop to the gate terminal of the transistor where the input signals IN1, IN2 pass, so as to increase the operation margin.

Eighth Embodiment

Figure 20:
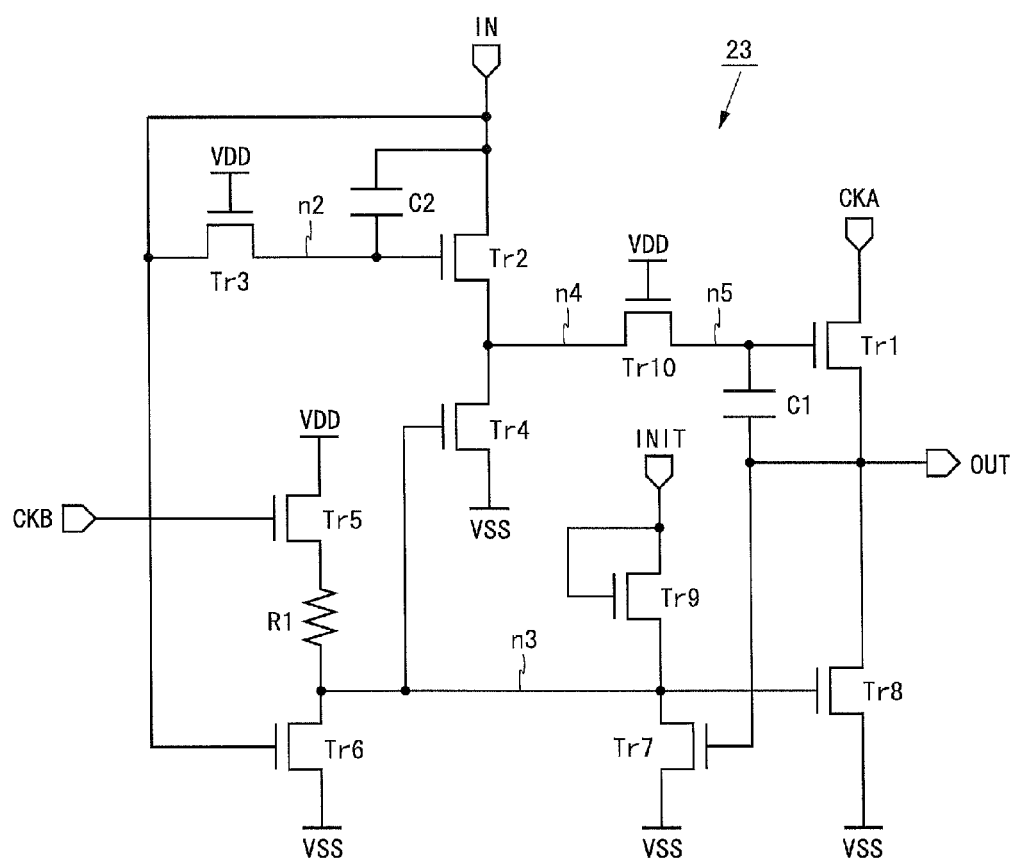
FIG. 20 is a circuit diagram of a unit circuit of a shift register according to an eighth embodiment.

A shift register according to an eighth embodiment of the present invention has the configuration shown in FIG. 10. However, the shift register according to the present embodiment includes a unit circuit 23 shown in FIG. 20 in place of the unit circuit 21. The unit circuit 23 is formed by changing, in the unit circuit 22 (FIG. 12), the connection destination of the drain terminal of the transistor Tr3 to the input terminal IN.

Figure 21:
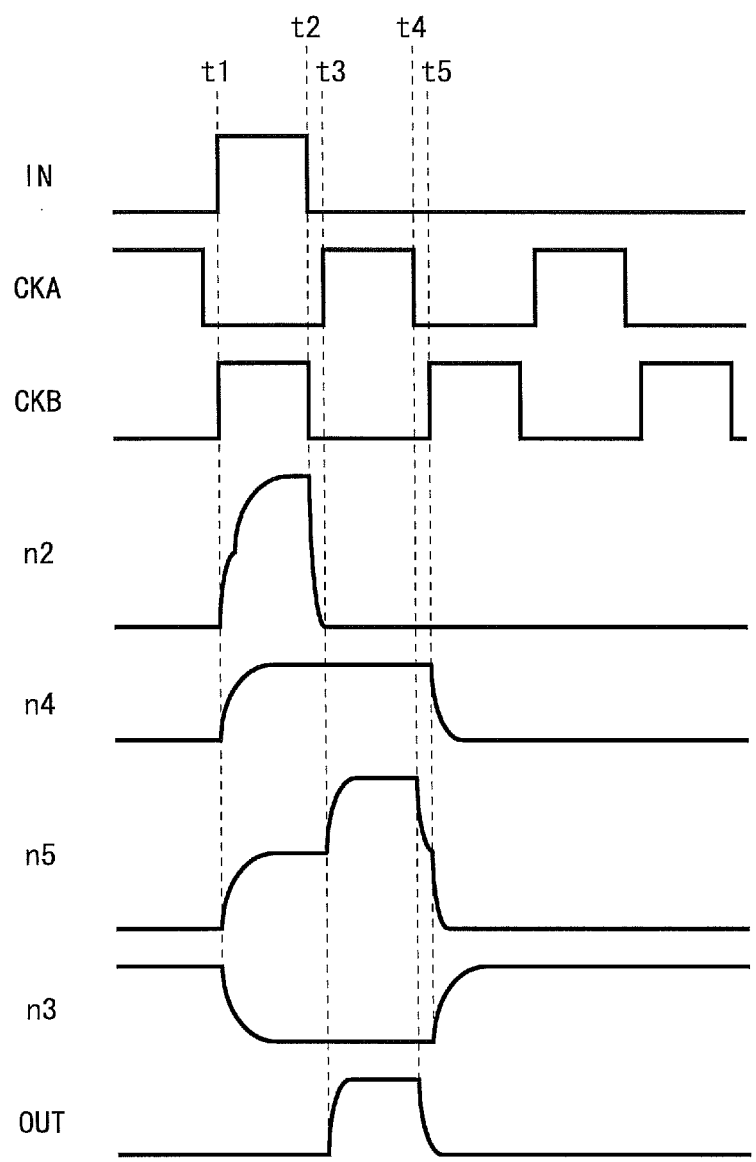
FIG. 21 is a signal waveform diagram of the shift register according to the eighth embodiment.

FIG. 21 is a signal waveform diagram of the shift register according to the present embodiment. The signal waveform diagram shown in FIG. 21 is the same as the signal waveform diagram shown in FIG. 13 except that the potential of the node n2 is held at the low level from the time t5 on. When the input signal IN changes to the high level at the time t1, a current passing through the transistor Tr3 flows from the input signal IN toward the node n2, and a potential of the node n2 rises (charge of the node n2). Subsequently, the node n5 is charged and the node n2 is pushed up. When the input signal IN changes to the low level at the time t2, the potential of the node n2 drops to the low level (discharge of the node n2). The potential of the node n2 is held at the low level after that.

In the unit circuit 22, the potential of the node n2 changes when the clock signal CKB changes. In contrast, in the unit circuit 23, the potential of the node n2 changes when the input signal IN changes. The frequency of changes in the input signal IN is smaller than the frequency of changes in the clock signal CKB. Thus, according to the shift register of the present embodiment, it is possible to reduce charge and discharge of a parasitic capacitance accompanying the node n2, so as to reduce power consumption.

As thus described, in the unit circuit 23, the on-potential output unit (input terminal IN) outputs the input signal IN with respect to the unit circuit 23, and the set control unit includes the transistor Tr3 having a first conduction terminal provided with the input terminal IN, a second conduction terminal connected to the control terminal of the set transistor Tr2, and a control terminal fixedly applied with the on-potential (high-level potential).

When the potential of the input signal IN changes to the on-potential, the control terminal of the set transistor Tr2 enters the floating state after the potential of the control terminal of the set transistor Tr2 reaches the predetermined level (VDD−Vth). Thereafter, the potential of the first node (node n4) keeps changing toward the on-potential (keeps increasing), the potential of the control terminal of the set transistor Tr2 becomes a sufficient on-potential (potential higher than the normal high-level potential), and the potential of the first node becomes the on-potential VDD without a threshold drop. Thus, according to the shift register of the present embodiment, it is possible to reduce rounding of the output signal OUT and increase the operation margin with respect to fluctuation of the threshold voltage of the transistor.

Ninth Embodiment

Figure 22:
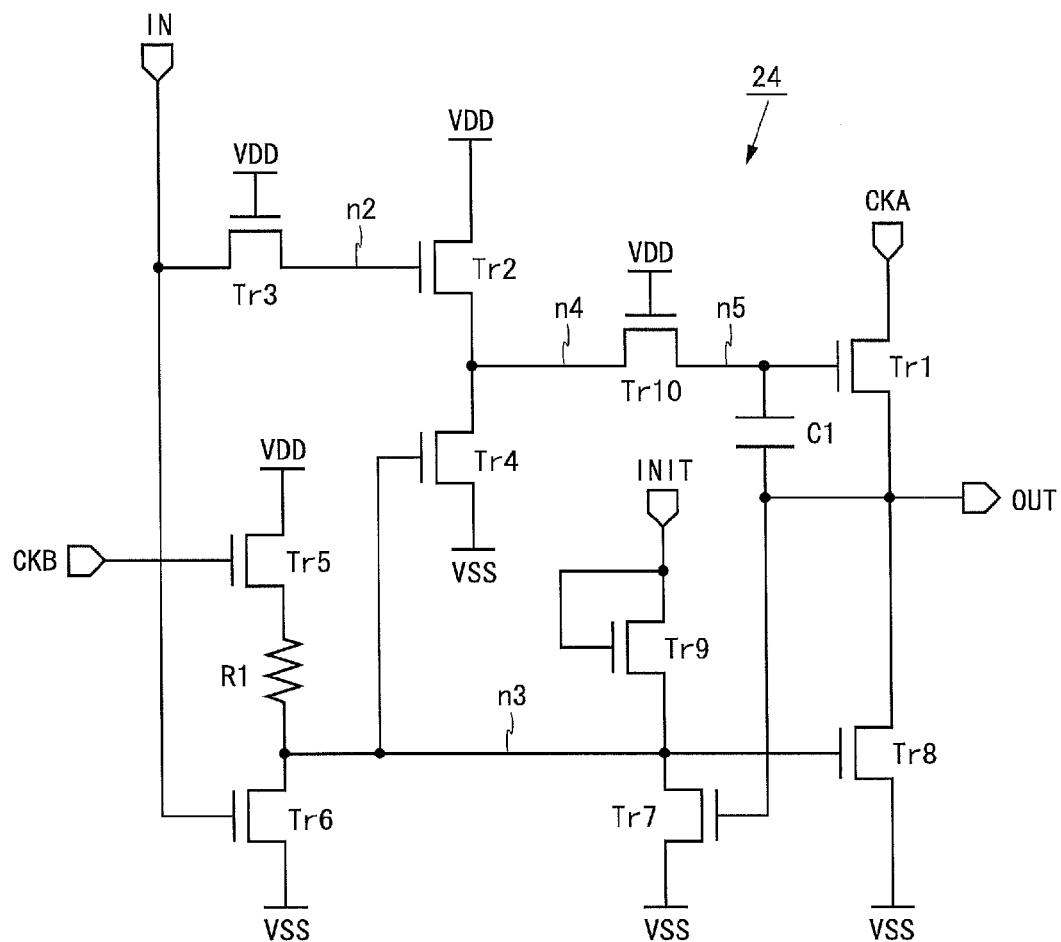
FIG. 22 is a circuit diagram of a unit circuit of a shift register according to a ninth embodiment.

A shift register according to a ninth embodiment of the present invention has the configuration shown in FIG. 10. However, the shift register according to the present embodiment includes a unit circuit 24 shown in FIG. 22 in place of the unit circuit 21. The unit circuit 24 is formed by deleting the capacitor C2 from the unit circuit 23 (FIG. 20), and applying the high-level potential VDD to the drain terminal of the transistor Tr2. The terminal having the high-level potential VDD functions as an on-potential output unit.

The signal waveform diagram of the shift register according to the present embodiment is the same as the signal waveform diagram shown in FIG. 21. When the input signal IN changes to the high level at the time t1, a current passing through the transistor Tr3 flows from the input signal IN toward the node n2, and a potential of the node n2 rises (charge of the node n2). When the potential of the node n2 exceeds a predetermined level, the transistor Tr2 is turned on. Since the high-level potential VDD is applied to the drain terminal of the transistor Tr2, a current passing through the transistors Tr2, Tr10 flows from the drain terminal of the transistor Tr2 toward the node n5, and the potential of the node n5 rises (charge of the node n5). Subsequently, the node n2 is pushed up. When the input signal IN changes to the low level at the time t2, the potential of the node n2 drops to the low level (discharge of the node n2). The potential of the node n2 is held at the low level after that. According to the shift register of the present embodiment, similarly to the eighth embodiment, it is possible to reduce charge and discharge of a parasitic capacitance accompanying the node n2, so as to reduce power consumption.

As thus described, in the unit circuit 24, the on-potential output unit (terminal having the high-level potential VDD) fixedly outputs the on-potential (high-level potential), and the set control unit includes the transistor Tr3 having a first conduction terminal provided with the input signal IN with respect to the unit circuit 24, a second conduction terminal connected to the control terminal of the set transistor Tr2, and a control terminal fixedly applied with the on-potential. According to the shift register of the present embodiment, similarly to the eighth embodiment, it is possible to reduce rounding of the output signal OUT and increase the operation margin with respect to fluctuation of the threshold voltage of the transistor.

Tenth Embodiment

Figure 23:
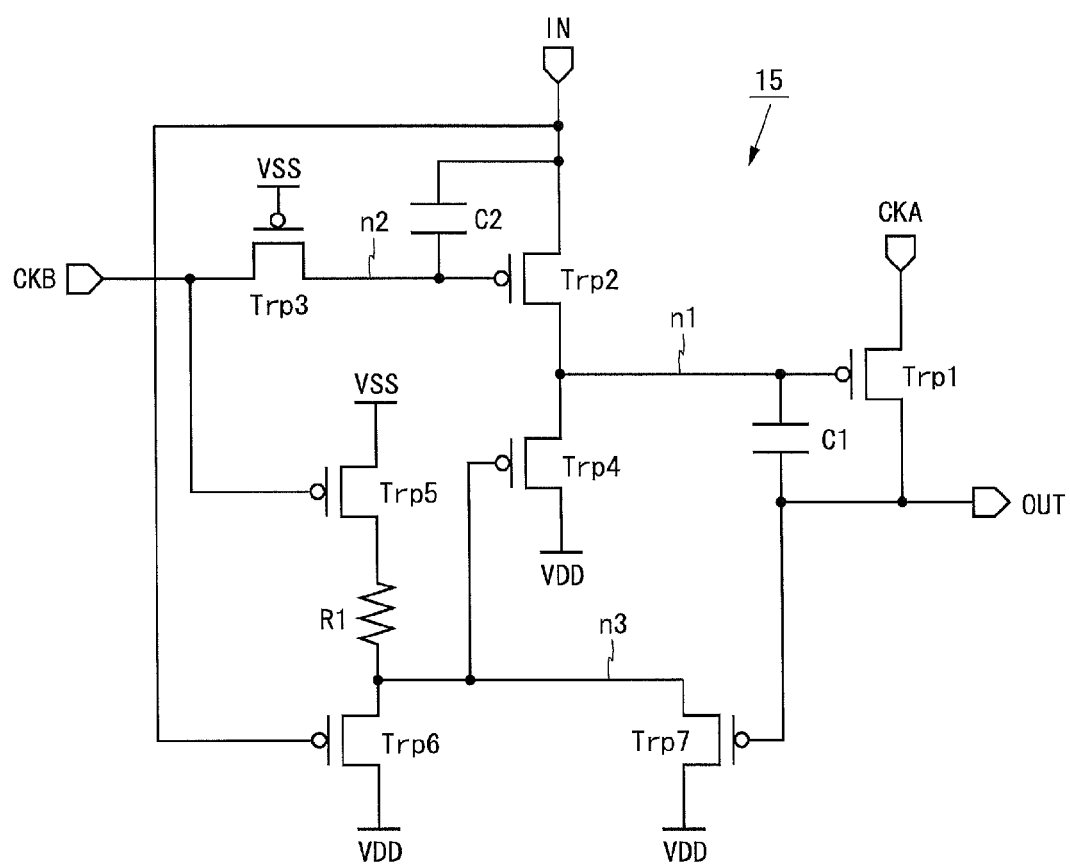
FIG. 23 is a circuit diagram of a unit circuit of a shift register according to a tenth embodiment.

A shift register according to a tenth embodiment of the present invention has the configuration shown in FIG. 2. However, the shift register according to the present embodiment includes a unit circuit 15 shown in FIG. 23 in place of the unit circuit 11. The unit circuit 15 is formed by configuring the unit circuit 13 (FIG. 7) by using P-channel transistors. The unit circuit 15 includes seven P-channel transistors Trp1 to Trp7, the capacitors C1, C2, and a resistor R1.

Figure 24:
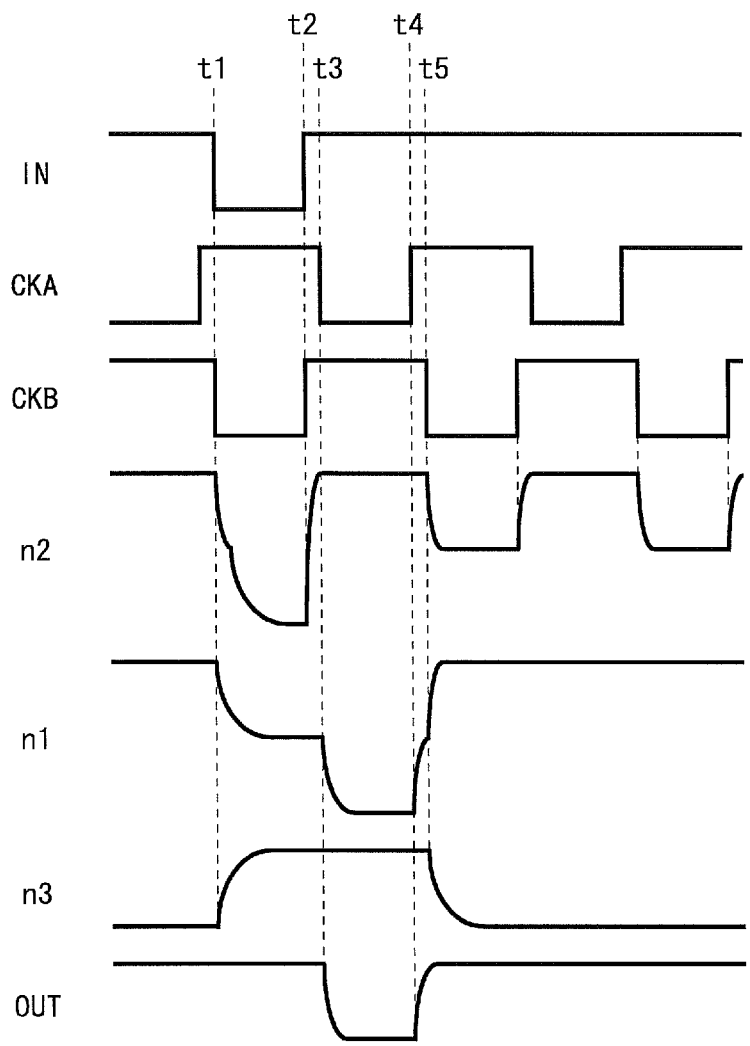
FIG. 24 is a signal waveform diagram of the shift register according to the tenth embodiment.

Generally, in order to configure, by using P-channel transistors, a circuit configured by using N-channel transistors, the N-channel transistors may be replaced with the P-channel transistors, a polarity of a power source may be switched (the high-level potential VDD and the low-level potential VSS may be exchanged), and the polarity of the input signal may be inverted (the high level and the low level may be exchanged). FIG. 24 is a signal waveform diagram of the shift register according to the present embodiment. The signal waveform diagram shown in FIG. 24 is obtained by inverting polarities of the signals and the potentials of the nodes with regard to the signal waveform diagram shown in FIG. 8.

According to the shift register of the present embodiment, concerning the shift register configured by using the P-channel transistors, it is possible to increase an operation margin with respect to fluctuation of the threshold voltage of the transistor. Although the case of forming the unit circuit 13 according to the third embodiment by using the P-channel transistors is described as an example herein, similar methods may also be applied to the unit circuits according to the first, second and fourth to ninth embodiments and unit circuits according to eleventh to twenty-sixth embodiments to be described later.

Eleventh Embodiment

Figure 25:
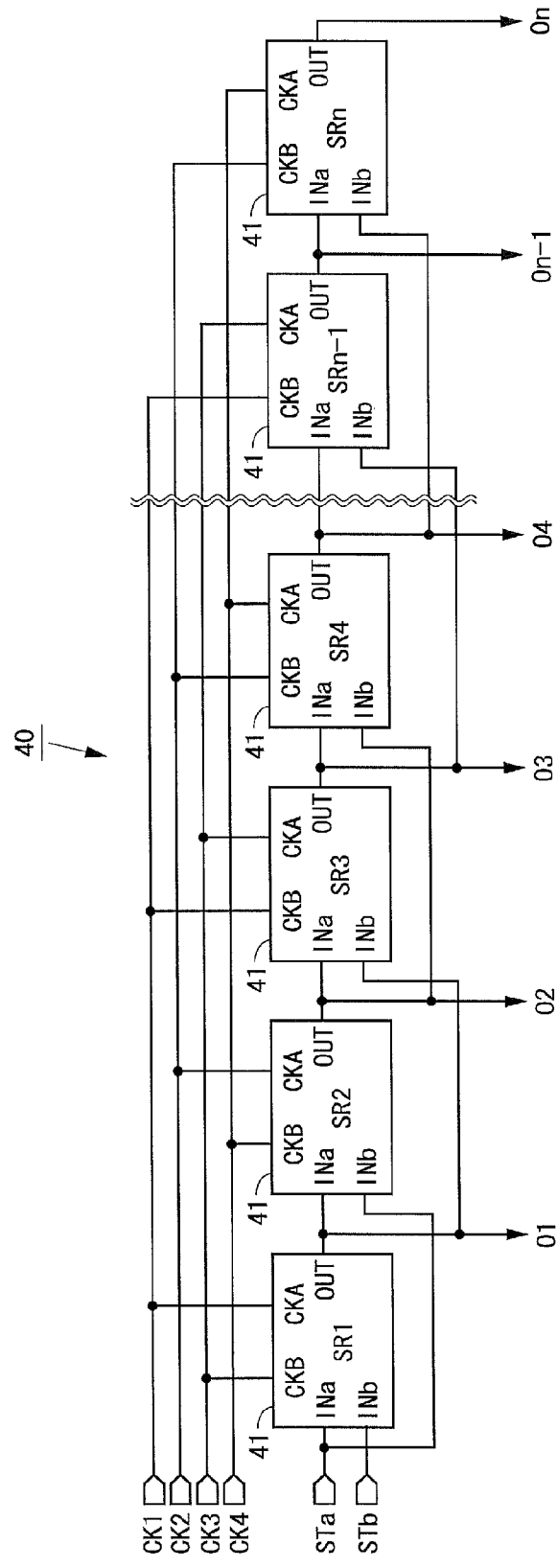
FIG. 25 is a block diagram showing a configuration of a shift register according to an eleventh embodiment.

FIG. 25 is a block diagram showing a configuration of a shift register according to an eleventh embodiment of the present invention. A shift register 40 shown in FIG. 25 is configured by connecting n unit circuits 41 in multiple stages. The unit circuit 41 has the clock terminals CKA, CKB, input terminals INa, INb, and the output terminal OUT. From the outside, the shift register 40 is supplied with start pulses STa, STb, and four-phase clock signals CK1 to CK4. The start pulse STa is provided to the input terminal INa of the unit circuit 41 in the first stage and to the input terminal INb of the unit circuit 41 in the second stage. The start pulse STb is provided to the input terminal INb of the unit circuit 41 in the first stage. The output signal OUT of the unit circuit 41 is outputted to the outside as each of the output signals O1 to On, and provided to the input terminal INa of the unit circuit 41 in the next stage and the input terminal INb of the unit circuit 41 in the second stage after the present stage.

When an integer not smaller than 1 and not larger than n/4 is k, the clock signal CK1 is provided to the clock terminal CKA of the unit circuit 41 in the (4 k−3)th stage and the clock terminal CKB of the unit circuit 41 in the (4 k−1)th stage. The clock signal CK2 is provided to the clock terminal CKA of the unit circuit 41 in the (4 k−2)th stage and the clock terminal CKB of the unit circuit 41 in the 4 k−th stage. The clock signal CK3 is provided to the clock terminal CKA of the unit circuit 41 in the (4 k−1)th stage and the clock terminal CKB of the unit circuit 41 in the (4 k−3)th stage. The clock signal CK4 is provided to the clock terminal CKA of the unit circuit 41 in the 4 k−th stage and the clock terminal CKB of the unit circuit 41 in the (4 k−2)th stage.

Figure 26:
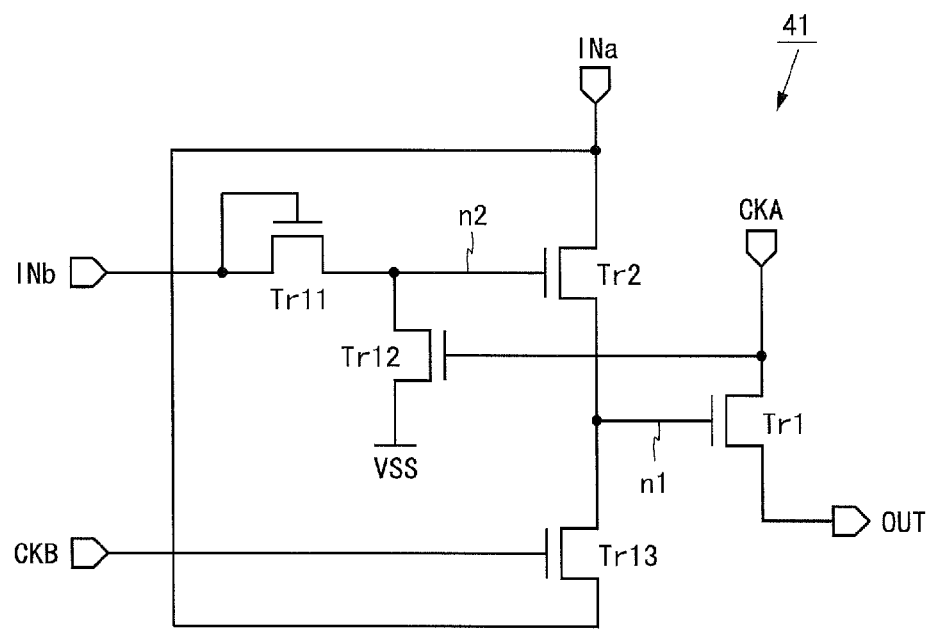
FIG. 26 is a circuit diagram of a unit circuit of the shift register according to the eleventh embodiment.

FIG. 26 is a circuit diagram of the unit circuit 41. The unit circuit 41 shown in FIG. 26 includes five N-channel transistors Tr1, Tr2 and Tr11 to Tr13. A drain terminal of the transistor Tr1 is connected to the clock terminal CKA, and a source terminal of the transistor Tr1 is connected to the output terminal OUT. A drain terminal of the transistor Tr2 is connected to the input terminal INa, and a source terminal of the transistor Tr2 is connected to a gate terminal of the transistor Tr1 and a drain terminal of the transistor Tr13. A gate terminal and a drain terminal of the transistor Tr11 are connected to the input terminal INb, and a source terminal of the transistor Tr11 is connected to a gate terminal of the transistor Tr2 and a drain terminal of the transistor Tr12. A source terminal of the transistor Tr12 is applied with the low-level potential VSS, and a gate terminal of the transistor Tr12 is connected to the clock terminal CKA. A source terminal of the transistor Tr13 is connected to the input terminal INa, and a gate terminal of the transistor Tr13 is connected to the clock terminal CKB. The transistors Tr1, Tr2 function as an output transistor and a set transistor, respectively, and the input terminal INa functions as an on-potential output unit. The transistors Tr11, Tr12 function as a set control unit.

Figure 27:
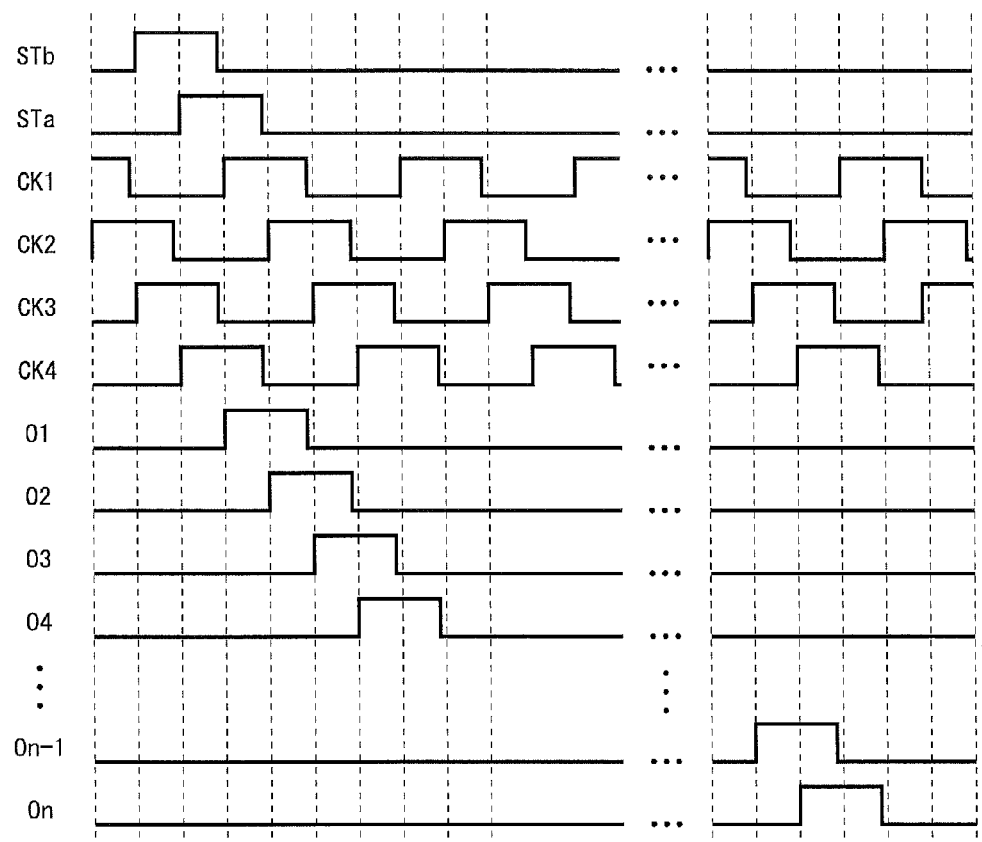
FIG. 27 is a timing chart of the shift register according to the eleventh embodiment.

FIG. 27 is a timing chart of the shift register 40. As shown in FIG. 27, the clock signal CK1 shifts to the high level or the low level in a predetermined cycle. However, the high-level period of the clock signal CK1 is shorter than the low-level period of the clock signal CK1. The clock signals CK2 to CK4 are signals respectively obtained by delaying the clock signal CK1 by a quarter cycle, a half cycle, and a three-quarter cycle. At the start of shifting, the start pulse STb shifts to the high level in the high-level period of the clock signal CK3. The start pulse STa is a signal obtained by delaying the start pulse STb by a quarter cycle of the clock signal CK1.

Figure 28:
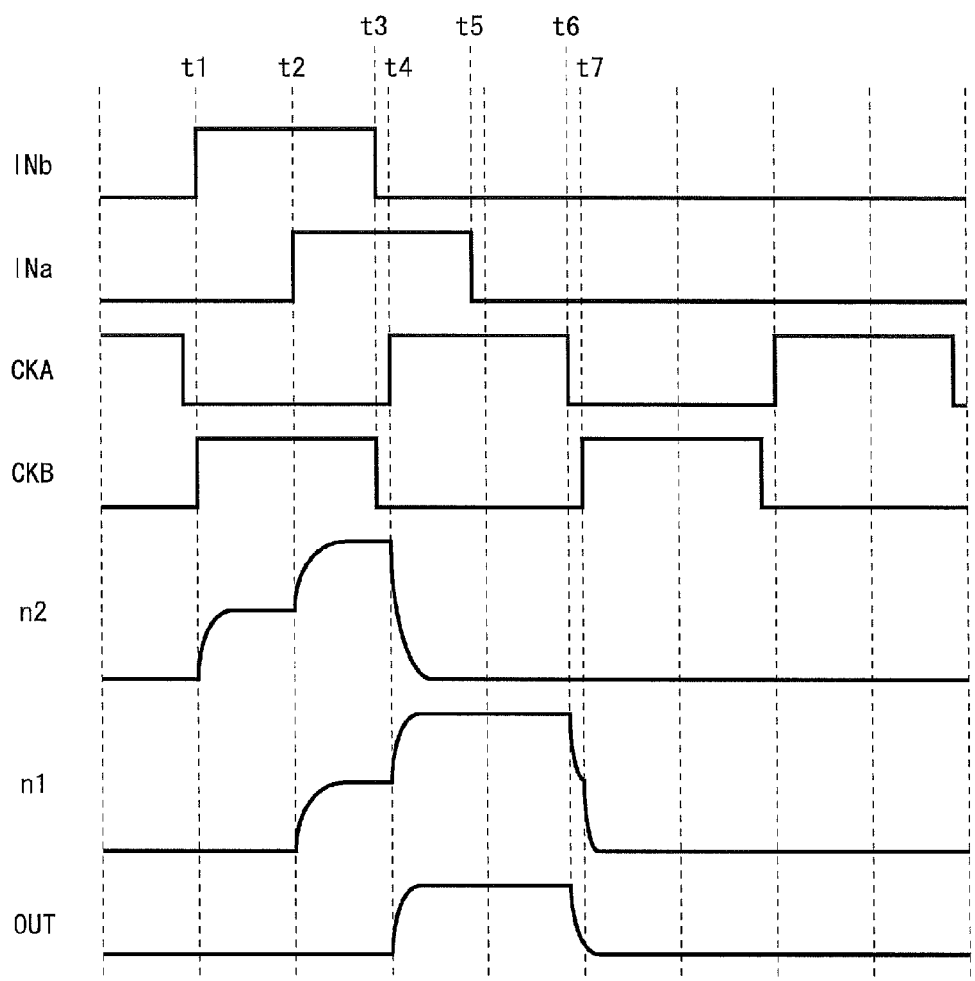
FIG. 28 is a signal waveform diagram of the shift register according to the eleventh embodiment.

FIG. 28 is a signal waveform diagram of the shift register 40. An operation of the unit circuit 41 will be described with reference to FIG. 28. Before the time t1, potentials of the nodes n1, n2 and the output signal OUT are at the low level. At the time t1, the input signal INb and the clock signal CKB change from the low level to the high level. With this change, the transistor Tr11 is turned on, a current passing through the transistor Tr11 flows from the input terminal INb toward the node n2, and the potential of the node n2 rises (charge of the node n2). When the potential of the node n2 rises to (VDD−Vth), the transistor Tr11 is turned off, and the node n2 enters the floating state after that. When the potential of the node n2 exceeds a predetermined level, the transistor Tr2 is turned on. Further, at the time t1, the transistor Tr13 is turned on. As thus described, after a lapse of certain time from the time t1, the transistors Tr2, Tr13 both enter the on-state. Since the input signal INa is at the low level at this time, the potential of the node n1 is held at the low level even after the transistors Tr2, Tr13 are turned on.

At the time t2, the input signal INa changes from the low level to the high level. At this time, with the transistors Tr2, Tr13 being in the on-state, a current passing through the transistor Tr2 and a current passing through the transistor Tr13 flow from the input terminal INa toward the node n1, and the potential of the node n1 rises (charge of the node n1). When the potential of the node n1 exceeds a predetermined level, the transistor Tr1 is turned on. Further, when the potential of the node n1 rises, the potential of the node n2 rises by being pushed up by a capacitance between the gate and the channel of the transistor Tr2 (push-up of the node n2). When the potential of the node n2 becomes (VDD+Vth) or higher, the potential of the node n1 becomes the high-level potential VDD. At the time t3, the input signal INb and the clock signal CKB change to the low level. With this change, the transistor Tr13 is turned off. Even after the transistor Tr13 is turned off, the potentials of the nodes n1, n2 are held at the high level, and the transistor Tr1 is held in the on-state.

At the time t4, the clock signal CKA changes from the low level to the high level. With this change, from the time t4 on, the high-level potential of the clock signal CKA is outputted as the output signal OUT. Further, when the potential of the output signal OUT rises, the potential of the node n1 is pushed up by a capacitance between the gate and the channel of the transistor Tr1, and rises by α (wherein α is substantially equal to the amplitude of the clock signal CKA) (push-up of the node n1). Since the potential of the node n1 becomes (VDD+Vth) or higher at this time, it is possible to output as the output signal OUT the high-level potential VDD without a threshold drop. Further, at the time t4, the transistor Tr12 is turned on, and hence the potential of the node n2 shifts to the low level (discharge of the node n2). Hence the transistor Tr2 is turned off. As thus described, after a lapse of certain time from the time t4, the transistors Tr2, Tr13 enter the off-state, and hence a current does not flow from the node n1 when the potential of the node n1 rises by being pushed up.

At the time t5, the input signal INa changes to the low level. At this time, with the transistors Tr2, Tr13 being in the off-state, the potentials of the nodes n1, n2 remain unchanged. At the time t6, the clock signal CKA changes to the low level. With this change, the output signal OUT changes to the low level, and the transistor Tr12 is turned off. Further, since the push-up of the node n1 is completed, the potential of the node n1 drops to the high-level potential VDD. At the time t7, the clock signal CKB changes to the high level. With this change, the transistor Tr13 is turned on. At this time, with the input signal INa being at the low level, a current passing through the transistor Tr13 flows from the node n1 toward the input terminal INa, and the potential of the node n1 drops to the low level (discharge of the node n1).

As shown in FIG. 27, an output signal O1 of the unit circuit 41 in the first stage shifts to the high level in the high-level period of the clock signal CK1 after the start pulse STa has shifted to the high level. An output signal O2 of the unit circuit 41 in the second stage shifts to the high level in the high-level period of the clock signal CK2 after the output signal O1 has shifted to the high level. An output signal O3 of the unit circuit 41 in the third stage shifts to the high level in the high-level period of the clock signal CK3 after the output signal O2 has shifted to the high level. An output signal O4 of the unit circuit 41 in the fourth stage shifts to the high level in the high-level period of the clock signal CK4 after the output signal O3 has shifted to the high level. Similarly, an output signal Oi of the unit circuit 41 shifts to the high level in the high-level period of any of the clock signals CK1 to CK4 after an output signal Oi–1 of the unit circuit 41 in the previous stage has shifted to the high level. Therefore, the output signals O1 to On of the shift register 40 shift to the high level in ascending order while each being delayed by a quarter cycle of the clock signal CK1.

As thus described, in the unit circuit 41, the on-potential output unit (input terminal INa) outputs the first input signal INa with respect to the unit circuit 41, and the set control unit includes the transistor Tr11 having a first conduction terminal and a control terminal which are provided with the second input signal INb with respect to the unit circuit 41 and a second conduction terminal connected to the control terminal of the set transistor Tr2.

When the potential of the second input signal INb changes to the on-potential (high-level potential), the control terminal of the set transistor Tr2 enters the floating state after the potential of the control terminal of the set transistor Tr2 reaches the predetermined level (VDD–Vth). Thereafter, when a potential of the first input signal INa changes to the on-potential and the potential of the control terminal of the output transistor Tr1 changes to the on-potential, the potential of the control terminal of the set transistor Tr2 becomes a sufficient on-potential (potential higher than the normal high-level potential), and the potential of the control terminal of the output transistor becomes the on-potential VDD without a threshold drop. Thus, according to the shift register of the present embodiment, it is possible to reduce rounding of the output signal OUT and increase the operation margin with respect to fluctuation of the threshold voltage of the transistor.

Further, after the potential of the control terminal of the set transistor Tr2 is changed to the on-potential based on the second input signal INb (the output signal OUT of the unit circuit 41 in the second stage before the present stage), the potential of the control terminal of the output transistor Tr1 is changed to the on-potential based on the first input signal INa (the output signal OUT of the unit circuit 41 in the previous stage), whereby it is possible to make the period for charging the node n2 long and more reliably set the potential of the node n2 to the high-level potential VDD, so as to increase the operation margin. Further, when the clock signal CKA shifts to the high level, the transistor Tr12 is turned on, and the potential of the node n2 shifts to the low level. As thus described, by cyclically shifting the potential of the node n2 to the low level, it is possible to prevent an erroneous operation of the shift register 40.

Twelfth Embodiment

A shift register according to a twelfth embodiment of the present invention has the configuration shown in FIG. 25. However, the shift register according to the present embodiment includes a unit circuit 42 shown in FIG. 29 in place of the unit circuit 41. The unit circuit 42 is formed by adding capacitors C1, C2 to the unit circuit 41 (FIG. 26). The capacitor C1 is provided between the gate and the source of the transistor Tr1. The capacitor C2 is provided between the gate and the drain of the transistor Tr2. It is to be noted that one of the capacitors C1, C2 may be provided.

By providing the capacitors C1, C2, a similar effect to that of the second embodiment is obtained. According to the shift register of the present embodiment, by increasing the push-up effect of the nodes n1, n2, it is possible to more reliably output the high-level potential VDD without a threshold drop as the output signal OUT, so as to further increase an operation margin with respect to fluctuation of the threshold voltage of the transistor.

Further, in the unit circuit 41, when the clock signal CKA changes from the low level to the high level, the potential of the node n1 can increase due to a parasitic capacitance between the gate and the drain of the transistor Tr1, leading to turning-on of the transistor Tr1 and an erroneous operation of the shift register. In the unit circuit 42 including the capacitor C1, a ratio of the parasitic capacitance of the transistor Tr1 to the whole capacitance accompanying the node n1 decreases, and hence the unit circuit 42 is hardly affected by noise of the clock signal CKA. Thus, according to the shift register of the present embodiment, it is possible to prevent an erroneous operation caused by the change in the clock signal and increase the operation margin.

Thirteenth Embodiment

Figure 29:
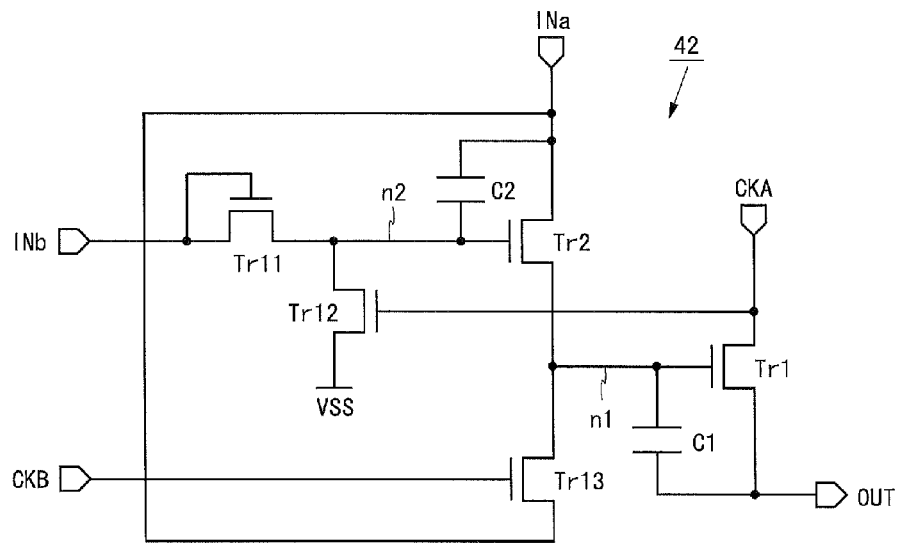
FIG. 29 is a circuit diagram of a unit circuit of a shift register according to a twelfth embodiment.
Figure 30:
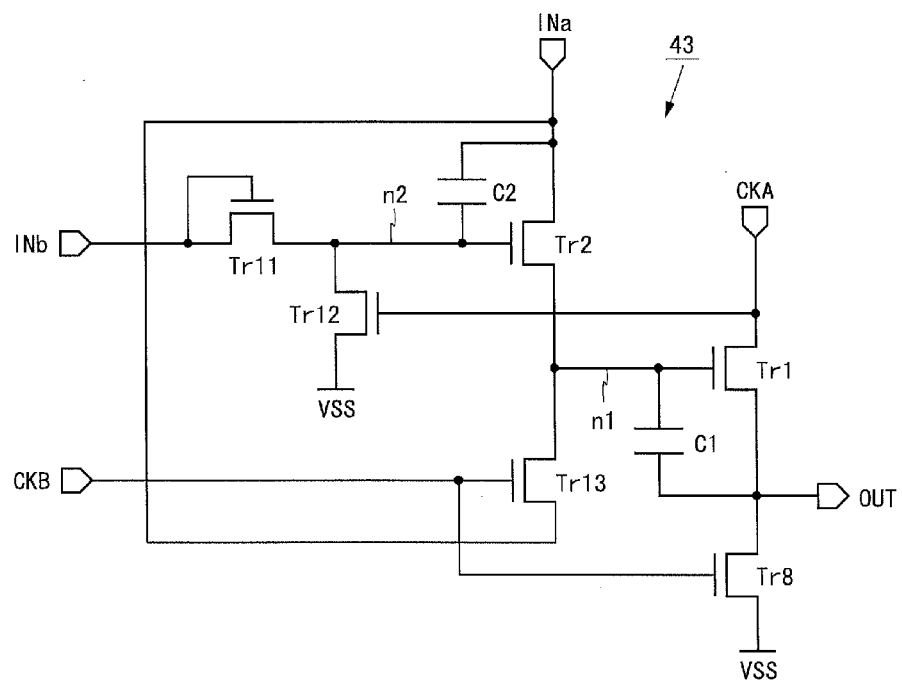
FIG. 30 is a circuit diagram of a unit circuit of a shift register according to a thirteenth embodiment.

A shift register according to a thirteenth embodiment of the present invention has the configuration shown in FIG. 25. However, the shift register according to the present embodiment includes a unit circuit 43 shown in FIG. 30 in place of the unit circuit 41. The unit circuit 43 is formed by adding an N-channel transistor Tr8 to the unit circuit 42 (FIG. 29). A drain terminal of the transistor Tr8 is connected to the output terminal OUT, a source terminal of the transistor Tr8 is applied with the low-level potential VSS, and a gate terminal of the transistor Tr8 is connected to the clock terminal CKB. The signal waveform diagram of the shift register according to the present embodiment is the same as the signal waveform diagram shown in FIG. 28.

In the unit circuit 42, when the transistor Tr1 is turned off before the output signal OUT shifts to the low level, the output signal OUT does not completely shift to the low level, but has an intermediate potential. In contrast, in the unit circuit 43, after the transistor Tr1 is turned off, it is possible to reliably shift the output signal OUT to the low level by using the transistor Tr8. Thus, according to the shift register of the present embodiment, it is possible to increase the operation margin.

Further, in the unit circuit 42, there is a possibility that the output signal OUT cannot be held at the low level due to an off-leak current of the transistor Tr1, a leak current in the circuit connected to the output terminal OUT, or the like, and the shift register operates erroneously. In contrast, in the unit circuit 43, the output signal OUT is regularly set to the low level by using the transistor Tr8. Thus, according to the shift register of the present embodiment, it is possible to prevent an erroneous operation caused by a potential rise of the output signal OUT.

Further, in the unit circuit 43, when the clock signal CKB changes to the high level at the time t7 shown in FIG. 28, the transistor Tr13 is turned on, and a current flows from the node n1 to the input terminal INa. This current flows into the output terminal OUT of the unit circuit 43 in the previous stage. At this time, in the unit circuit 43 in the previous stage, the clock signal CKB is at the high level and the transistor Tr8 is in the on-state. Therefore, the current flowing into the output terminal OUT flows to a terminal having the low-level potential VSS via the transistor Tr8. Thus, according to the shift register of the present embodiment, it is possible to prevent stagnation of electric charge in the output terminal of the unit circuit, so as to increase the operation margin.

Fourteenth Embodiment

A shift register according to a fourteenth embodiment of the present invention has the configuration shown in FIG. 25. However, the shift register according to the present embodiment includes a unit circuit 44 shown in FIG. 31 in place of the unit circuit 41. The unit circuit 44 is formed by deleting the capacitor C1 from the unit circuit 43 (FIG. 30) and adding an N-channel transistor Tr14. A drain terminal of the transistor Tr14 is connected to the gate terminal of the transistor Tr1, a source terminal of the transistor Tr14 is connected to the output terminal OUT, and a gate terminal of the transistor Tr14 is connected to the clock terminal CKA. The signal waveform diagram of the shift register according to the present embodiment is the same as the signal waveform diagram shown in FIG. 28.

In the unit circuit 41 (FIG. 26), when the clock signal CKA changes from the low level to the high level, the potential of the node n1 can increase due to a parasitic capacitance between the gate and the drain of the transistor Tr1, leading to turning-on of the transistor Tr1 and an erroneous operation of the shift register. As a method for solving this problem, there is a method of using the unit circuit 42 including the capacitor C1 (FIG. 29) as in the twelfth embodiment. However, in this method, a layout area of the circuit increases by an area corresponding to the capacitor C1. To solve this problem by another method, the unit circuit 44 includes the transistor Tr14.

In the unit circuit 44, when the clock signal CKA is at the high level, the transistor Tr14 is turned on, and the node n1 and the output terminal OUT are electrically connected via the transistor Tr14. This leads to a decrease in a ratio of the parasitic capacitance of the transistor Tr1 to the whole capacitance accompanying the node n1 and the output terminal OUT, and hence the unit circuit 44 is hardly affected by noise of the clock signal CKA. Thus, according to the shift register of the present embodiment, it is possible to prevent an erroneous operation caused by the change in the clock signal.

Further, when the output signal OUT is at the high level, the transistor Tr14 is turned off, and a current passing through the transistor Tr14 does not flow from the node n1 toward the output terminal OUT. Therefore, the potential of the node n1 rises by being pushed up, and hence it is possible to output as the output signal OUT the high-level potential VDD without a threshold drop. It should be noted that in place of the unit circuit 44, there may be used a unit circuit formed by adding the transistor Tr14 to the unit circuit 43 without deleting the capacitor C1.

Fifteenth Embodiment

Figure 32:
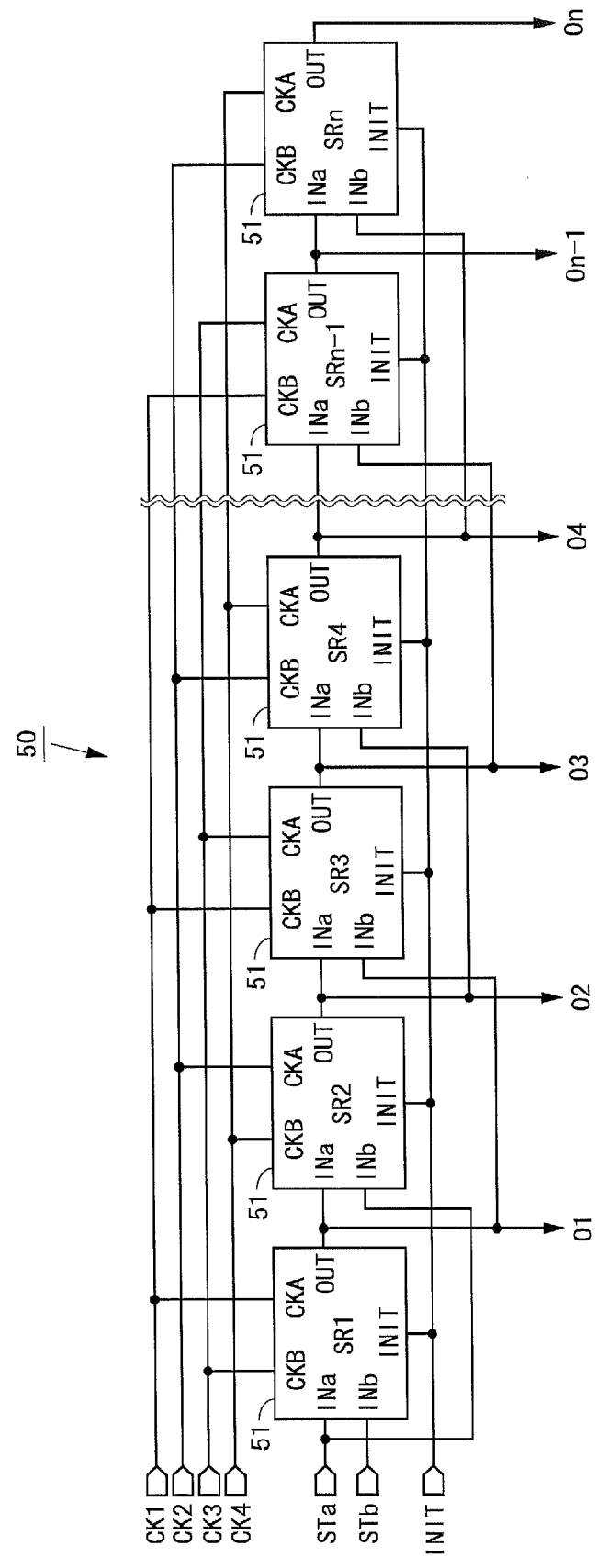
FIG. 32 is a block diagram showing a configuration of a shift register according to a fifteenth embodiment.

FIG. 32 is a block diagram showing a configuration of a shift register according to a fifteenth embodiment of the present invention. A shift register 50 shown in FIG. 32 is configured by connecting n unit circuits 51 in multiple stages. The unit circuit 51 has the clock terminals CKA, CKB, the input terminals INa, INb, the initialization terminal INIT, and the output terminal OUT. From the outside, the shift register 50 is supplied with the start pulses STa, STb, the four-phase clock signals CK1 to CK4, and the initialization signal INIT. The initialization signal INIT is provided to the initialization terminals INIT of the n unit circuits 51. Signals other than that are provided to each terminal similarly to the shift register 40 according to the eleventh embodiment (FIG. 25).

Figure 31:
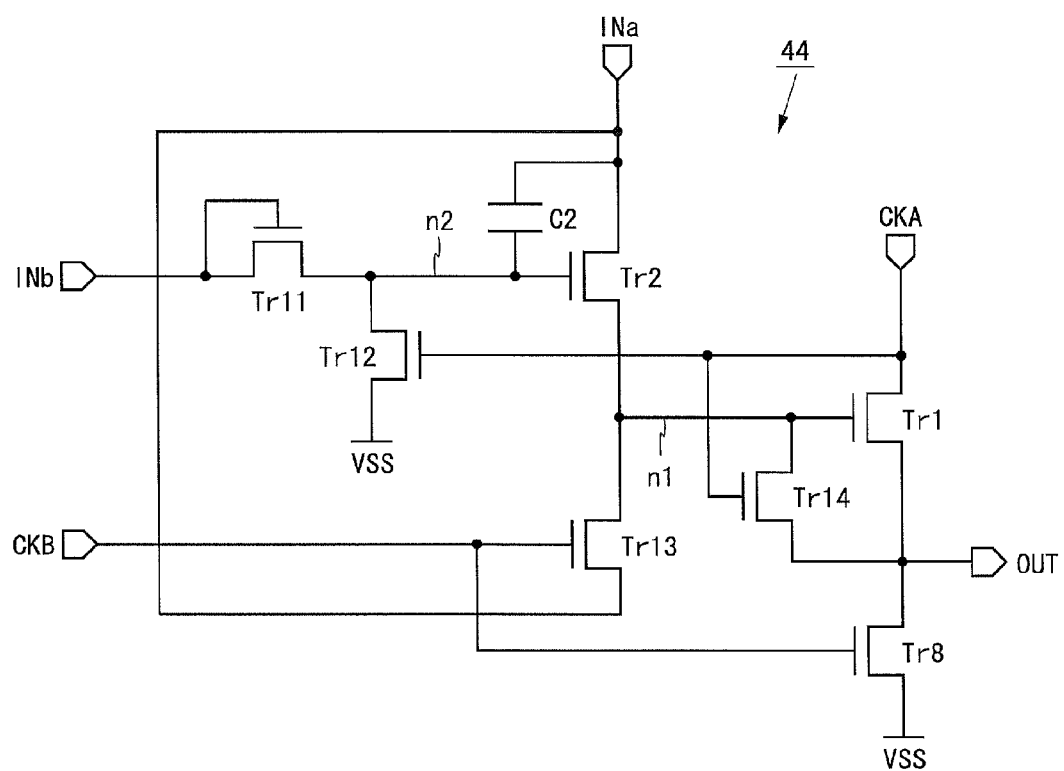
FIG. 31 is a circuit diagram of a unit circuit of a shift register according to a fourteenth embodiment.
Figure 33:
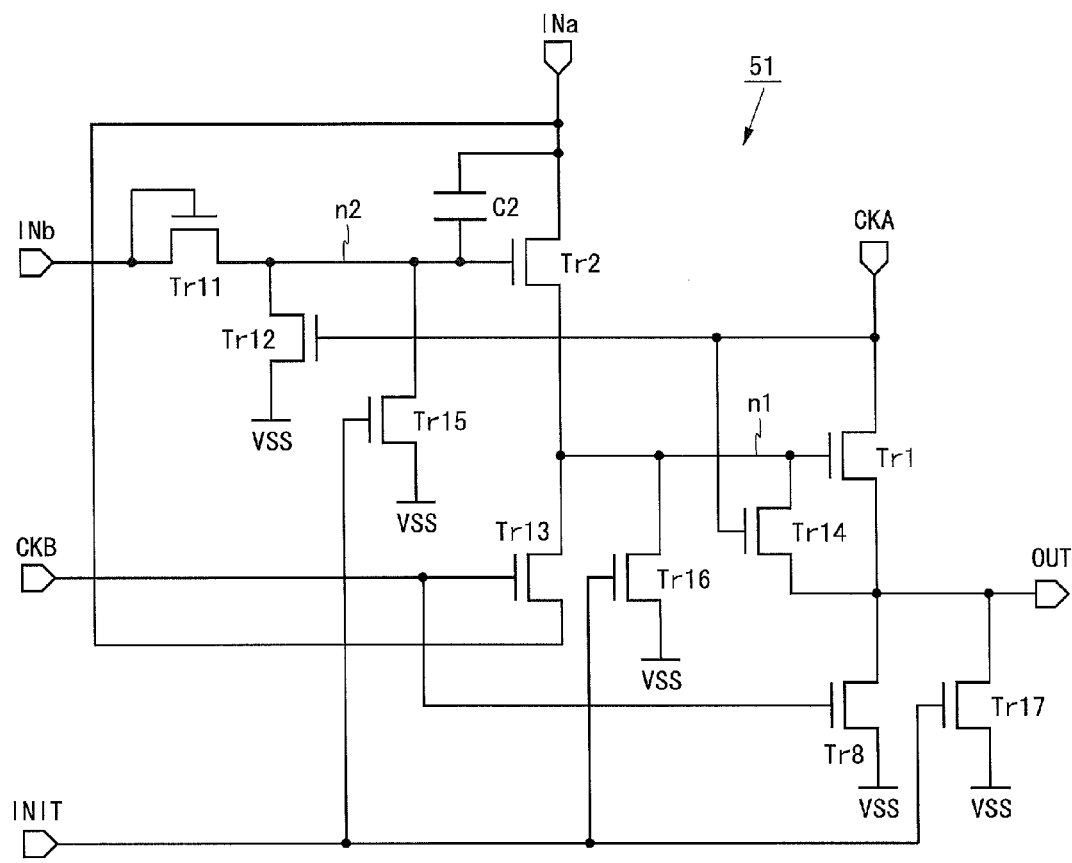
FIG. 33 is a circuit diagram of a unit circuit of the shift register according to the fifteenth embodiment.

FIG. 33 is a circuit diagram of the unit circuit 51. The unit circuit 51 is formed by adding N-channel transistors Tr15 to Tr17 to the unit circuit 44 (FIG. 31). Drain terminals of the transistors Tr15 to Tr17 are connected to the gate terminal of the transistor Tr2, the gate terminal of the transistor Tr1 and the output terminal OUT, respectively. Source terminals of the transistors Tr15 to Tr17 are applied with the low-level potential VSS, and gate terminals of the transistors Tr15 to Tr17 are connected to the initialization terminal INIT. The signal waveform diagram of the shift register according to the present embodiment at the time of operation is the same as the signal waveform diagram shown in FIG. 28.

The initialization signal INIT is controlled to the high level immediately after power on, at the time of power off, at the time when the shift register is temporarily set to an initial state, and the like, and is controlled to the low level otherwise. When the initialization signal INIT is at the low level, the transistors Tr15 to Tr17 are turned off, and the unit circuit 51 operates similarly to the unit circuit 44. When the initialization signal INIT is at the high level, the transistors Tr15 to Tr17 are turned on. By the transistor Tr15 being turned on, the potential of the node n2 is initialized to the low level. By the transistor Tr16 being turned on, the potential of the node n1 is initialized to the low level. By the transistor Tr17 being turned on, the output signal OUT is initialized to the low level. According to the shift register 50 of the present embodiment, by using the transistors Tr15 to Tr17, it is possible to initialize the potentials of the nodes n1, n2 and the output signal OUT to the low level.

Sixteenth Embodiment

A shift register according to a sixteenth embodiment of the present invention has the configuration shown in FIG. 32. However, the shift register according to the present embodiment includes a unit circuit 52 shown in FIG. 34 in place of the unit circuit 51. The unit circuit 52 is formed by changing, in the unit circuit 51 (FIG. 33), the connection destinations of the source terminals of the transistors Tr12, Tr15 to the input terminal INb, and the connection destination of the source terminal of the transistor Tr16 to the output terminal OUT. The signal waveform diagram of the shift register according to the present embodiment at the time of operation is the same as the signal waveform diagram shown in FIG. 28.

When the initialization signal INIT is at the low level, the transistors Tr15 to Tr17 are turned off, and the unit circuit 52 operates similarly to the unit circuit 44 (FIG. 31). However, when the clock signal CKA changes to the high level at the time t4 shown in FIG. 28, the transistor Tr12 is turned on. At this time, with the input signal INb being at the low level, a current passing through the transistor Tr12 flows from the node n2 toward the input terminal INb, and the potential of the node n2 drops to the low level (discharge of the node n2). Hence the transistor Tr2 is turned off.

When the initialization signal INIT is at the high level, the transistors Tr15 to Tr17 are turned on. By the transistor Tr17 being turned on, the output signal OUT is initialized to the low level. By the transistor Tr16 being turned on, the gate terminal of the transistor Tr1 is electrically connected to the output terminal OUT via the transistor Tr16. At this time, with the output signal OUT being at the low level, the potential of the node n1 is initialized to the low level. By the transistor Tr15 being turned on, the gate terminal of the transistor Tr2 is electrically connected to the input terminal INb via the transistor Tr15. At this time, in each of the unit circuits 52 in the third to n-th stages, the input signal INb (the output signal OUT of the unit circuit 52 in the second stage before the present stage) is at the low level, and hence the potential of the node n2 is initialized to the low level. Further, by controlling the start pulses STa, STb to the low level at the time of initialization, the potential of the node n2 can be initialized to the low level also for the unit circuits 52 in the first and second stages. Thus, according to the shift register of the present embodiment, it is possible to perform initialization similar to that in the fifteenth embodiment.

As described in the sixth embodiment, when a high voltage is applied between the source and the drain of the transistor, degradation or breakdown of the transistor can occur. Therefore, as measures for breakdown voltage, there has hitherto been known a method of using a plurality of transistors connected in series or a transistor with a large L-length. However, the conventional measures for breakdown voltage have a problem of increasing a layout area of the circuit.

In the unit circuit 52, the potentials of the nodes n1, n2 become (VDD−Vth+α) at the maximum by being pushed up. In the push-up period of the node n1, the potential of the output signal OUT is VDD, and hence a voltage (α−Vth) is applied between the source and the drain of the transistor Tr16. Further, in a large part of the push-up period of the node n2 (the time t2 to t3 shown in FIG. 28), the potential of the input signal INb is VDD, and hence the same voltage (α−Vth) is applied between the source and the drain of each of the transistors Tr12, Tr15. The voltage (α−Vth) is lower than a driving voltage of the transistor.

As thus described, in the unit circuit 52, a high voltage is not applied between the source and the drain of the transistor Tr16, and the time during which a high voltage is applied between the source and the drain of each of the transistors Tr12, Tr15 is short. Therefore, it is not necessary to take conventional measures for breakdown voltage on the transistors Tr12, Tr15, Tr16. Thus, according to the shift register of the present embodiment, it is possible to prevent degradation and breakdown of the transistor without increasing a layout area.

It should be noted that in the time t3 to t4 shown in FIG. 28, the potential of the node n2 becomes (VDD−Vth+α), and the clock signal CKB shifts to the low level. In this period, a high voltage (VDD−Vth+α−VSS) is applied between the source and the drain of each of the transistors Tr12 and Tr15. In order to prevent this, a duty ratio of the clock signals CK1 to CK4 may be set to 50%, and the lengths of the high-level periods of the start pulses STa, STb may be made the same as the lengths of the high-level periods of the clock signals CK1 to CK4.

Further, the source terminals of the transistors Tr12, Tr15 may be connected to another terminal (e.g., clock terminal CKB) which shifts to the low level at the time of initialization and shifts to the high level at the time of push-up of the node n2, and the source terminal of the transistor Tr16 may be connected to another terminal (e.g., clock terminal CKA) which shifts to the low level at the time of initialization and shifts to the high level at the time of push-up of the node n1. Also by using such unit circuits, a similar effect to that of the present embodiment is obtained.

Seventeenth Embodiment

Figure 34:
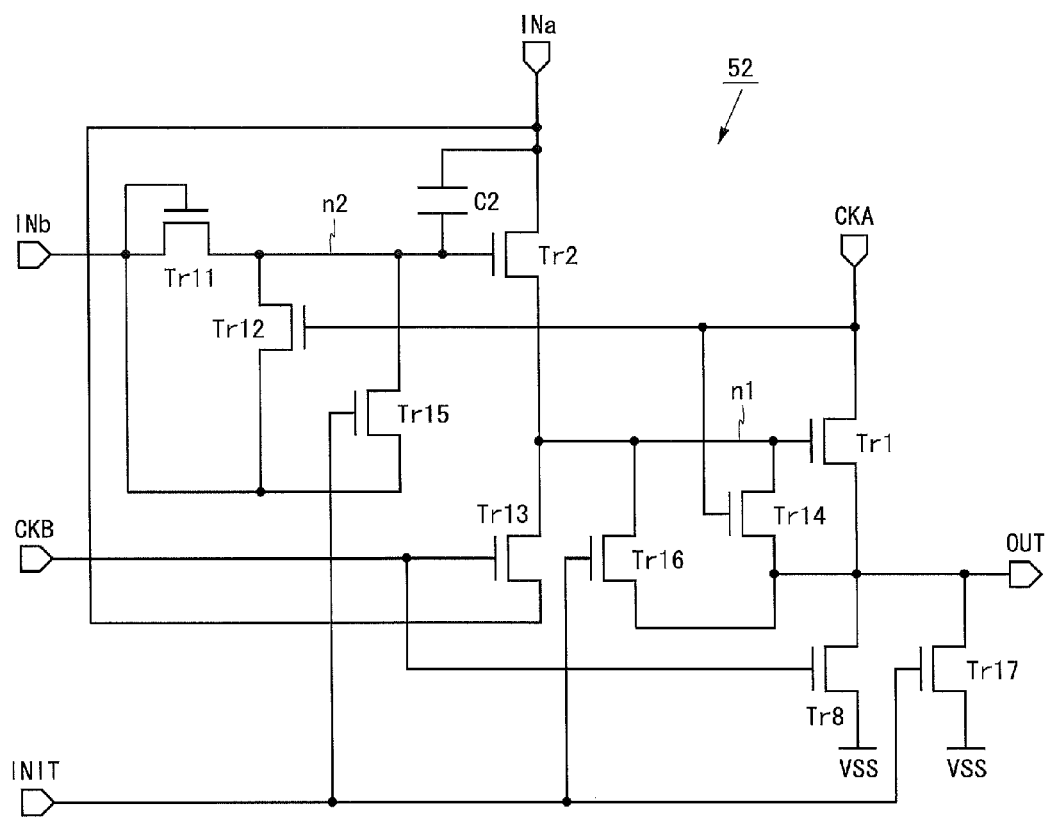
FIG. 34 is a circuit diagram of a unit circuit of a shift register according to a sixteenth embodiment.
Figure 35:
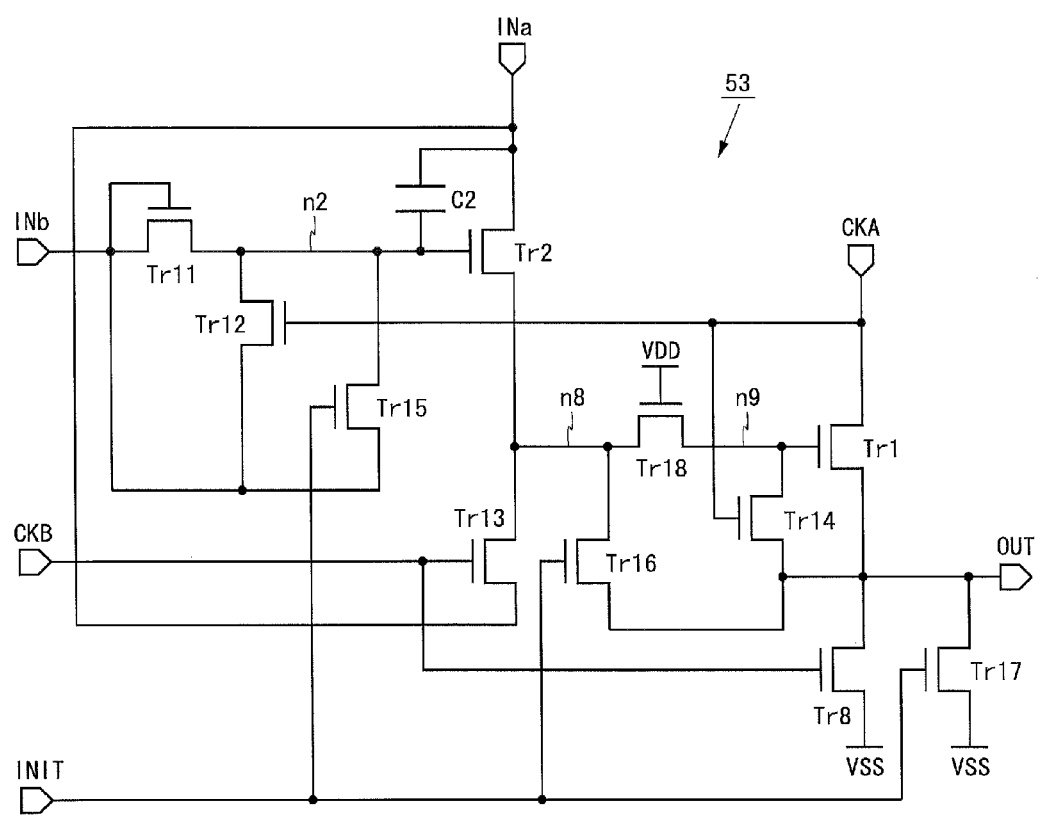
FIG. 35 is a circuit diagram of a unit circuit of a shift register according to a seventeenth embodiment.

A shift register according to a seventeenth embodiment of the present invention has the configuration shown in FIG. 32. However, the shift register according to the present embodiment includes a unit circuit 53 shown in FIG. 35 in place of the unit circuit 51. The unit circuit 53 is formed by adding an N-channel transistor Tr18 to the unit circuit 52 (FIG. 34). A drain terminal of the transistor Tr18 is connected to the source terminal of the transistor Tr2, a source terminal of the transistor Tr18 is connected to the gate terminal of the transistor Tr1, and a gate terminal of the transistor Tr18 is applied with the high-level potential VDD. The transistor Tr18 functions as a breakdown voltage transistor. Hereinafter, a node to which the drain terminal of the transistor Tr18 is connected will be referred to as n8, and a node to which the source terminal of the transistor Tr18 is connected will be referred to as n9.

Figure 36:
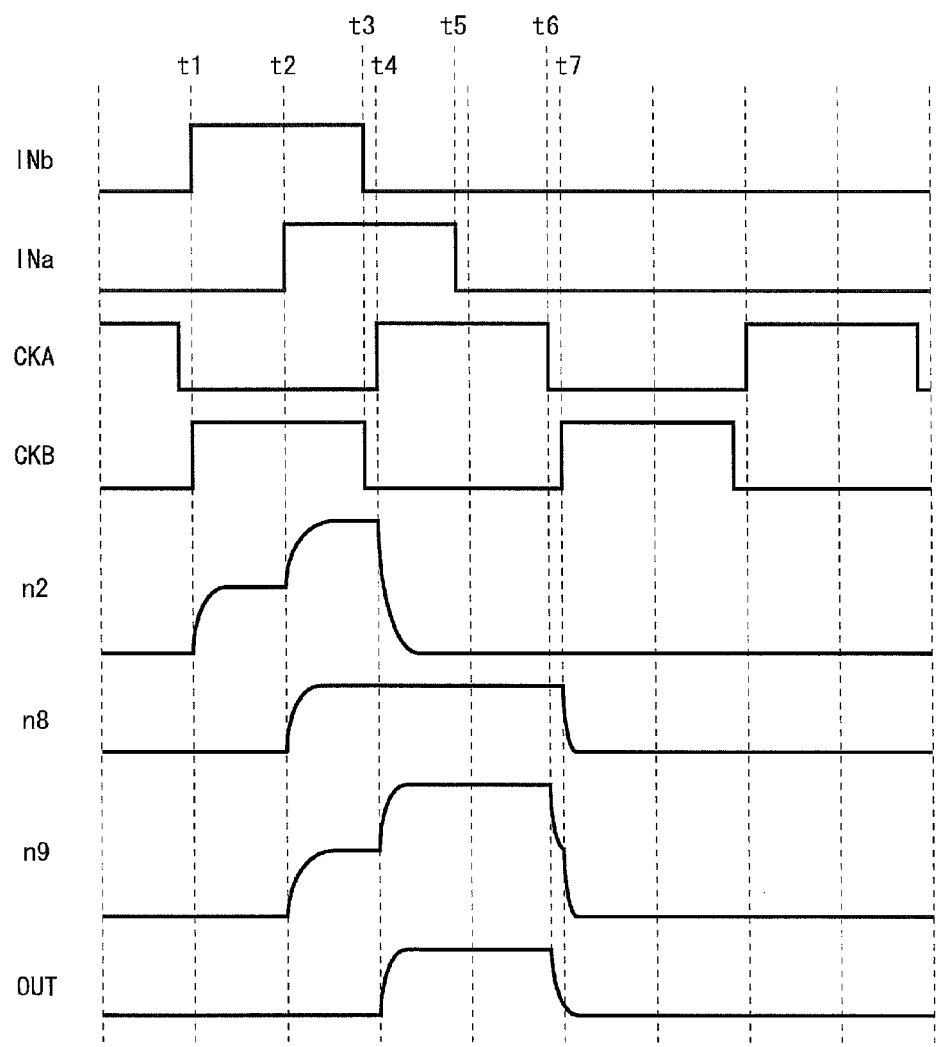
FIG. 36 is a signal waveform diagram of the shift register according to the seventeenth embodiment.

FIG. 36 is a signal waveform diagram of the shift register according to the present embodiment. The signal waveform diagram shown in FIG. 36 is obtained by deleting the change in the potential of the node n1 from the signal waveform diagram shown in FIG. 28 and adding changes in potentials of the nodes n8, n9.

Similarly to the unit circuit 22 including the transistor Tr10 (FIG. 12), in the unit circuit 53 including the transistor Tr18, a voltage lower than the driving voltage of the transistor is provided between the terminals of the transistors Tr2, Tr13, Tr16 even in a push-up period of the node n9. Thus, according to the shift register of the present embodiment, it is possible to prevent degradation and breakdown of the transistor. Further, similarly to the sixth embodiment, as compared to the case of taking measures for breakdown voltage on the unit circuit not including the transistor Tr11, it is possible to increase the operation margin while preventing degradation and breakdown of the transistor.

Eighteenth Embodiment

Figure 37:
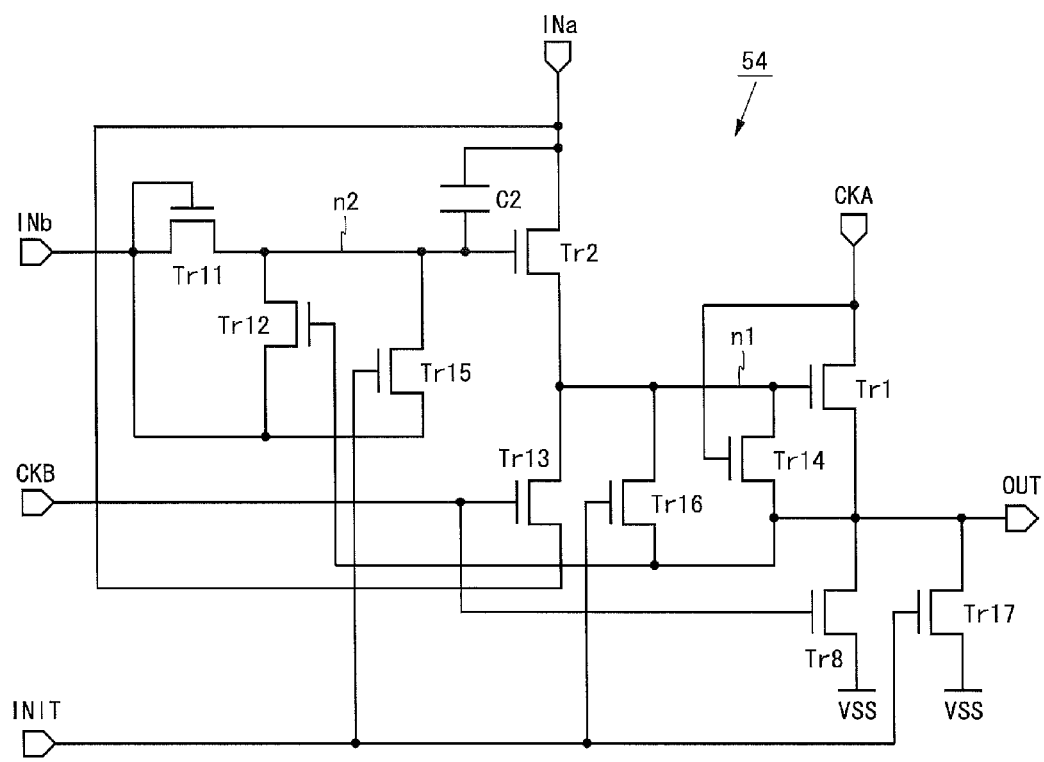
FIG. 37 is a circuit diagram of a unit circuit of a shift register according to an eighteenth embodiment.

A shift register according to an eighteenth embodiment of the present invention has the configuration shown in FIG. 32. However, the shift register according to the present embodiment includes a unit circuit 54 shown in FIG. 37 in place of the unit circuit 51. The unit circuit 54 is formed by changing, in the unit circuit 52 (FIG. 34), the connection destination of the gate terminal of the transistor Tr12 to the output terminal OUT.

The signal waveform diagram of the shift register according to the present embodiment is the same as the signal waveform diagram shown in FIG. 28. Before the time t4, the unit circuit 54 operates similarly to the unit circuit 52. When the clock signal CKA changes from the low level to the high level at the time t4, the high-level potential of the clock signal CKA is outputted as the output signal OUT from the time t4 on. Further, when the output signal OUT shifts to the high level, the transistor Tr12 is turned on. At this time, with the input signal INb being at the low level, the potential of the node n2 drops to the low level (discharge of the node n2). Hence the transistor Tr2 is turned off.

In the unit circuit 52, the gate terminal of the transistor Tr12 is connected to the clock terminal CKA. In contrast, in the unit circuit 54, the gate terminal of the transistor Tr12 is connected to the output terminal OUT. The frequency of changes in the output signal OUT is smaller than the frequency of changes in the clock signal CKA. Thus, according to the shift register of the present embodiment, it is possible to reduce charge and discharge of a parasitic capacitance accompanying the gate terminal of the transistor Tr12, so as to reduce power consumption.

Nineteenth Embodiment

Figure 38:
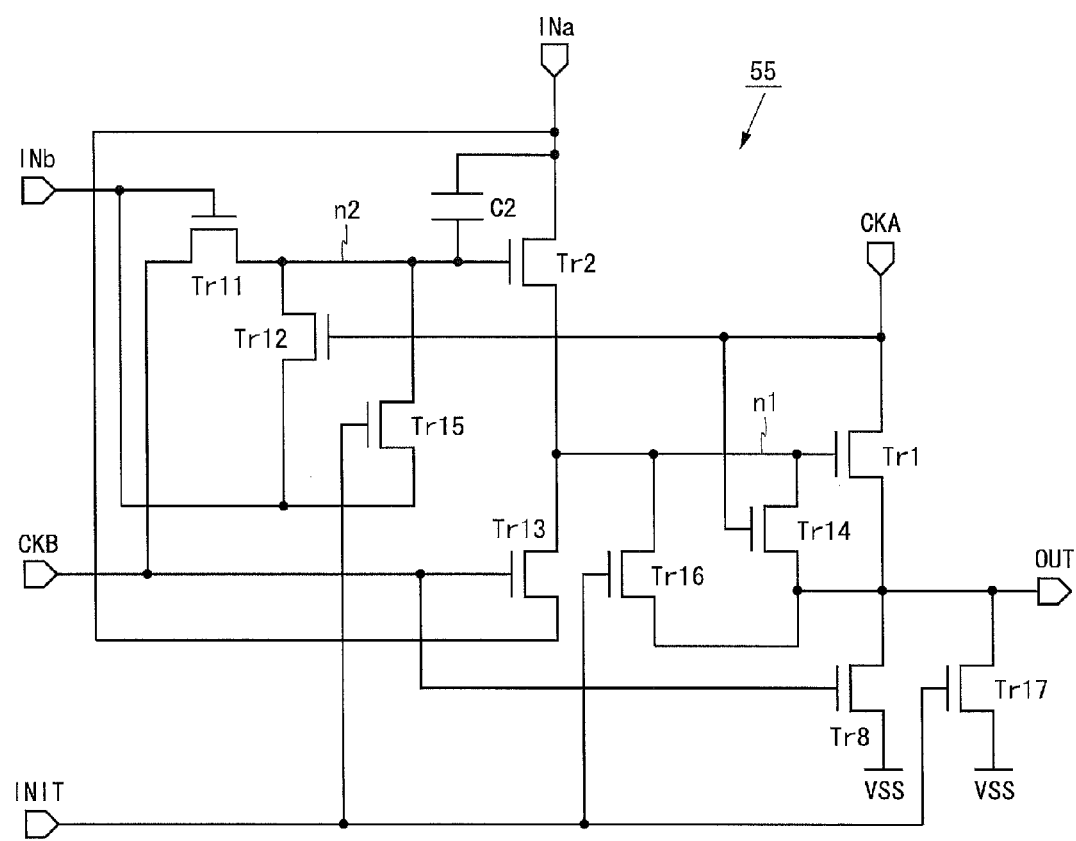
FIG. 38 is a circuit diagram of a unit circuit of a shift register according to a nineteenth embodiment.

A shift register according to a nineteenth embodiment of the present invention has the configuration shown in FIG. 32. However, the shift register according to the present embodiment includes a unit circuit 55 shown in FIG. 38 in place of the unit circuit 51. The unit circuit 55 is formed by changing, in the unit circuit 52 (FIG. 34), the connection destination of the drain terminal of the transistor Tr11 to the clock terminal CKB.

The signal waveform diagram of the shift register according to the present embodiment is the same as the signal waveform diagram shown in FIG. 28. Before the time t1, potentials of the nodes n1, n2 and the output signal OUT are at the low level. When the input signal INb and the clock signal CKB change to the high level at the time t1, the transistor Tr11 is turned on, a current passing through the transistor Tr11 flows from the clock terminal CKB toward the node n2, and the potential of the node n2 rises (charge of the node n2). After a lapse of certain time from the time t1, the transistor Tr11 is turned off, the node n2 enters the floating state, and the transistors Tr2, Tr13 enter the on-state. From the time t2 on, the unit circuit 55 operates similarly to the unit circuit 44 (FIG. 31). According to the shift register of the present embodiment, a similar effect to that of the shift register of the sixteenth embodiment is obtained.

As thus described, in the unit circuit 55, the on-potential output unit (input terminal INa) outputs the first input signal INa with respect to the unit circuit 55, and the set control unit includes the transistor Tr11 having a first conduction terminal provided with the second clock signal CKB, a second conduction terminal connected to the control terminal of the set transistor Tr2, and a control terminal provided with the second input signal INb with respect to the unit circuit 55.

When the potentials of the second input signal INb and the second clock signal CKB change to the on-potential (high-level potentials), the control terminal of the set transistor Tr2 enters the floating state after the potential of the control terminal of the set transistor Tr2 reaches the predetermined level (VDD−Vth). Thereafter, when the potential of the first input signal INa changes to the on-potential and the potential of the control terminal of the output transistor Tr1 changes to the on-potential, the potential of the control terminal of the set transistor Tr2 becomes a sufficient on-potential (potential higher than the normal high-level potential), and the potential of the control terminal of the output transistor Tr1 becomes the on-potential VDD without a threshold drop. Thus, according to the shift register of the present embodiment, it is possible to reduce rounding of the output signal OUT and increase the operation margin with respect to fluctuation of the threshold voltage of the transistor. Further, after the potential of the control terminal of the set transistor Tr2 is changed to the on-potential based on the second input signal INb and the second clock signal CKB, the potential of the control terminal of the output transistor Tr1 is changed to the on-potential based on the first input signal INa, and hence it is possible to increase the operation margin.

Twentieth Embodiment

Figure 39:
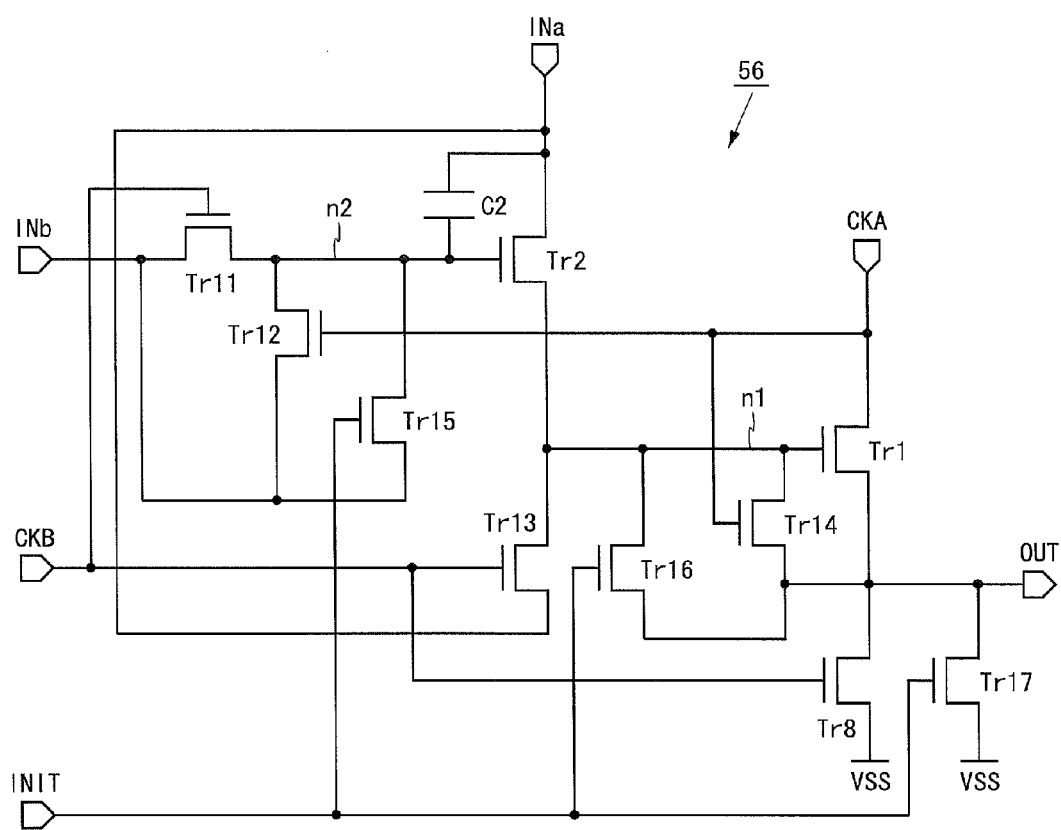
FIG. 39 is a circuit diagram of a unit circuit of a shift register according to a twentieth embodiment.

A shift register according to a twentieth embodiment of the present invention has the configuration shown in FIG. 32. However, the shift register according to the present embodiment includes a unit circuit 56 shown in FIG. 39 in place of the unit circuit 51. The unit circuit 56 is formed by changing, in the unit circuit 52 (FIG. 34), the connection destination of the gate terminal of the transistor Tr11 to the clock terminal CKB.

The signal waveform diagram of the shift register according to the present embodiment is the same as the signal waveform diagram shown in FIG. 28. Before the time t1, the potential of the node n2 is at the low level. When the input signal INb and the clock signal CKB change to the high level at the time t1, the transistor Tr11 is turned on, a current passing through the transistor Tr11 flows from the input terminal INb toward the node n2, and the potential of the node n2 rises (charge of the node n2). After a lapse of certain time from the time t1, the transistor Tr11 is turned off, the node n2 enters the floating state, and the transistors Tr2, Tr13 enter the on-state. From the time t2 on, the unit circuit 56 operates similarly to the unit circuit 44 (FIG. 31). However, when the clock signal CKB is at the high level, the transistor Tr11 is turned on. Even when the transistor Tr11 is turned on, the potential of the node n2 is held at the low level while the input signal INb is at the low level. According to the shift register of the present embodiment, a similar effect to that of the shift register of the sixteenth embodiment is obtained.

As thus described, in the unit circuit 56, the on-potential output unit (input terminal INa) outputs the first input signal INa with respect to the unit circuit 56, and the set control unit includes the transistor Tr11 having a first conduction terminal provided with the second input signal INb with respect to the unit circuit 56, a second conduction terminal connected to the control terminal of the set transistor Tr2, and a control terminal provided with the second clock signal CKB. According to the shift register of the present embodiment, similarly to the nineteenth embodiment, it is possible to reduce rounding of the output signal OUT and increase the operation margin with respect to fluctuation of the threshold voltage of the transistor. Further, after the potential of the control terminal of the set transistor Tr2 is changed to the on-potential based on the second input signal INb and the second clock signal CKB, the potential of the control terminal of the output transistor Tr1 is changed to the on-potential based on the first input signal INa, and hence it is possible to increase the operation margin.

Twenty-First Embodiment

A shift register according to a twenty-first embodiment of the present invention has the configuration shown in FIG.

Figure 40:
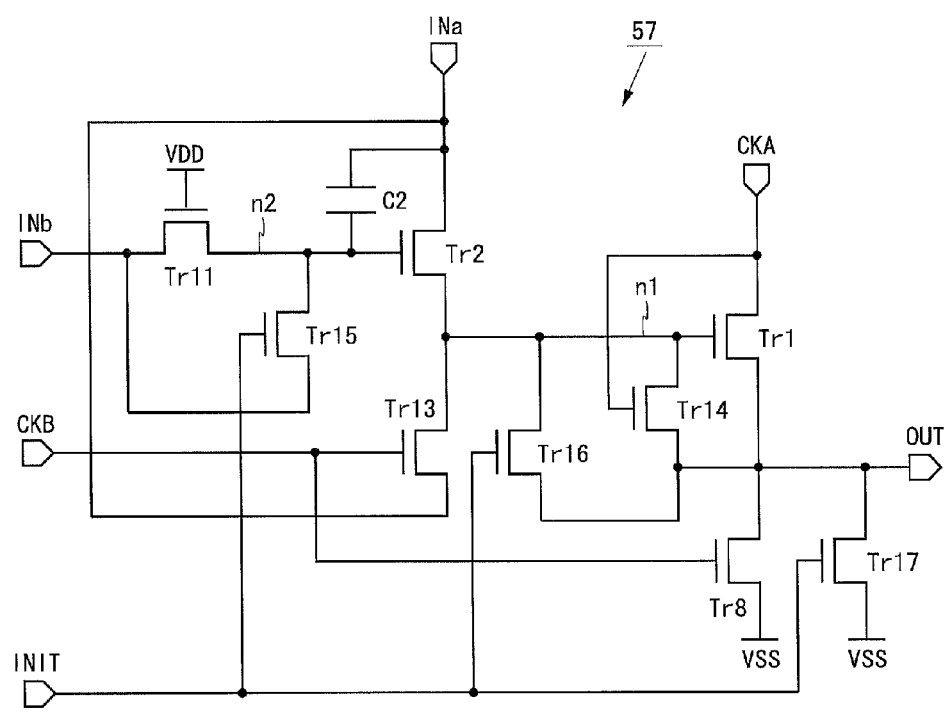
FIG. 40 is a circuit diagram of a unit circuit of a shift register according to a twenty-first embodiment.

32. However, the shift register according to the present embodiment includes a unit circuit 57 shown in FIG. 40 in place of the unit circuit 51. The unit circuit 57 is formed by deleting the transistor Tr12 from the unit circuit 52 (FIG. 34), and applying the high-level potential VDD to the gate terminal of the transistor Tr11. The transistors Tr1, Tr2, Tr11 function as an output transistor, a set transistor and a set control unit, respectively, and the input terminal INa functions as an on-potential output unit.

Figure 41:
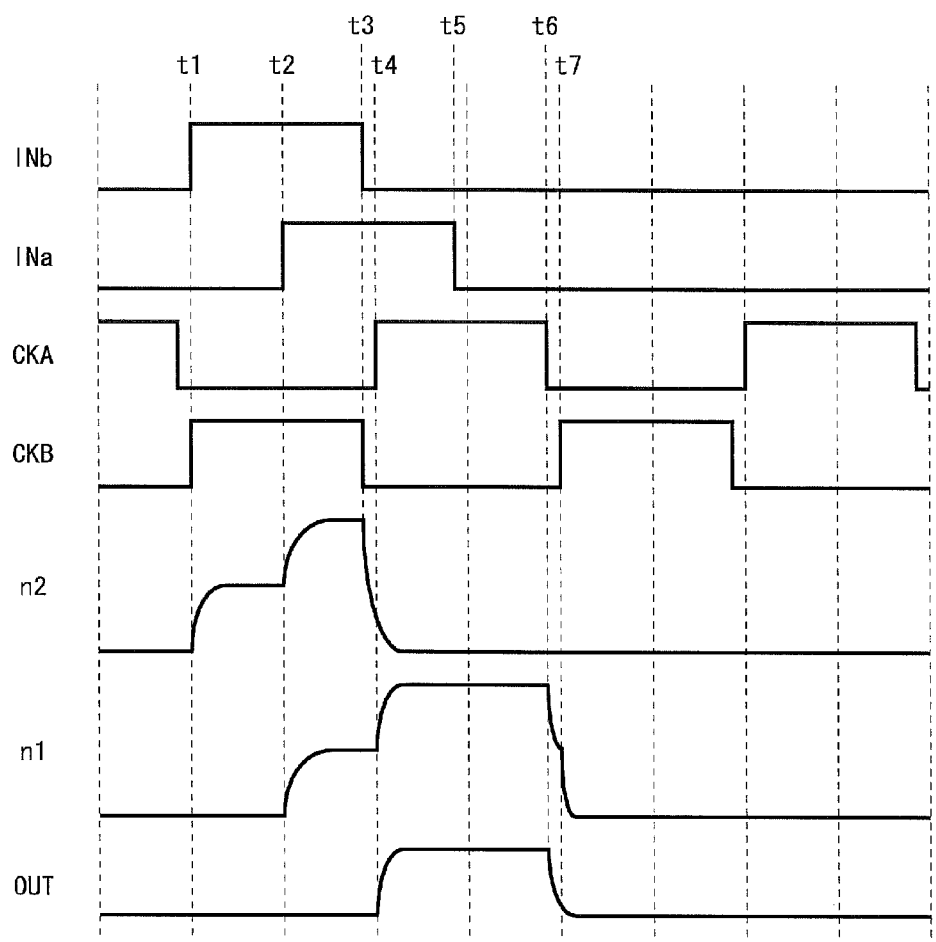
FIG. 41 is a signal waveform diagram of the shift register according to the twenty-first embodiment.

FIG. 41 is a signal waveform diagram of the shift register according to the present embodiment. The signal waveform diagram shown in FIG. 41 is the same as the signal waveform diagram shown in FIG. 28 except for the change in the potential of the node n2. Before the time t1, potentials of the nodes n1, n2 and the output signal OUT are at the low level. When the input signal INb changes to the high level at the time t1, the transistor Tr11 is turned on, a current passing through the transistor Tr11 flows from the input terminal INb toward the node n2, and the potential of the node n2 rises (charge of the node n2). After a lapse of certain time from the time t1, the transistor Tr11 is turned off, the node n2 enters the floating state, and the transistors Tr2, Tr13 enter the on-state.

When the input signal INa changes to the high level at the time t2, the node n1 is charged and the node n2 is pushed up. When the clock signal CKB changes to the low level at the time t3, the transistor Tr13 is turned off. Further, when the input signal INb changes to the low level at the time t3, the transistor Tr11 is turned on, a current passing through the transistor Tr11 flows from the node n2 toward the input terminal INb, and the potential of the node n2 drops to the low level (discharge of the node n2). From the time t4 on, the unit circuit 57 operates similarly to the unit circuit 44 (FIG. 31). According to the shift register of the present embodiment, a similar effect to that of the shift register of the sixteenth embodiment is obtained.

As thus described, in the unit circuit 57, the on-potential output unit (input terminal INa) outputs the first input signal INa with respect to the unit circuit 57, and the set control unit includes the transistor Tr11 having a first conduction terminal provided with the second input signal INb with respect to the unit circuit 57, a second conduction terminal connected to the control terminal of the set transistor Tr2, and a control terminal fixedly applied with the on-potential VDD. According to the shift register of the present embodiment, similarly to the eleventh embodiment, it is possible to reduce rounding of the output signal OUT and increase the operation margin with respect to fluctuation of the threshold voltage of the transistor. Further, after the potential of the control terminal of the set transistor Tr2 is changed to the on-potential based on the second input signal INb, the potential of the control terminal of the output transistor Tr1 is changed to the on-potential based on the first input signal INa, and hence it is possible to increase the operation margin.

Twenty-Second Embodiment

Figure 42:
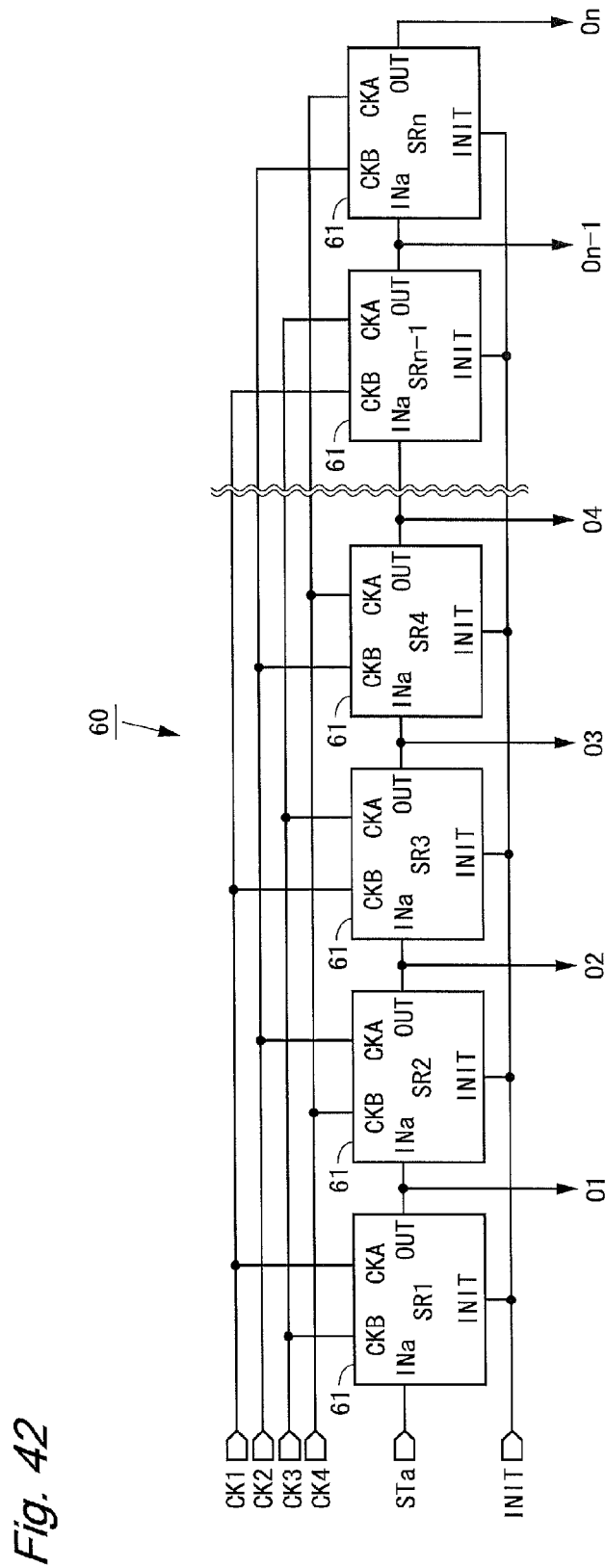
FIG. 42 is a block diagram showing a configuration of a shift register according to a twenty-second embodiment.

FIG. 42 is a block diagram showing a configuration of a shift register according to a twenty-second embodiment of the present invention. A shift register 60 shown in FIG. 42 is configured by connecting n unit circuits 61 in multiple stages. The unit circuit 61 has the clock terminals CKA, CKB, the input terminal INa, the initialization terminal INIT, and the output terminal OUT. From the outside, the shift register 60 is supplied with the start pulse STa, the four-phase clock signals CK1 to CK4, and the initialization signal INIT. The clock signals CK1 to CK4 are provided to each terminal similarly to the shift register 40 (FIG. 25) according to the eleventh embodiment. The initialization signal INIT is provided to the initialization terminals INIT of the n unit circuits 61. The start pulse STa is provided to the input terminal INa of the unit circuit 61 in the first stage. The output signal OUT of the unit circuit 61 is outputted to the outside as each of the output signals O1 to On, and provided to the input terminal INa of the unit circuit 61 in the next stage.

Figure 43:
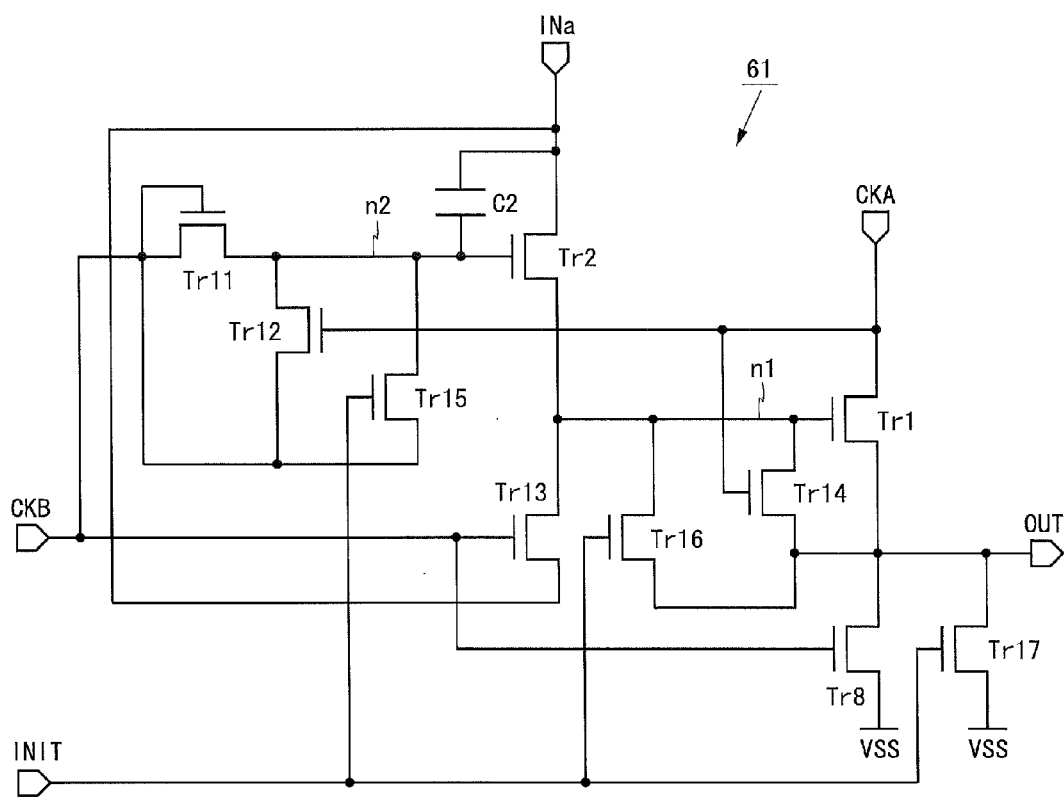
FIG. 43 is a circuit diagram of a unit circuit of the shift register according to the twenty-second embodiment.

FIG. 43 is a circuit diagram of the unit circuit 61. The unit circuit 61 is formed by changing, in the unit circuit 52 (FIG. 34), the connection destinations of the gate terminal and the drain terminal of the transistor Tr11 and the source terminals of the transistors Tr12, Tr15, to the clock terminal CKB.

Figure 44:
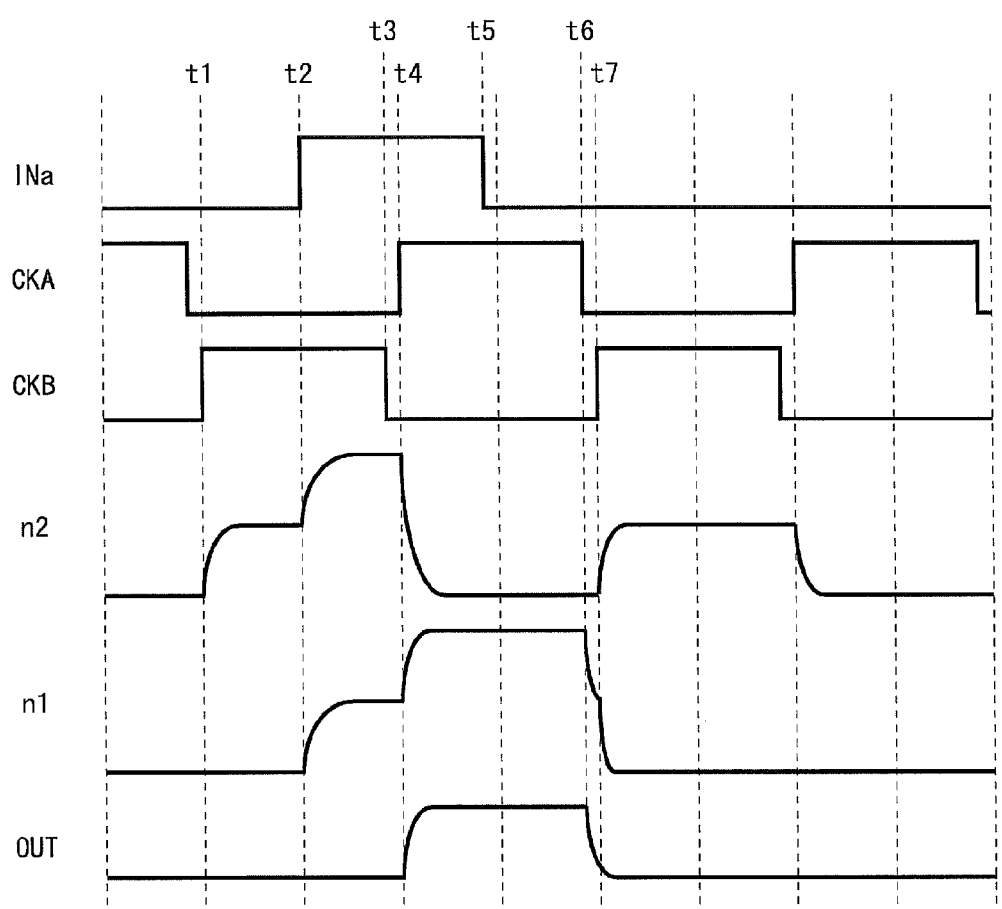
FIG. 44 is a signal waveform diagram of the shift register according to the twenty-second embodiment.

FIG. 44 is a signal waveform diagram of the shift register 60. The signal waveform diagram shown in FIG. 44 is the same as the signal waveform diagram shown in FIG. 28 except that the change in the potential of the input signal INb is deleted and that the potential of the node n2 cyclically shifts to a predetermined level (VDD−Vth) from the time t7 on. Before the time t1, potentials of the nodes n1, n2 and the output signal OUT are at the low level. When the clock signal CKB changes to the high level at the time t1, the transistor Tr11 is turned on, a current passing through the transistor Tr11 flows from the clock terminal CKB toward the node n2, and the potential of the node n2 rises (charge of the node n2). After a lapse of certain time from the time t1, the transistors Tr2, Tr13 both enter the on-state.

When the input signal INa changes to the high level at the time t2, the node n1 is charged and the node n2 is pushed up. When the clock signal CKB changes to the low level at the time t3, the transistor Tr13 is turned off. Even after the transistor Tr13 is turned off, the potentials of the nodes n1, n2 remain unchanged, and the transistor Tr1 is held in the on-state. In time t3 to t7, the unit circuit 61 operates similarly to the unit circuit 44 (FIG. 31).

When the clock signal CKB changes to the high level at the time t7, the transistor Tr13 is turned on, and the discharge of the node n1 is performed. Further, at the time t7, the transistor Tr11 is turned on. Therefore, a current passing through the transistor Tr11 flows from the clock terminal CKB toward the node n2, and the potential of the node n2 rises. From the time t7 on, the potential of the node n2 changes to (VDD−Vth) when the clock signal CKB changes to the high level, and the potential of the node n2 changes to the low level when the clock signal CKA changes to the high level.

The shift register 60 is not required to be supplied with the start pulse STb, and the unit circuit 61 is not required to be provided with the output signals OUT of the unit circuit 61 in the second stage before the present stage. Thus, according to the shift register 60 of the present embodiment, it is possible to reduce wiring between the unit circuits, so as to reduce a layout area of the circuits.

As thus described, in the unit circuit 61, the on-potential output unit (input terminal INa) outputs the input signal INa with respect to the unit circuit 61, and the set control unit includes the transistor Tr11 having a first conduction terminal and a control terminal which are provided with the second clock signal CKB and a second conduction terminal connected to the control terminal of the set transistor Tr2. When the potential of the second clock signal CKB changes to the on-potential (high-level potential), the control terminal of the set transistor Tr2 enters the floating state after the potential of the control terminal of the set transistor Tr2 reaches the predetermined level (VDD−Vth). Thereafter, when the potential of the input signal INa changes to the on-potential and the potential of the control terminal of the output transistor Tr1 changes to the on-potential, the potential of the control terminal of the set transistor Tr2 becomes a sufficient on-potential (potential higher than the normal high-level potential), and the potential of the control terminal of the output transistor Tr1 becomes the on-potential VDD without a threshold drop. Thus, according to the shift register of the present embodiment, it is possible to reduce rounding of the output signal OUT and increase the operation margin with respect to fluctuation of the threshold voltage of the transistor. Further, after the potential of the control terminal of the set transistor Tr2 is changed to the on-potential based on the second clock signal CKB, the potential of the control terminal of the output transistor Tr1 is changed to the on-potential based on the input signal INa, and hence it is possible to increase the operation margin.

Twenty-Third Embodiment

Figure 45:
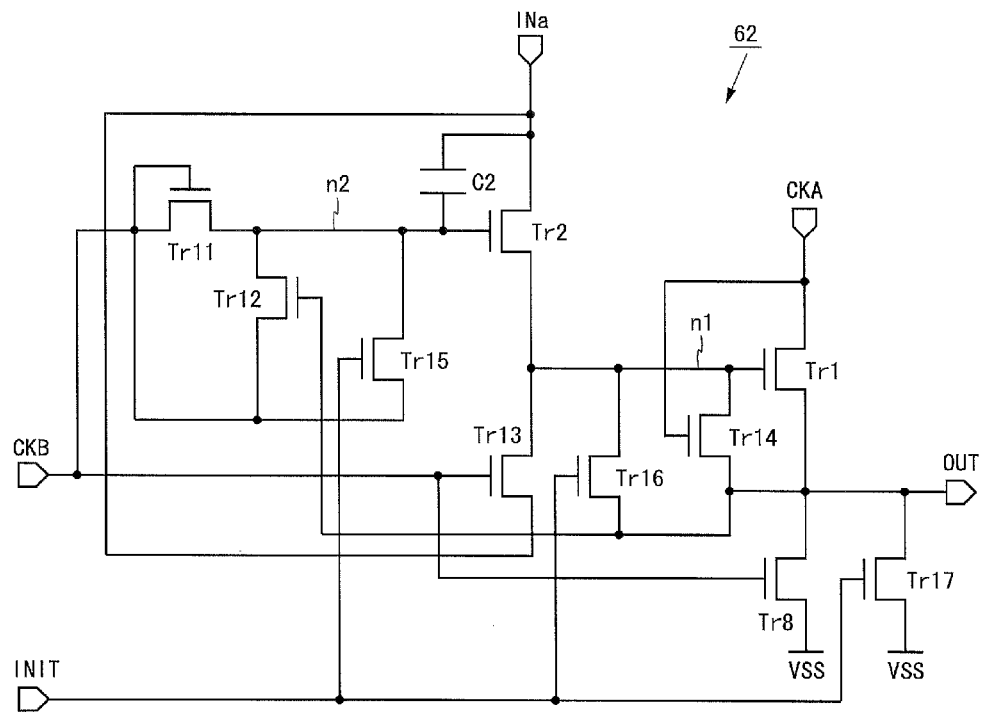
FIG. 45 is a circuit diagram of a unit circuit of a shift register according to a twenty-third embodiment.

A shift register according to a twenty-third embodiment of the present invention has the configuration shown in FIG. 42. However, the shift register according to the present embodiment includes a unit circuit 62 shown in FIG. 45 in place of the unit circuit 61. The unit circuit 62 is formed by changing, in the unit circuit 61 (FIG. 43), the connection destination of the gate terminal of the transistor Tr12 to the output terminal OUT.

Figure 46:
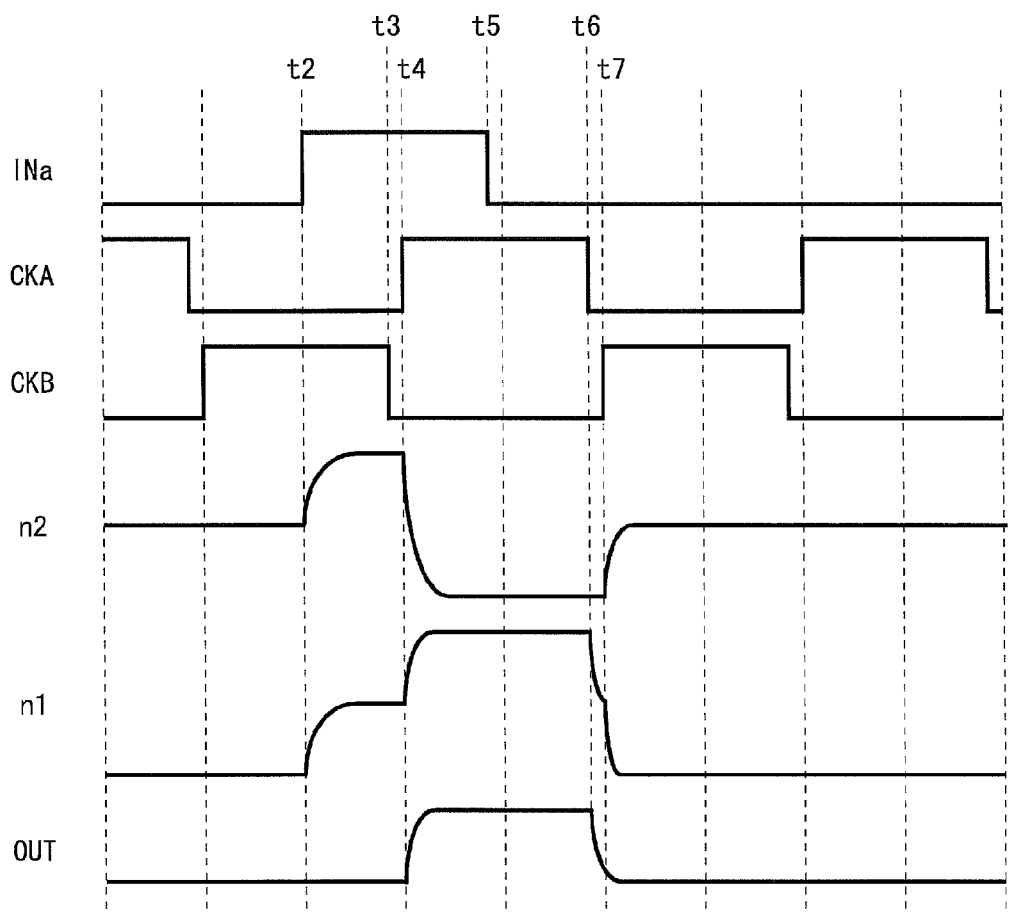
FIG. 46 is a signal waveform diagram of the shift register according to the twenty-third embodiment.

FIG. 46 is a signal waveform diagram of the shift register according to the present embodiment. The signal waveform diagram shown in FIG. 46 is the same as the signal waveform diagram shown in FIG. 44 except for the change in the potential of the node n2. Before the time t2, the potential of the node n1 and the output signal OUT are at the low level, the potential of the node n2 is (VDD−Vth), the node n2 is in the floating state, and the transistor Tr2 is in the on-state.

When the input signal INa changes to the high level at the time t2, the node n1 is charged and the node n2 is pushed up. When the clock signal CKB changes to the low level at the time t3, the transistor Tr13 is turned off. Even after the transistor Tr13 is turned off, the potentials of the nodes n1, n2 remain unchanged, and the transistors Tr1, Tr2 are held in the on-state. When the clock signal CKA changes from the low level to the high level at the time t4, the node n1 is pushed up, and the high-level potential VDD without a threshold drop is outputted as the output signal OUT. Further, when the output signal OUT shifts to the high level, the transistor Tr12 is turned on. At this time, with the clock signal CKB being at the low level, the potential of the node n2 drops to the low level (discharge of the node n2). Hence the transistor Tr2 is turned off.

At the time t5, the input signal INa changes to the low level. At this time, with the transistors Tr2, Tr13 being in the off-state, the potentials of the nodes n1, n2 remain unchanged. When the clock signal CKA changes to the low level at the time t6, the output signal OUT changes to the low level, and the transistor Tr12 is turned off. Further, since the push-up of the node n1 is completed, the potential of the node n1 drops to the high-level potential VDD. When the clock signal CKB changes to the high level at the time t7, the discharge of the node n1 is performed. Further, at the time t7, the transistor Tr11 is turned on, and hence the potential of the node n2 rises to become (VDD−Vth) (charge of the node n2).

According to the shift register of the present embodiment, similarly to the eighteenth embodiment, it is possible to reduce charge and discharge of a parasitic capacitance accompanying the gate terminal of the transistor Tr12, so as to reduce power consumption. Further, the discharge of the node n2 is performed only when the output signal OUT is at the high level. Thus, according to the shift register of the present embodiment, it is possible to reduce charge and discharge of a parasitic capacitance accompanying the node n2, so as to reduce power consumption.

Twenty-Fourth Embodiment

Figure 47:
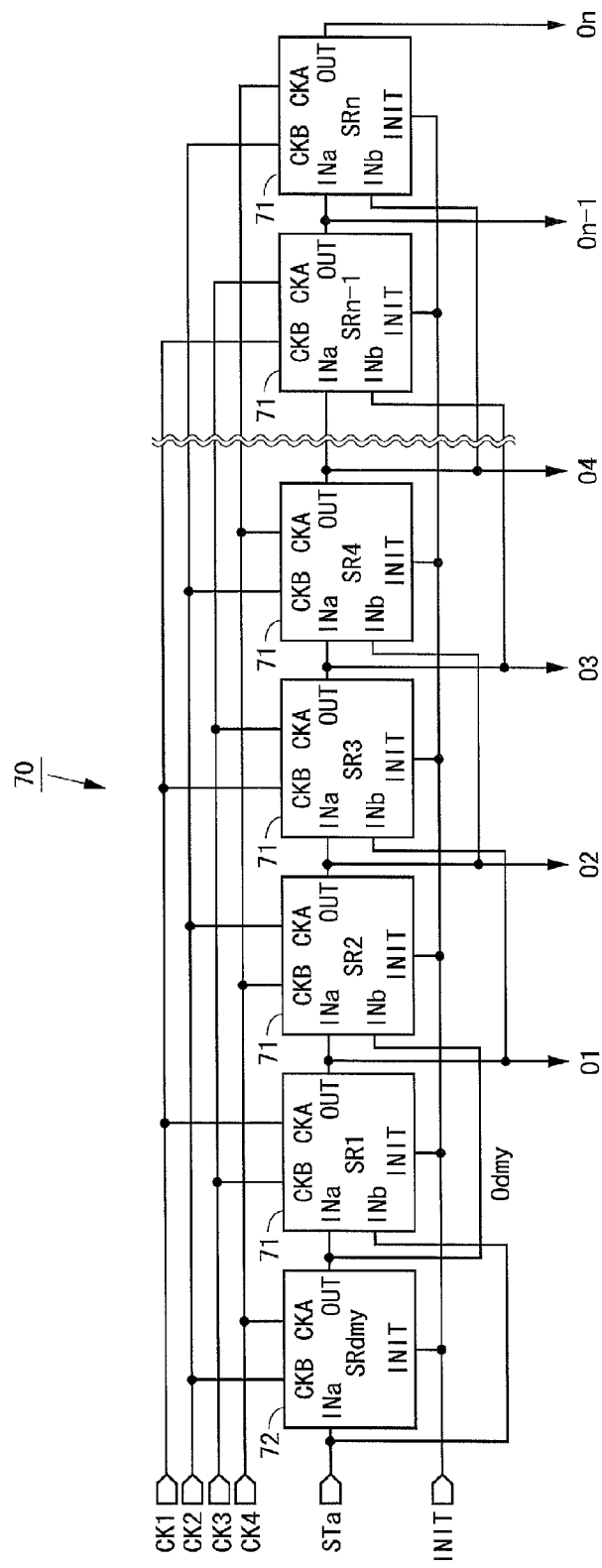
FIG. 47 is a block diagram showing a configuration of a shift register according to a twenty-fourth embodiment.

FIG. 47 is a block diagram showing a configuration of a shift register according to a twenty-fourth embodiment of the present invention. A shift register 70 shown in FIG. 47 is configured by connecting n unit circuits 71 in multiple stages and connecting a dummy unit circuit 72 to the previous stage thereof. The unit circuit 71 has the clock terminals CKA, CKB, the input terminals INa, INb, the initialization terminal INIT, and the output terminal OUT. The dummy unit circuit 72 has the clock terminals CKA, CKB, the input terminal INa, the initialization terminal INIT, and the output terminal OUT. For example, the unit circuit 52 (FIG. 34) is used for the unit circuit 71, and the unit circuit 61 (FIG. 43) is used for the dummy unit circuit 72.

From the outside, the shift register 70 is supplied with the start pulse STa, the four-phase clock signals CK1 to CK4, and the initialization signal INIT. The clock signals CK1 to CK4 are provided to each terminal similarly to the shift register 40 (FIG. 25) according to the eleventh embodiment. In addition to this, the clock signal CK2 is provided to the clock terminal CKB of the dummy unit circuit 72, and the clock signal CK4 is provided to the clock terminal CKA of the dummy unit circuit 72. The start pulse STa is provided to the input terminal INa of the dummy unit circuit 72 and the input terminal INb of the unit circuit 71 in the first stage. The initialization signal INIT is provided to the initialization terminals INIT of the n unit circuits 71 and the dummy unit circuit 72. The output signal OUT of the dummy unit circuit 72 is not outputted to the outside, and is provided to the input terminal INa of the unit circuit 71 in the first stage and the input terminal INb of the unit circuit 71 in the second stage. The output signal OUT of the unit circuit 71 is outputted to the outside as each of the output signals O1 to On, and provided to the input terminal INa of the unit circuit 71 in the next stage and the input terminal INb of the unit circuit 71 in the second stage after the present stage.

Figure 48:
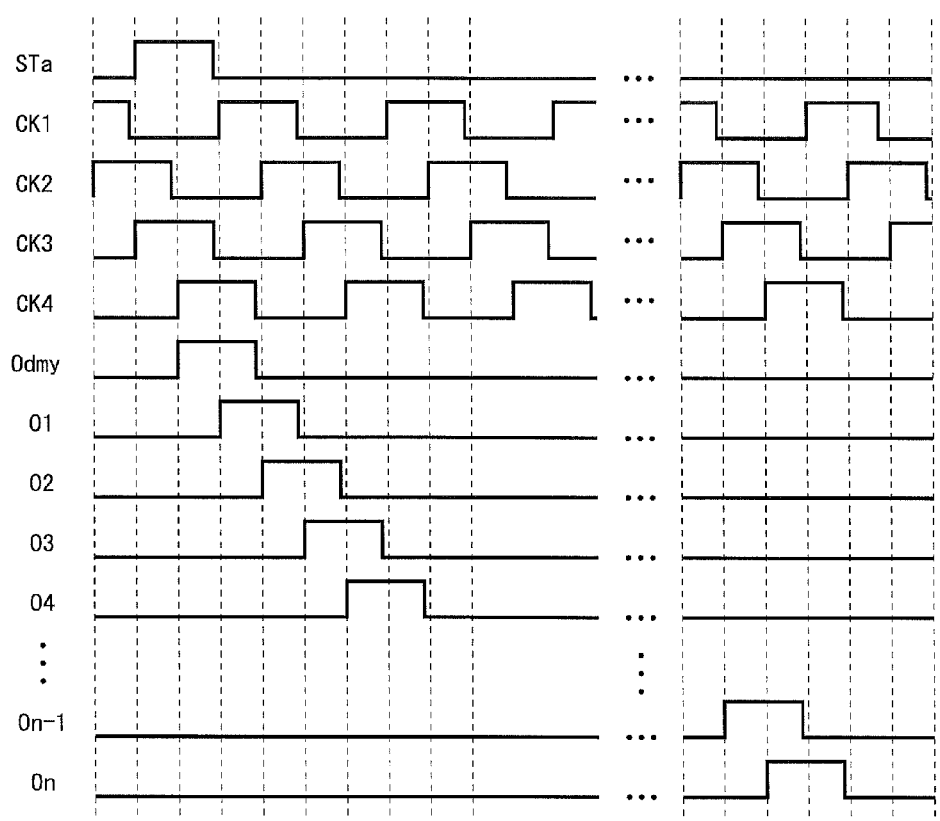
FIG. 48 is a timing chart of the shift register according to the twenty-fourth embodiment.

FIG. 48 is a timing chart of the shift register 70. As shown in FIG. 48, the start pulse STa and the clock signals CK1 to CK4 change at the same timing as in the eleventh embodiment (cf. FIG. 27). The output signal OUT of the dummy unit circuit 72 (hereinafter referred to as dummy output signal Odmy) is a signal obtained by delaying the start pulse STa by a quarter cycle of the clock signal CK1. The start pulse STa and the dummy output signal Odmy respectively serve as the start pulses STb, STa in the shift register 40 according to the eleventh embodiment.

As thus described, the shift register 70 is provided with the dummy unit circuit 72 that outputs the signal obtained by delaying the start pulse STa by a quarter cycle of the clock signal CK1. Hence the number of start pulses to be supplied to the shift register 70 may be one. Thus, according to the shift register 70 of the present embodiment, it is possible to reduce the layout area by an area corresponding to the input terminal for supplying the start pulse and wiring for transmitting the start pulse.

Twenty-Fifth Embodiment

Figure 49:
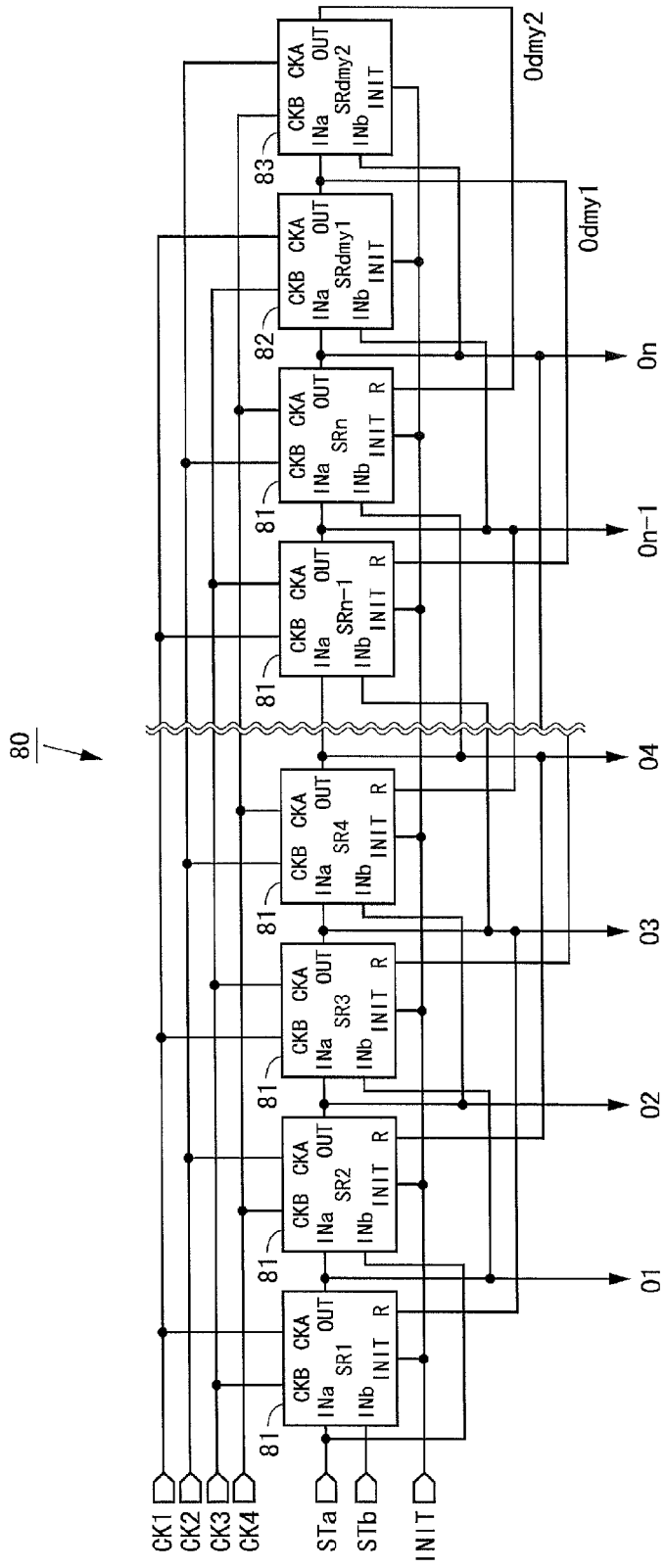
FIG. 49 is a block diagram showing a configuration of a shift register according to a twenty-fifth embodiment.

FIG. 49 is a block diagram showing a configuration of a shift register according to a twenty-fifth embodiment of the present invention. A shift register 80 shown in FIG. 49 is configured by connecting n unit circuits 81 and two dummy unit circuits 82, 83 in multiple stages. The unit circuit 81 has the clock terminals CKA, CKB, the input terminals INa, INb, the initialization terminal INIT, a reset terminal R, and the output terminal OUT. The dummy unit circuits 82, 83 each have the clock terminals CKA, CKB, the input terminals INa, INb, the initialization terminal INIT, and the output terminal OUT.

From the outside, the shift register 80 is supplied with the start pulses STa, STb, the four-phase clock signals CK1 to CK4, and the initialization signal INIT. The start pulses STa, STb and the clock signals CK1 to CK4 are provided to each terminal similarly to the shift register 40 (FIG. 25) according to the eleventh embodiment. In addition, the clock signals CK1 to CK4 are each provided to the clock terminal CKA of the dummy unit circuit 82, the clock terminal CKA of the dummy unit circuit 83, the clock terminal CKB of the dummy unit circuit 82, and the clock terminal CKB of the dummy unit circuit 83. The initialization signal INIT is provided to the initialization terminals INIT of the n unit circuits 81 and the dummy unit circuits 82, 83. The output signal OUT of the unit circuit 81 is outputted to the outside as each of the output signals O1 to On, and provided to the input terminal INa of the unit circuit 81 in the next stage (or the dummy unit circuit 82), the input terminal INb of the unit circuit 81 in the second stage after the present stage (or the dummy unit circuits 82, 83), and the reset terminal R of the unit circuit 81 in the second stage before the present stage. The output signal OUT of the dummy unit circuit 82 (hereinafter referred to as dummy output signal Odmy1) is provided to the input terminal INa of the dummy unit circuit 83 and the reset terminal R of the unit circuit 81 in the (n−1)th stage. The output signal OUT of the dummy unit circuit 83 (hereinafter referred to as dummy output signal Odmy2) is provided to the reset terminal R of the unit circuit 81 in the n-th stage.

Figure 50:
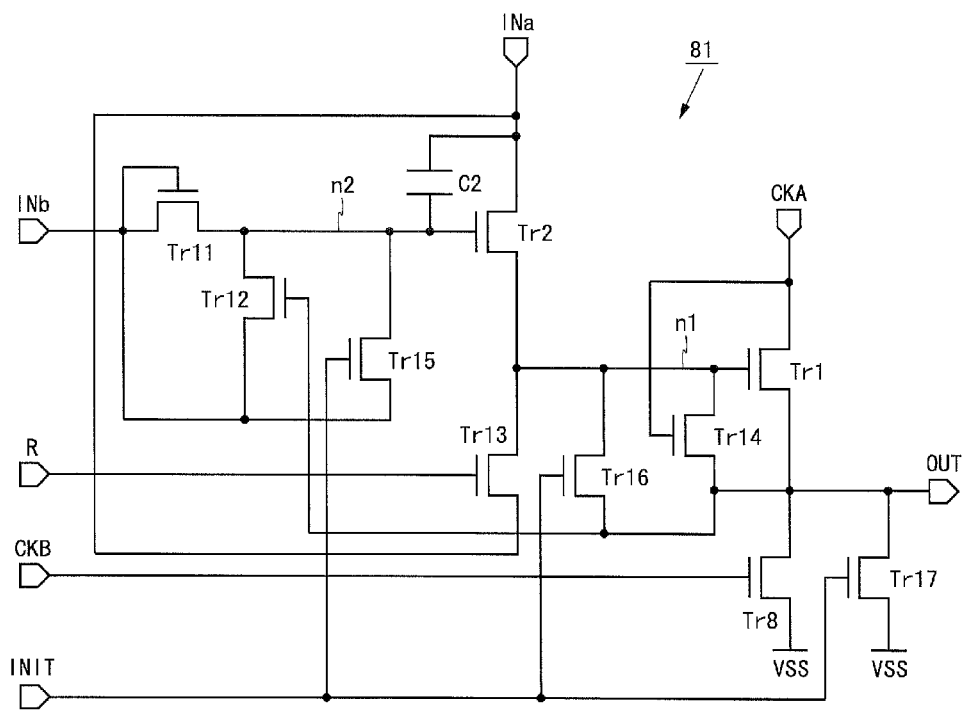
FIG. 50 is a circuit diagram of a unit circuit of the shift register according to the twenty-fifth embodiment.

FIG. 50 is a circuit diagram of the unit circuit 81. The unit circuit 81 is formed by changing, in the unit circuit 54 (FIG. 37), the connection destination of the gate terminal of the transistor Tr13 to the reset terminal R. A unit circuit not having the reset terminal R (e.g., unit circuit 54) is used for the dummy unit circuits 82, 83.

In the shift register 80, the discharge of the node n1 is performed by using the transistor Tr13 whose gate terminal is provided with the output signal OUT of the unit circuit 81 in the second stage after the present stage. The shift register 80 is provided with the dummy unit circuits 82, 83 in order to provide, to the unit circuits 81 in the (n−1)th stage and the n-th stage, the output signals OUT of the unit circuits 81 in the second stage after the present stage. The dummy output signal Odmy1 is provided to the gate terminal of the transistor Tr13 of the unit circuit 81 in the (n−1)th stage. The dummy output signal Odmy2 is provided to the gate terminal of the transistor Tr13 of the unit circuit 81 in the n-th stage.

Figure 51:
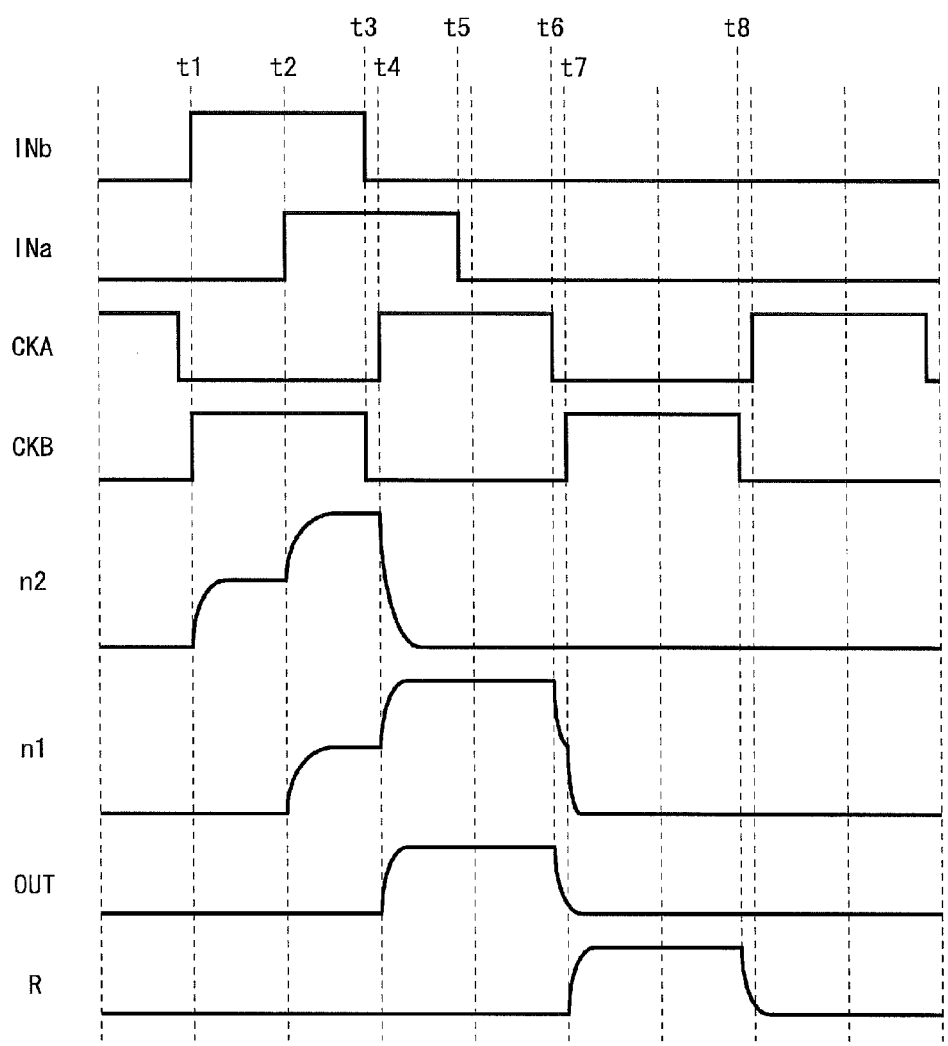
FIG. 51 is a signal waveform diagram of the shift register according to the twenty-fifth embodiment.

FIG. 51 is a signal waveform diagram of the shift register 80. The signal waveform diagram shown in FIG. 51 is obtained by adding a change in the reset signal R to the signal waveform diagram shown in FIG. 28. The output signal OUT changes to the high level at the time t4, and changes to the low level at the time t6. Being delayed by a half cycle of the clock signal CK1, the reset signal R changes to the high level at the time t7 and changes to the low level at the time t8. When the clock signal CKA changes to the low level at the time t6, the push-up of the node n1 is completed, and the potential of the node n1 drops to the high-level potential VDD. When the reset signal R changes to the high level at the time t7, the transistor Tr13 is turned on, and the potential of the node n1 drops to the low level (discharge of the node n1).

In the unit circuit 54, when the clock signal CKB is at the high level, the transistor Tr13 is turned on, and the discharge of the node n1 is performed. In contrast, in the unit circuit 81, when the reset signal R is at the high level, the transistor Tr13 is turned on, and the discharge of the node n1 is performed. The frequency of changes in the reset signal R is smaller than the frequency of changes in the clock signal CKB. Thus, according to the shift register 80 of the present embodiment, it is possible to reduce charge and discharge of a parasitic capacitance accompanying the gate terminal of the transistor Tr13, so as to reduce power consumption.

Figure 52:
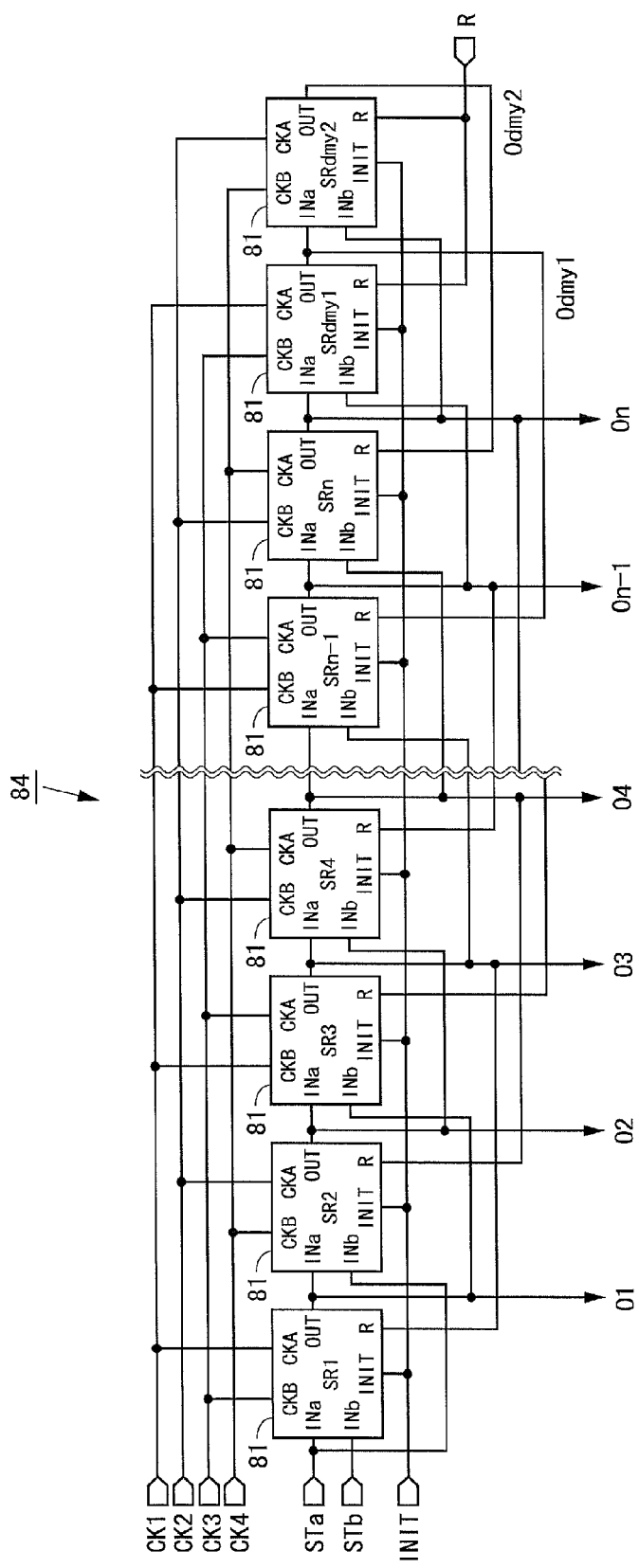
FIG. 52 is a block diagram showing a configuration of a shift register according to a modified example of the twenty-fifth embodiment.

As for the shift register 80 according to the present embodiment, a modified example shown in FIG. 52 can be formed. A shift register 84 shown in FIG. 52 is configured by connecting (n+2) unit circuits 81 in multiple stages. The unit circuits 81 in the (n+1)th stage and the (n+2)th stage function as dummy unit circuits. From the outside, the shift register 84 is supplied with the start pulses STa, STb, the four-phase clock signals CK1 to CK4, the initialization signal INIT, and the reset signal R. The reset signal R is provided to the reset terminals R of the unit circuits 81 in the (n+1)th stage and the (n+2) th stage. Signals other than that are provided to each terminal similarly to the shift register 80.

In the shift register 84, similarly to the shift register 80, the discharge of the node n1 is performed by using the transistor Tr13 whose gate terminal is provided with the output signal OUT of the unit circuit 81 in the second stage after the present stage. The shift register 84 is provided with the unit circuits 81 in the (n+1)th stage and the (n+2)th stage in order to provide, to the unit circuits 81 in the (n−1)th stage and the n-th stage, the output signals OUT of the unit circuits 81 in the second stage after the present stage. The output signal OUT of the unit circuit 81 in the (n+1)th stage (hereinafter referred to as dummy output signal Odmy1) is provided to the gate terminal of the transistor Tr13 of the unit circuit 81 in the (n−1)th stage. The output signal OUT of the unit circuit 81 in the (n+2)th stage (hereinafter referred to as dummy output signal Odmy2) is provided to the gate terminal of the transistor Tr13 of the unit circuit 81 in the n-th stage.

Figure 53:
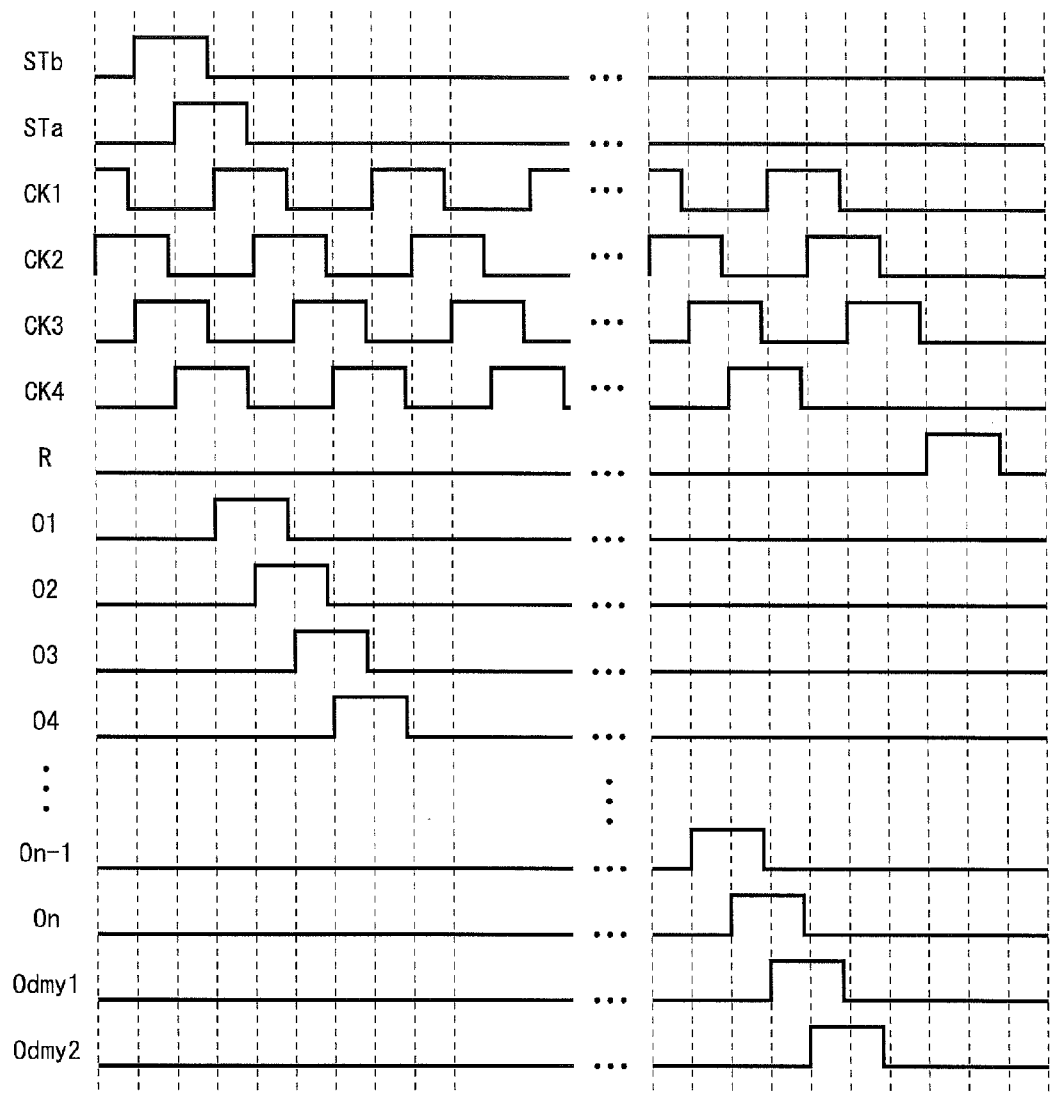
FIG. 53 is a timing chart of the shift register shown in FIG. 52.

FIG. 53 is a timing chart of the shift register 84. As shown in FIG. 53, the dummy output signal Odmy1 shifts to the high level in the high-level period of the clock signal CK1 after the output signal OUT of the unit circuit 81 in the n-th stage is shifted to the high level. The dummy output signal Odmy2 shifts to the high level in the high-level period of the clock signal CK2 after the dummy output signal Odmy1 is shifted to the high level. The reset signal R shifts to the high level after the high-level period of the dummy output signal Odmy2. When the reset signal R shifts to the high level, in the unit circuits 81 in the (n+1)th stage and the (n+2)th stage, the transistor Tr13 is turned on, and the potential of the node n1 shifts to the low level.

Also in the shift register 84, similarly to the shift register 80, it is possible to reduce charge and discharge of a parasitic capacitance accompanying the gate terminal of the transistor Tr13, so as to reduce power consumption. In place of the initialization signal INIT and the reset signal R, the shift register 84 may be supplied with a control signal which shifts to the high level at the time of initialization and at the time of resetting. In this case, one of the transistors Tr13, Tr16 may be deleted from the unit circuit 81.

Twenty-Sixth Embodiment

Figure 54:
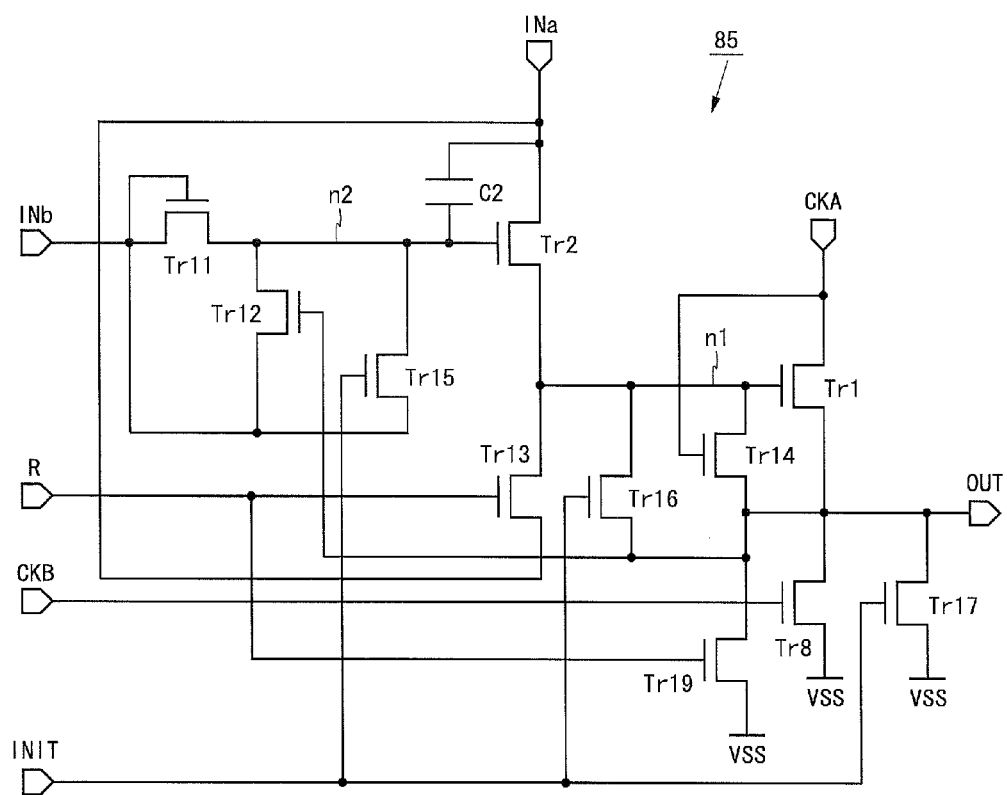
FIG. 54 is a circuit diagram of a unit circuit of a shift register according to a twenty-sixth embodiment.

A shift register according to a twenty-sixth embodiment of the present invention has the configuration shown in FIG. 49 or FIG. 52. The shift register according to the present embodiment includes a unit circuit 85 shown in FIG. 54 in place of the unit circuit 81. The unit circuit 85 is formed by adding a transistor Tr19 to the unit circuit 81 (FIG. 50). A drain terminal of the transistor Tr19 is connected to the output terminal OUT, a source terminal of the transistor Tr19 is applied with the low-level potential VSS, and a gate terminal of the transistor Tr19 is connected to the reset terminal R. The signal waveform diagram of the shift register according to the present embodiment is the same as the signal waveform diagram according to the twenty-fifth embodiment.

In the unit circuit 41 (FIG. 26), when the transistor Tr1 is turned off before the output signal OUT shifts to the low level, the output signal OUT does not shift to the low level, but has an intermediate potential. The unit circuit 43 (FIG. 30) includes the transistor Tr8 whose gate terminal is connected to the clock terminal CKB in order to shift the output signal OUT to the low level. However, when the transistor Tr8 is increased in size in order to reliably shift the output signal OUT to the low level, power consumption increases. To solve this problem, the unit circuit 85 includes the transistor Tr19 whose gate terminal is connected to the reset terminal R.

In the unit circuit 85, when the reset signal R shifts to the high level, the transistor Tr19 is turned on, and hence the output signal OUT reliably shifts to the low level. This eliminates the need for increasing the size of the transistor Tr8 in the unit circuit 85. Further, the frequency of changes in the output signal OUT is smaller than the frequency of changes in the clock signal CKB. For this reason, even when the size of the transistor Tr19 is increased, power consumption does not increase as much as when the size of the transistor Tr8 is increased. Thus, according to the shift register of the present embodiment, it is possible to reliably shift the output signal OUT to the low level without increasing power consumption.

Further, the transistor Tr8 is cyclically turned on based on the clock signal CKB. Therefore, even when the potential of the output signal OUT rises due to a leak current of the transistor Tr1, or the like, the potential of the output signal OUT can be cyclically shifted to the low level by using the transistor Tr8. It is to be noted that although the unit circuit 85 includes the transistors Tr8, Tr19, it does not necessarily include the transistor Tr8 so long as the transistor Tr19 is included.

Figure 55:
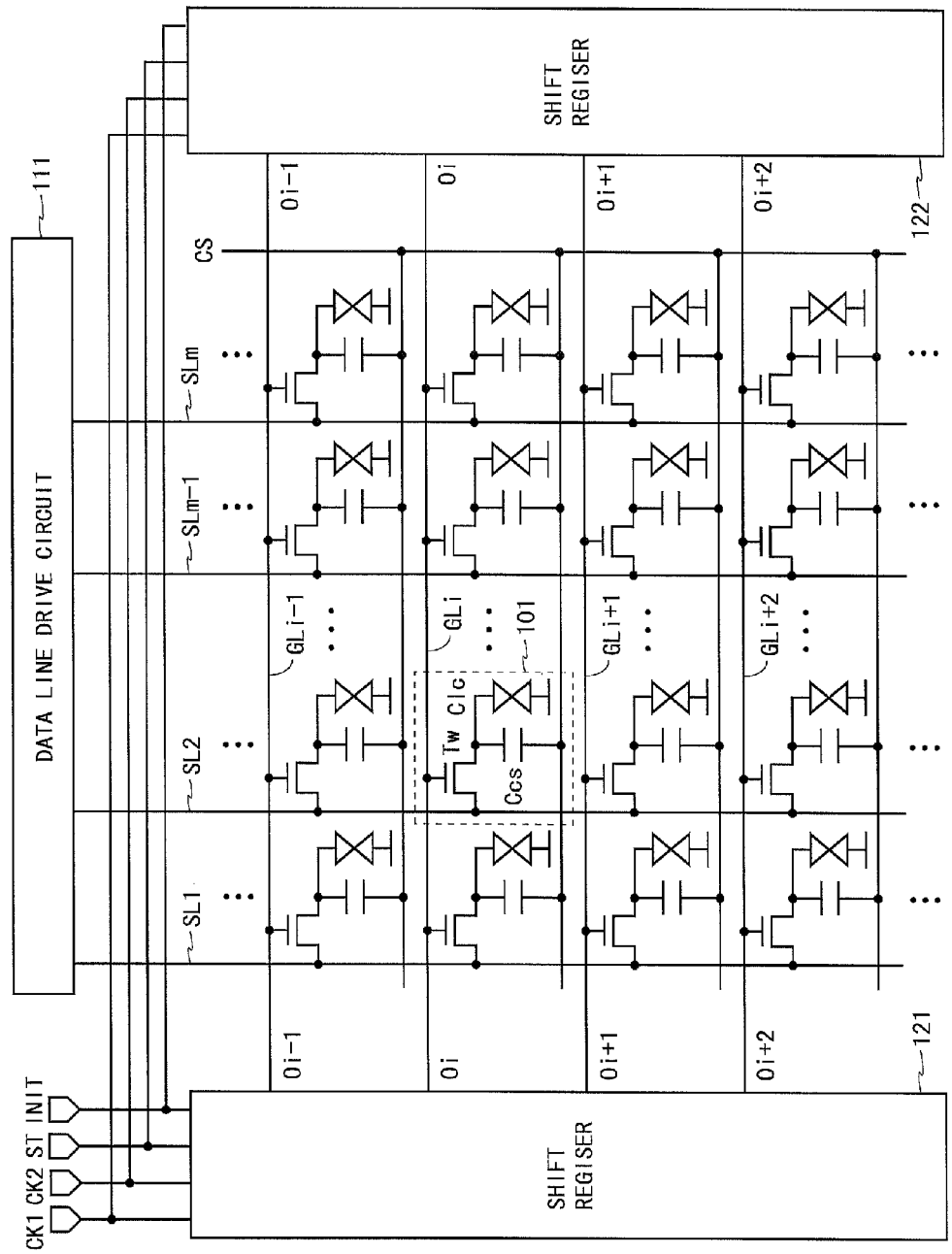
FIG. 55 is a block diagram showing a first configuration example of a liquid crystal display device provided with the shift register according to the embodiment of the present invention.

Hereinafter, a description will be given of examples of a display device provided with the shift register according to the embodiment of the present invention. FIG. 55 is a block diagram showing a first configuration example of a liquid crystal display device provided with the shift register according to the embodiment of the present invention. The liquid crystal display device shown in FIG. 55 is provided with n scanning lines GL1 to GLn, m (m is an integer not smaller than 2) data lines SL1 to SLm, (m×n) pixel circuits 101, a data line drive circuit 111, and shift registers 121, 122.

The scanning lines GL1 to GLn are arranged in parallel to each other, and the data lines SL1 to SLm are arranged in parallel to each other so as to be orthogonal to the scanning lines GL1 to GLn. The (m×n) pixel circuits 101 are arranged corresponding to intersections of the scanning lines GL1 to GLn and the data lines SL1 to SLm. The pixel circuit 101 includes a transistor Tw, a liquid crystal capacitor Clc and an auxiliary capacitor Ccs. A gate terminal of the transistor Tw is connected to one scanning line, and a source terminal of the transistor Tw is connected to one data line. Hereinafter, an arrangement region of the pixel circuit 101 is referred to as a region A.

The data line drive circuit 111 is arranged along one side (upper side in FIG. 55) of the region A. The data line drive circuit 111 is connected to one end (upper end in FIG. 55) of the data lines SL1 to SLm, to drive the data lines SL1 to SLm.

The shift registers 121, 122 each have n output terminals O1 to On, and function as a scanning line drive circuit. For the shift registers 121, 122, for example, the shift registers according to the first to tenth embodiments are used. In the shift registers 121, 122, the same circuit is used and the same signals are supplied. The shift register 121 is arranged along one side (left side in FIG. 55) of the region A, and the shift register 122 is arranged along the opposed side (right side in FIG. 55) of the region A. The output terminals O1 to On of the shift register 121 are respectively connected to one ends (left ends in FIG. 55) of the scanning lines GL1 to GLn. The shift register 121 drives the scanning lines GL1 to GLn from the one end side. The output terminals O1 to On of the shift register 122 are respectively connected to the other ends (right ends in FIG. 55) of the scanning lines GL1 to GLn. The shift register 122 drives the scanning lines GL1 to GLn from the other end side. As thus described, in the liquid crystal display device shown in FIG. 55, the scanning lines GL1 to GLn are driven from both sides by using the two shift registers 121, 122.

Figure 56:
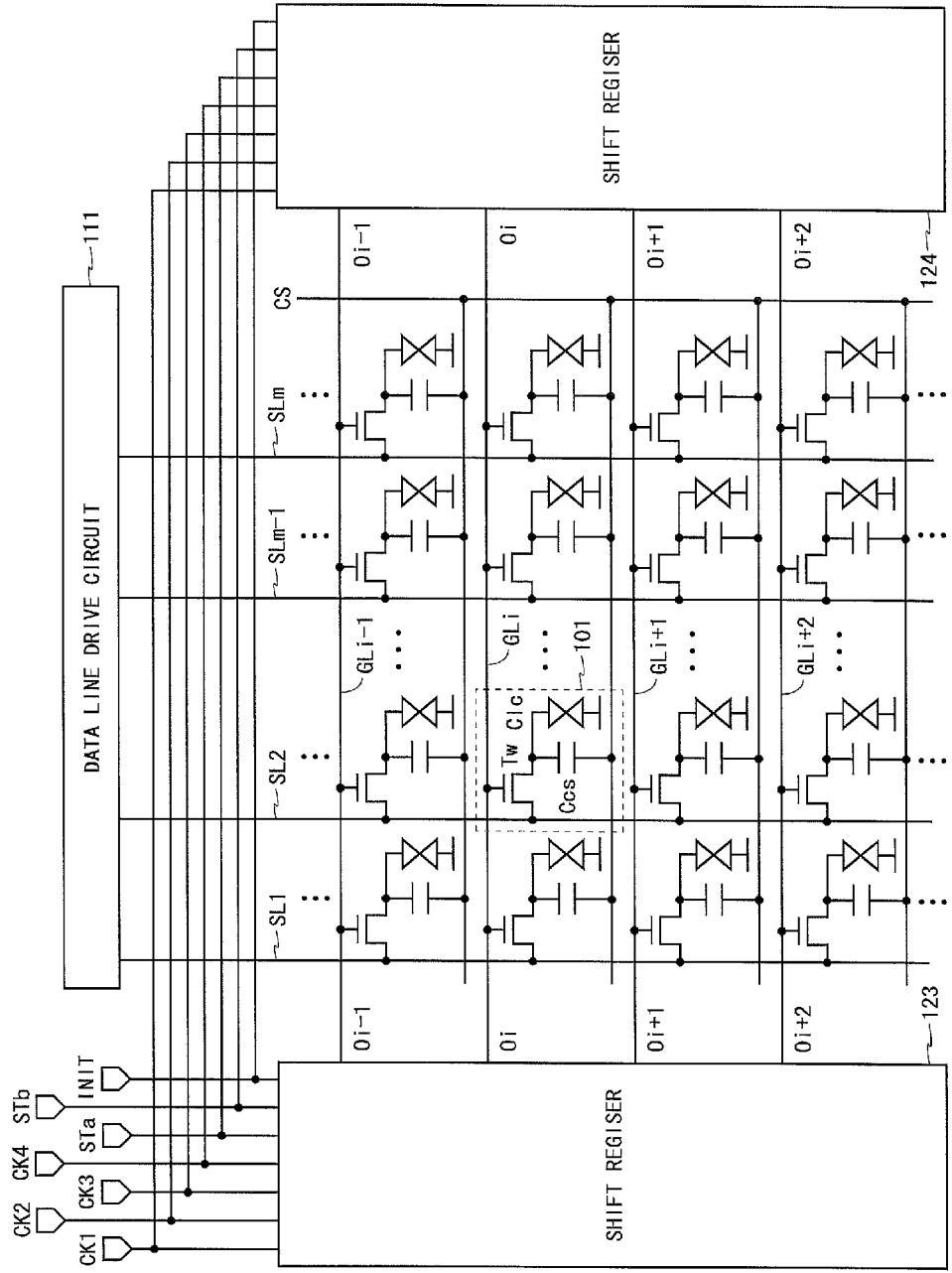
FIG. 56 is a block diagram showing a second configuration example of the liquid crystal display device provided with the shift register according to the embodiment of the present invention.

FIG. 56 is a block diagram showing a second configuration example of the liquid crystal display device provided with the shift register according to the embodiment of the present invention. The liquid crystal display device shown in FIG. 56 is obtained by replacing the shift registers 121, 122 with shift registers 123, 124, in the liquid crystal display device shown in FIG. 55. The shift registers 123, 124 each have n output terminals O1 to On, and function as a scanning line drive circuit. For the shift registers 123, 124, for example, the shift registers according to the eleventh to twenty-sixth embodiments are used.

It is to be noted that in the liquid crystal display device shown in FIGS. 55 and 56, the scanning lines GL1 to GLn are driven from both sides by using the two shift registers arranged along the two opposed sides of the region A. Alternatively, in the liquid crystal display device provided with the shift register according to the embodiment of the present invention, the scanning lines GL1 to GLn may be driven from one side by using one shift register arranged along one side of the region A.

Figure 57:
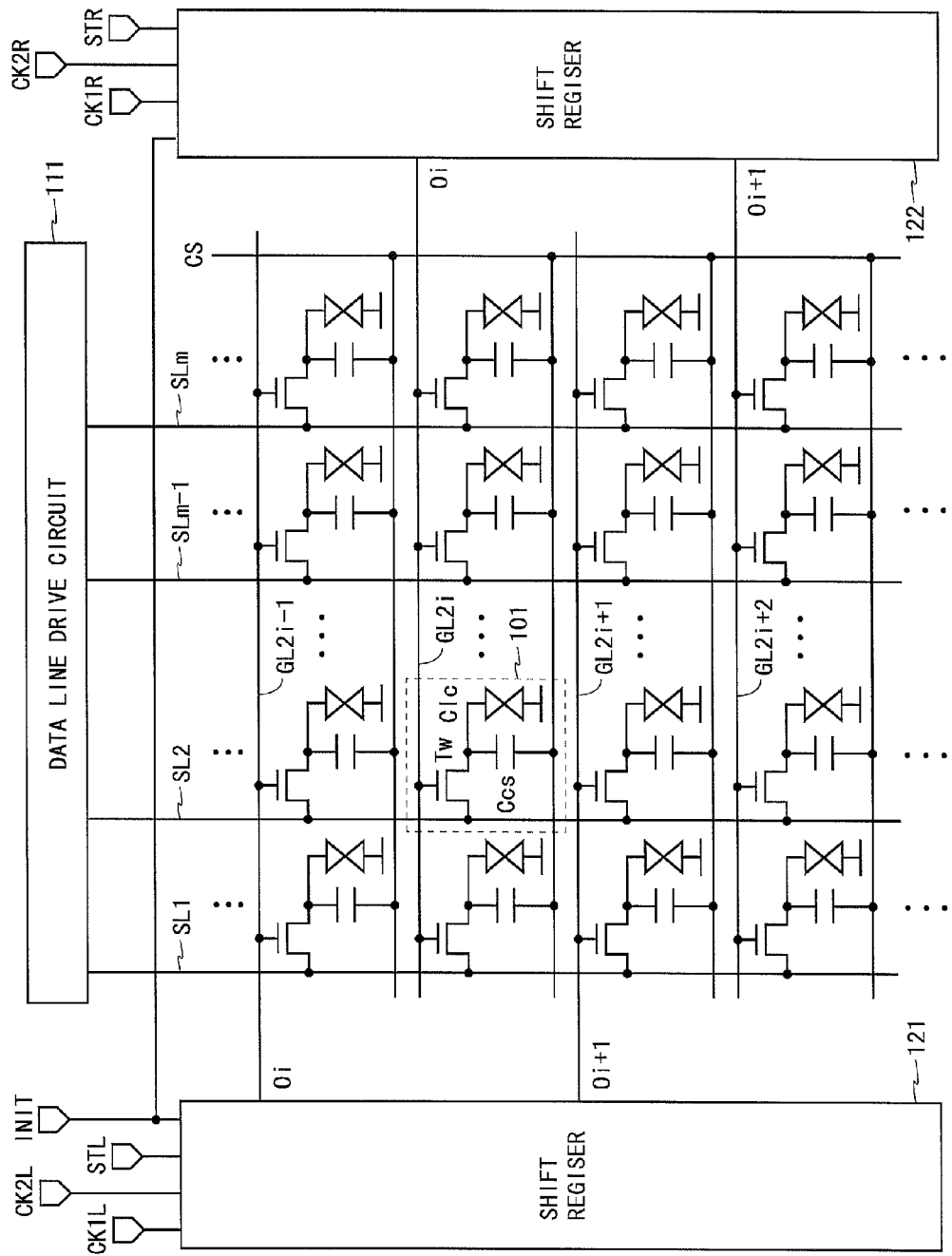
FIG. 57 is a block diagram showing a third configuration example of the liquid crystal display device provided with the shift register according to the embodiment of the present invention.

FIG. 57 is a block diagram showing a third configuration example of the liquid crystal display device provided with the shift register according to the embodiment of the present invention. The liquid crystal display device shown in FIG. 57 is provided with 2n scanning lines GL1 to GL2n, m data lines SL1 to SLm, (m×2n) pixel circuits 101, the data line drive circuit 111, and the shift registers 121, 122. The scanning lines GL1 to GL2n, the data lines SL1 to SLm, the (m×2n) pixel circuits 101, and the data line drive circuit 111 are arranged similarly to the liquid crystal display device shown in FIG. 55.

In the shift registers 121, 122, the same circuit is used and different signals are provided except for the initialization signal INIT. For the shift registers 121, 122, for example, the shift registers according to the first to tenth embodiments are used. The output terminals O1 to On of the shift register 121 are respectively connected to one ends (left ends in FIG. 57)

of the odd-numbered scanning lines GL1, GL3, . . . , GL2n−1. The shift register 121 drives the odd-numbered scanning lines GL1, GL3, . . . , GL2n−1 from the one end side. The output terminals O1 to On of the shift register 122 are respectively connected to the other ends (right ends in FIG. 57) of the even-numbered scanning lines GL2, GL4, . . . , GL2n. The shift register 122 drives the even-numbered scanning lines GL2, GL4, . . . , GL2n from the other end side. As thus described, in the liquid crystal display device shown in FIG. 57, the odd-numbered scanning lines GL1, GL3, . . . , GL2n−1 are driven from the one end side by using the shift register 121, and the even-numbered scanning lines GL2, GL4, . . . , GL2n are driven from the other end side by using the shift register 122.

Figure 58:
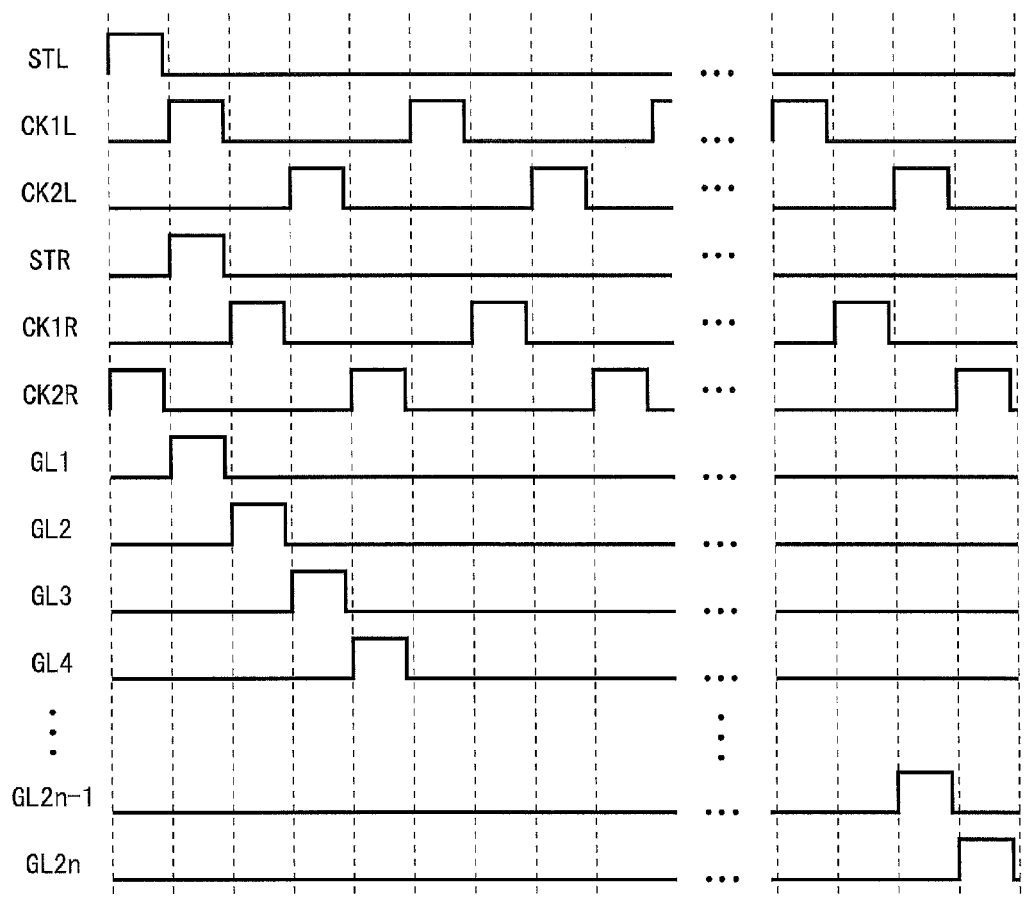
FIG. 58 is a timing chart of the liquid crystal display device shown in FIG. 57.

FIG. 58 is a timing chart of the liquid crystal display device shown in FIG. 57. A clock signal CK1L that is supplied to the shift register 121 shifts to the high level or the low level in a predetermined cycle. However, the high-level period of the clock signal CK1L is shorter than a quarter cycle of the clock signal CK1L. A clock signal CK2L is a signal obtained by delaying the clock signal CK1L by a half cycle. Clock signals CK1R, CK2R that are supplied to the shift register 122 are signals obtained by delaying the clock signal CK1L by a quarter cycle and a three-quarter cycle, respectively. At the start of shifting, a start pulse STL that is supplied to the shift register 121 shifts to the high level in the high-level period of the clock signal CK2R. A start pulse STR that is supplied to the shift register 122 is a signal obtained by delaying the start pulse STL by a quarter cycle of the clock signal CK1L. The high-level period of the output signal O1 of the shift register 121 is delayed from the high-level period of the start pulse STL by a quarter cycle of the clock signal. The high-level periods of the output signals O2 to On of the shift register 121 are delayed from the high-level periods of the output signals O1 to On−1 of the shift register 121 by a half cycle of the clock signal, respectively. The high-level period of the output signal O1 of the shift register 122 is delayed from the high-level period of the output signal O1 of the shift register 121 by a quarter cycle of the clock signal. The high-level periods of the output signals O2 to On of the shift register 122 are delayed from the high-level periods of the output signals O1 to On−1 of the shift register 122 by a half cycle of the clock signal, respectively. Therefore, as shown in FIG. 58, potentials of the scanning lines GL1 to GL2n shift to the high level in ascending order while each being delayed by a quarter cycle of the clock signal.

Figure 59:
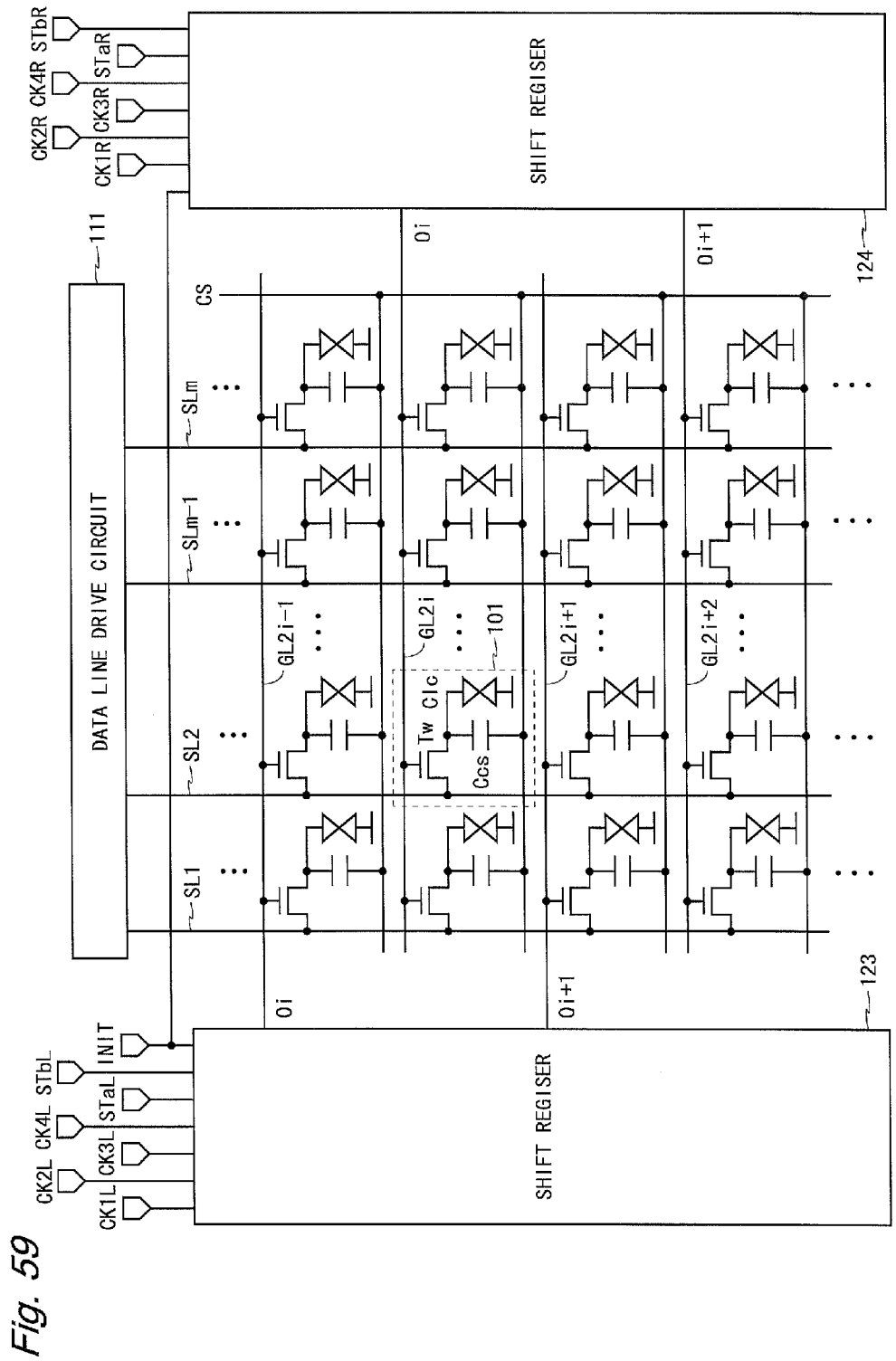
FIG. 59 is a block diagram showing a fourth configuration example of the liquid crystal display device provided with the shift register according to the embodiment of the present invention.

FIG. 59 is a block diagram showing a fourth configuration example of the liquid crystal display device provided with the shift register according to the embodiment of the present invention. The liquid crystal display device shown in FIG. 59 is obtained by replacing the shift registers 121, 122 with the shift registers 123, 124, in the liquid crystal display device shown in FIG. 57. In the shift registers 123, 124, the same circuit is used and different signals are provided except for the initialization signal INIT. For the shift registers 123, 124, for example, the shift registers according to the eleventh to twenty-sixth embodiments are used.

Figure 60:
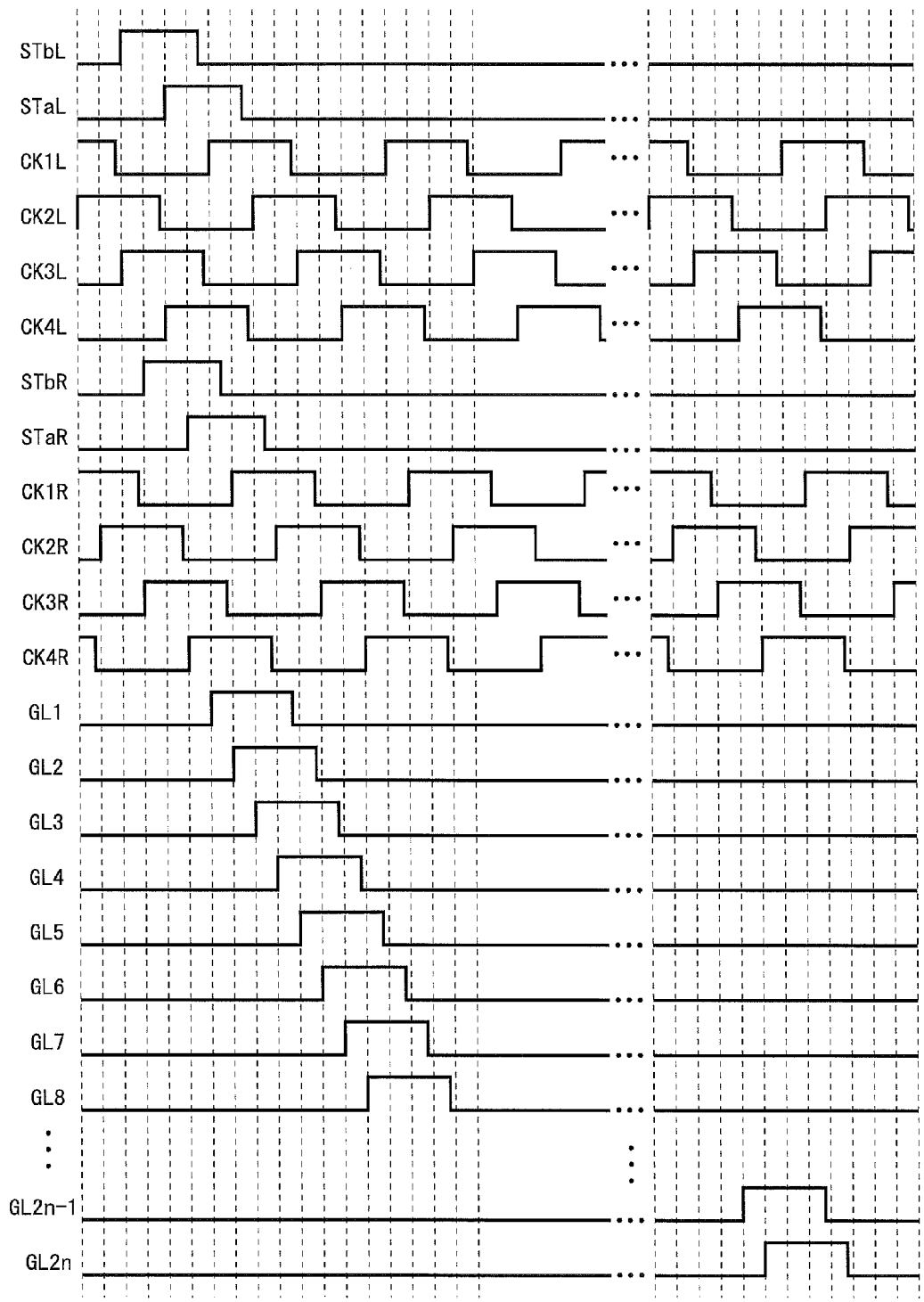
FIG. 60 is a timing chart of the liquid crystal display device shown in FIG. 59.
Figure 61:
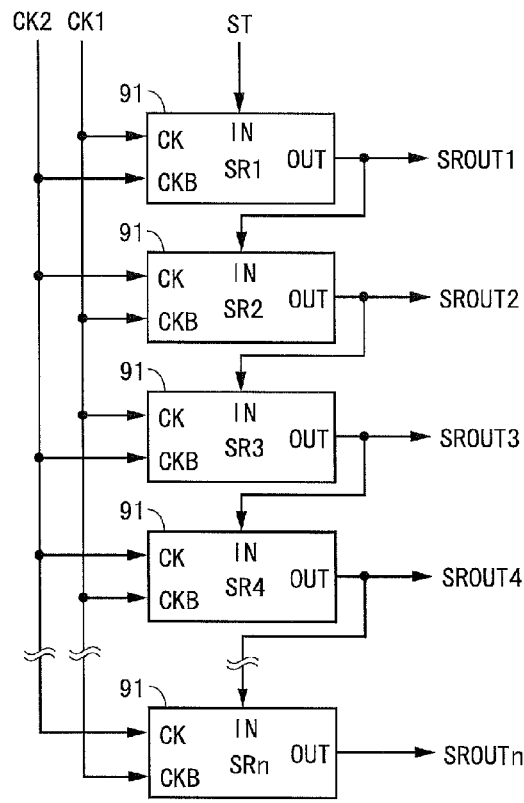
FIG. 61 is a block diagram showing a configuration of a conventional shift register.
Figure 62:
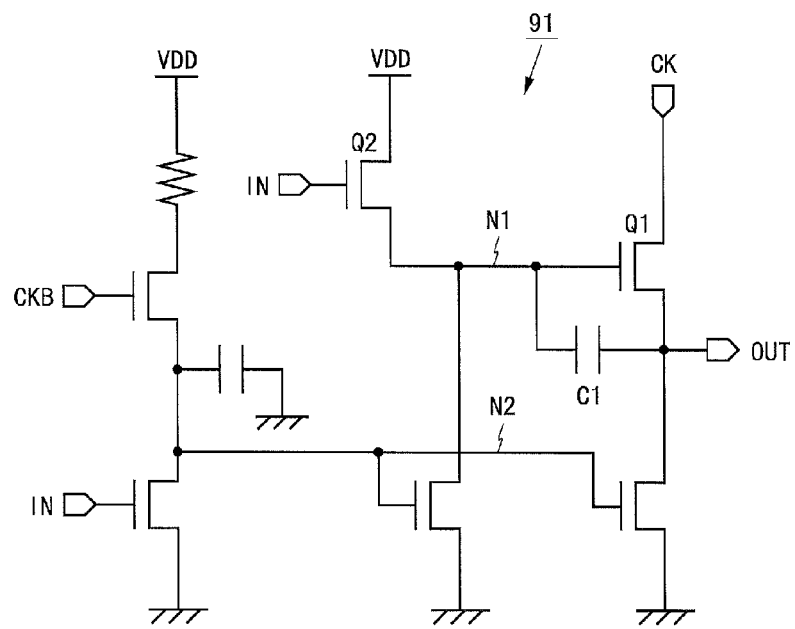
FIG. 62 is a circuit diagram of a unit circuit of the conventional shift register.
Figure 63:
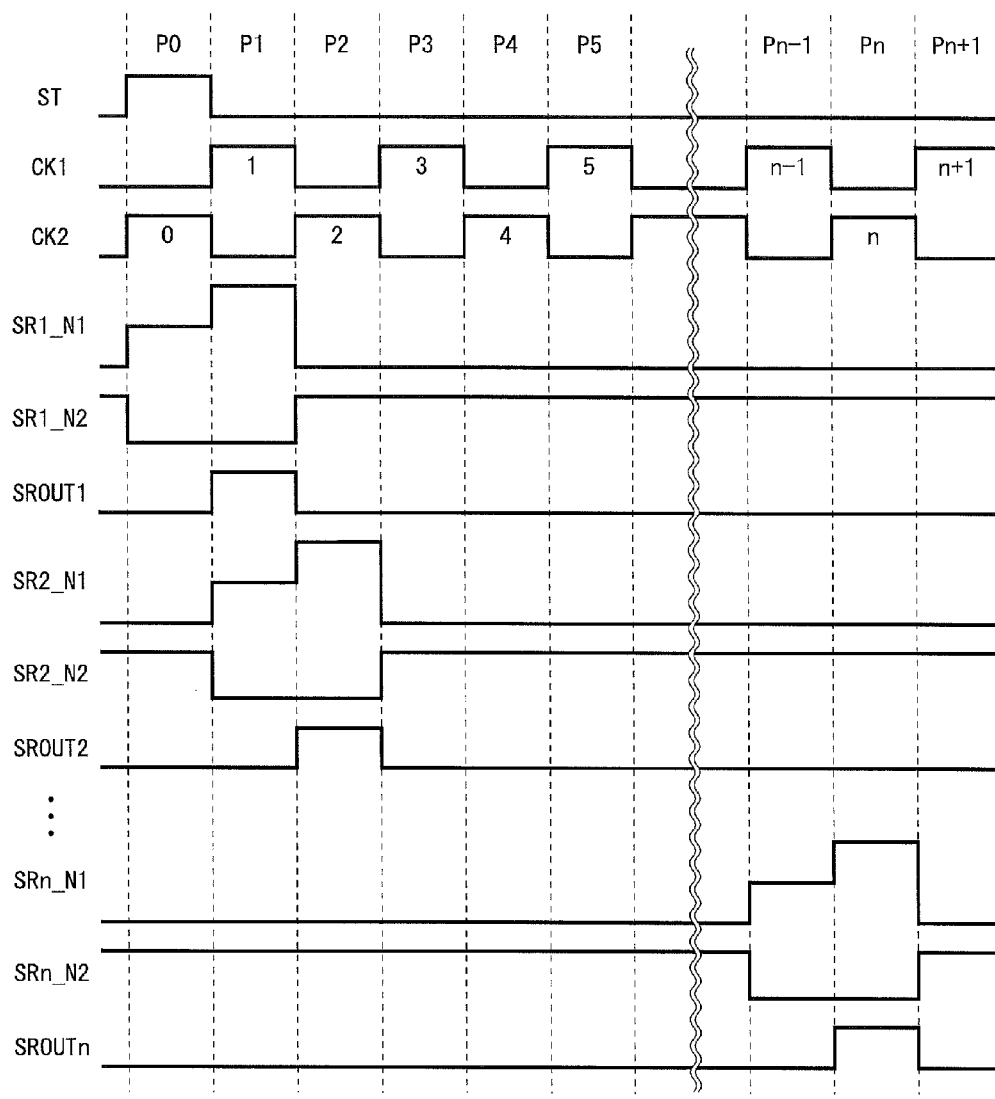
FIG. 63 is a timing chart of the conventional shift register.

FIG. 60 is a timing chart of the liquid crystal display device shown in FIG. 59. Start pulses STaL, STbL and clock signals CK1L to CK4L that are supplied to the shift register 123 respectively change at the same timing as the start pulses STa, STb and the clock signals CK1 to CK4 shown in FIG. 27. Start pulses STaR, STbR and clock signals CK1R to CK4R that are supplied to the shift register 124 change while being delayed from the signals that are supplied to the shift register 123 by a one-eighth cycle of the clock signal. The high-level period of the output signal O1 of the shift register 123 is delayed from the high-level period of the start pulse STaL by a quarter cycle of the clock signal. The high-level periods of the output signals O2 to On of the shift register 123 are delayed from the high-level periods of the output signals O1 to On−1 of the shift register 123 by a quarter cycle of the clock signal, respectively. The high-level period of the output signal O1 of the shift register 124 is delayed from the high-level period of the output signal O1 of the shift register 123 by a one-eighth cycle of the clock signal. The high-level periods of the output signals O2 to On of the shift register 124 are delayed from the high-level periods of the output signals O1 to On−1 of the shift register 124 by a quarter cycle of the clock signal, respectively. Therefore, as shown in FIG. 60, potentials of the scanning lines GL1 to GL2n shift to the high level in ascending order while each being delayed by a one-eighth cycle of the clock signal.

According to the liquid crystal display device shown above, by using the shift register according to each of the first to twenty-sixth embodiment as the scanning line drive circuit, it is possible to reduce rounding of the output signal of the scanning line drive circuit and increase the operational margin with respect to fluctuation of the threshold voltage of the transistor. Further, in the liquid crystal display devices shown in FIGS. 55 and 56, one unit circuit of the shift register is required to be arranged in a region corresponding to a width of one scanning line. In contrast, in the liquid crystal display devices shown in FIGS. 57 and 59, one unit circuit of the shift register may be arranged in a region corresponding to a width of two scanning lines. Thus, according to the liquid crystal display devices shown in FIGS. 57 and 59, it is possible to reduce a width of a layout region of the shift register provided in an outer peripheral portion of the arrangement region of the pixel circuit. Further, according to the liquid crystal display devices shown in FIGS. 55 and 56, by driving the scanning lines GL1 to GLn from both sides, it is possible to further reduce rounding of the output signal as compared to the case of driving the scanning lines GL1 to GLn from one side.

As shown above, according to the shift register of the present invention, the control terminal of the set transistor is controlled into the floating state in part of a period during which the on-potential is provided to the control terminal of the output transistor, whereby it is possible to increase the operation margin with respect to fluctuation of the threshold voltage of the transistor.

As for the shift registers described above, characteristics of the plurality of unit circuits can be arbitrarily combined so long as they do not conflict with properties thereof, to configure a shift register according to a variety of modified examples. For example, the breakdown voltage transistor may be deleted from the unit circuit including the breakdown voltage transistor, and the obtained unit circuits may be connected in multiple stages, to configure a shift register. Alternatively, the breakdown voltage transistor may be added to the unit circuit not including the breakdown voltage transistor, and the obtained unit circuits may be connected in multiple stages, to configure a shift register.

INDUSTRIAL APPLICABILITY

The shift register of the present invention has a characteristic of having a large operation margin with respect to fluctuation of a threshold voltage of a transistor, and can thereby be used for a variety of circuits such as a drive circuit of a display device.

DESCRIPTION OF REFERENCE CHARACTERS 10, 20, 30, 40, 50, 60, 70, 80, 84, 121 to 124: shift register
1, 11 to 15, 21 to 24, 31, 41 to 44, 51 to 57, 61 to 62, 71, 81, 85: unit circuit
2: on-potential output unit
3: set control unit
32: scan switching circuit
72, 82, 83: dummy unit circuit
Tr1 to Tr19, Tr21 to Tr26, Tr31 to Tr38, Trp1 to Trp7: transistor

The invention claimed is:

1. A shift register comprising a plurality of unit circuits connected in multiple stages, wherein
the unit circuit includes:
an output transistor having a first conduction terminal connected to a clock terminal for inputting a clock signal, and a second conduction terminal connected to an output terminal for outputting the clock signal;
an on-potential output unit that outputs an on-potential to be provided to a control terminal of the output transistor;
a set transistor having a first conduction terminal provided with an output of the on-potential output unit, and a second conduction terminal connected to the control terminal of the output transistor; and
a set control unit that applies the on-potential and an off-potential in a switching manner to a control terminal of the set transistor,
the set control unit controls the control terminal of the set transistor into a floating state in part of a period during which the on-potential is provided to the control terminal of the output transistor,
the on-potential output unit outputs an input signal with respect to the unit circuit,
the set control unit includes a transistor having a first conduction terminal provided with a second clock signal, and a second conduction terminal connected to the control terminal of the set transistor, and
a control terminal of the transistor in the set control unit is provided with a second input signal with respect to the unit circuit.

2. The shift register according to claim 1, wherein
the unit circuit further includes a breakdown voltage transistor having a control terminal fixedly applied with the on-potential, between the second conduction terminal of the set transistor and the control terminal of the output transistor.

3. A shift register comprising a plurality of unit circuits connected in multiple stages, wherein
the unit circuit includes:
an output transistor having a first conduction terminal connected to a clock terminal for inputting a clock signal, and a second conduction terminal connected to an output terminal for outputting the clock signal;
an on-potential output unit that outputs an on-potential to be provided to a control terminal of the output transistor;
a set transistor having a first conduction terminal provided with an output of the on-potential output unit, and a second conduction terminal connected to the control terminal of the output transistor; and
a set control unit that applies the on-potential and an off-potential in a switching manner to a control terminal of the set transistor,
the set control unit controls the control terminal of the set transistor into a floating state in part of a period during which the on-potential is provided to the control terminal of the output transistor,
the on-potential output unit outputs a first input signal with respect to the unit circuit, and
the set control unit includes a transistor having a first conduction terminal provided with a second input signal with respect to the unit circuit, and a second conduction terminal connected to the control terminal of the set transistor.

4. The shift register according to claim 3, wherein
a control terminal of the transistor in the set control unit is fixedly applied with the on-potential.

5. The shift register according to claim 3, wherein
a control terminal of the transistor in the set control unit is provided with a second clock signal.

6. The shift register according to claim 3, wherein
a control terminal of the transistor in the set control unit is provided with the second input signal.

7. The shift register according to claim 6, wherein
the first conduction terminal and the control terminal are connected.

8. The shift register according to claim 3, wherein
the unit circuit further includes a breakdown voltage transistor having a control terminal fixedly applied with the on-potential, between the second conduction terminal of the set transistor and the control terminal of the output transistor.

* * * * *